(12) United States Patent
Sato et al.

(10) Patent No.: US 6,777,160 B2
(45) Date of Patent: Aug. 17, 2004

(54) POSITIVE-WORKING RESIST COMPOSITION

(75) Inventors: Kenichiro Sato, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 331 days.

(21) Appl. No.: 10/093,411

(22) Filed: Mar. 11, 2002

(65) Prior Publication Data

US 2003/0008241 A1 Jan. 9, 2003

(30) Foreign Application Priority Data

| Mar. 12, 2001 | (JP) | .................................. P.2001-068849 |
| Mar. 12, 2001 | (JP) | .................................. P.2001-068850 |
| May 18, 2001 | (JP) | .................................. P.2001-149620 |

(51) Int. Cl.$^7$ .............................................. G03F 7/004
(52) U.S. Cl. .................... 430/270.1; 430/905; 430/914; 430/921; 522/31
(58) Field of Search .............................. 430/270.1, 905, 430/914, 921; 522/31

(56) References Cited

FOREIGN PATENT DOCUMENTS

| EP | 1 048 983 A1 | 11/2000 |
| JP | 9-73173 | 3/1997 |
| JP | 10-10739 | 1/1998 |
| JP | 10-111569 | 4/1998 |
| JP | 10-130340 | 5/1998 |
| JP | 11-501909 | 2/1999 |
| JP | 11-305444 | 11/1999 |

OTHER PUBLICATIONS

Brodsky, C.J. et. al. Proceedings of SPIE 4343, 2001 415–426.*
Lee, D et al. Proceedings of SPIE 4690, 2002 169–177.*
Wallraff, G.M. et al. Proceedings of SPIE, 4690, 2002 160–168.*
"Photo–acid generators for positive photoresists", Research Disclosure, Sep. 2000, 1568–1569, disclosed 3M, Dr. William M. Lamanna, Advanced Materials Technology Center.

* cited by examiner

*Primary Examiner*—Rosemary Ashton
(74) *Attorney, Agent, or Firm*—Sughrue Mion, PLLC

(57) ABSTRACT

A positive-working resist composition comprising (A) a specific resin which has an aliphatic cyclic hydrocarbon group and enhances in the dissolution rate in an alkaline developing solution by an action of an acid, and (B) a specific compound generating an acid by irradiation of actinic ray or radiation. The composition is excellent in the resolving power and the exposure margin, and can be suitably used for micro-photofabrication using far ultraviolet rays, particularly ArF eximer laser beams.

8 Claims, No Drawings

POSITIVE-WORKING RESIST COMPOSITION

FIELD OF THE INVENTION

The present invention relates to a positive-working resit composition used in an ultramicrolithography process or another photofabrication process for the production of a very large scale integrated circuit (i.e., an ultra-LSD) or a high capacity microchip.

BACKGROUND OF THE INVENTION

In recent years, integrated circuits have been progressively increased in their integration degree, and therefore processing of ultrafine patterns having a line width of a half micron or less has become necessary in the production of semiconductor substrates for very large scale integrated circuits. For fulfilling this necessity, the wavelength of light used in exposure devices employed for photolithography has become progressively shorter, and now, of the far ultraviolet rays, the use of eximer laser light having a short wavelength (such as XeCl, KrF or ArF) has been studied.

Used in the pattern formation of lithography in this wavelength region are chemical amplification system resists.

In general, the chemical amplification system resists can be roughly divided into three classes, commonly called as 2-component system resists, 2.5-component system resists and 3-component system resists. In the 2-component system resist, a compound generating an acid by photolysis (hereinafter referred to as a photoacid generating agent) is combined with a binder resin. The binder resin is a resin having a group which is decomposable by the action of an acid to enhance the solubility of the resin in an alkali developing solution (also referred to as an acid-decomposable group) in its molecule. The 2.5-component system resin contains a low molecular weight compound further having an acid-decomposable group in addition to such a 2-component system resin. The 3-component system resin contains the photoacid generating agent, an alkali-soluble resin and the above-described low molecular weight compound.

The above-described chemical amplification system resists are suitable for photoresists for ultraviolet or far ultraviolet ray irradiation. However, they are further required to comply with desired characteristics for use.

Further, resins are proposed into which alicyclic hydrocarbon moieties are introduced for imparting the resistance to dry etching. However, the systems become extremely hydrophobic as an adverse effect of the introduction of the alicyclic hydrocarbon moieties. The phenomenon is therefore observed that the development with aqueous solutions of tetramethylammonium hydroxide (hereinafter referred to as TMAH) which have hitherto been widely used as resist developing solutions becomes difficult, or that resists are separated from substrates during the development.

For complying with such hydrophobization of resists, a measure of mixing organic solvents such as isopropyl alcohol with the developing solutions has been studied, and results have been observed although not quite satisfactorily. However, there is fear of swelling of resist films, and the process becomes complicated. It is therefore not necessarily said that problems have been solved. As approaches to the improvement of resists, there have been taken many measures for compensating for various hydrophobic alicyclic hydrocarbon moieties by the introduction of hydrophilic groups.

Japanese Patent Application (Laid Open) No. 10739/1998 discloses energy-sensitive resist materials containing polymers obtained by polymerization of monomers having alicyclic structures such as norbornene rings on their main chains, maleic anhydride and monomers having carboxylic groups. Japanese Patent Application (Laid Open) No. 111569/1998 discloses radiation-sensitive resin compositions containing resins having alicyclic skeletons on their main chains and radiation-sensitive acid generating agents.

Japanese Patent Application (Laid Open) No. 130340/1998 discloses chemical amplification type resists containing terpolymers having specific repeating structural units having norbornene structures on their main chains.

Japanese Patent Application (Laid Open) No. 305444/1999 discloses resins containing repeating structural units having adamantane structures on their side chains, and maleic anhydride as repeating structural units.

EP 1048983A1 discloses compositions containing resins having repeating units composed of specific acid-decomposable group containing norbornene, repeating units composed of anhydrides and repeating units having alicyclic groups, for improving storage stability, transparency, dry etching properties, sensitivity, resolution and pattern shape.

Japanese Patent Application (Laid Open) No. 501909/1999 proposes compounds having imide or methide acids, which are strong acids, as anions, for improving the solubility of initiators, hardeners or salts used as catalysts in organic solvents and the catalytic activity thereof.

Further, Research Disclosure 437031 proposes the probability of applying compounds generating imide or methide acids by photolysis to resist compositions.

In Japanese Patent Application (Laid Open) No. 73173/1997, resist materials are described in which acid-sensitive compounds containing alkali-soluble groups protected with alicyclic group-containing structures and structural units which are allowed to become alkali-soluble by releasing the alkali-soluble groups with acids are used.

However, the conventional positive-working resist compositions have not given satisfactory results in evaluation of the resolving power and the exposure margin in microphotofabrication using far ultraviolet rays, particularly ArF eximer laser beams.

SUMMARY OF THE INVENTION

An object of the present invention to provide a positive-working composition which is excellent in the resolving power and the exposure margin, and can be suitably used for microphotofabrication using far ultraviolet rays, particularly ArF eximer laser beams.

The present inventors have intensively studied materials constituting positive-working chemical amplification system resist compositions. As a result, the present inventors have discovered that the object of the present invention is attained by using specific acid-decomposable resins and specific photoacid generating agents, thus completing the invention.

That is to say, the above-described object is attained by the following constitution:

(1) A positive-working resist composition comprising (A) a resin which has an aliphatic cyclic hydrocarbon group and enhances in the dissolution rate in an alkaline developing solution by an action of an acid, and (B) a compound generating an acid by irradiation of actinic ray or radiation, wherein the resin of (A) is a resin having repeating structural units represented by formula (I), repeating structural units represented by formula (II) and repeating structural units represented by formula (III), and the resin of (B) is a compound represented by formula (Ia) or (IIb):

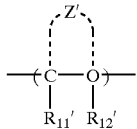

(I)

wherein $R_{11}'$ and $R_{12}'$ each independently represents a hydrogen atom, a cyano group, a halogen atom or an alkyl group; and Z' represents an atomic group for forming an alicyclic structure which contains two combined carbon atoms (C—C) and may have a substituent group.

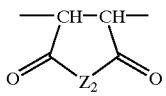

(II)

wherein $Z_2$ represents —O— or —N($R_{41}$)—, wherein $R_{41}$ represents a hydrogen atom, a hydroxyl group, an alkyl group, a haloalkyl group or —OSO$_2$—$R_{42}$. $R_{42}$ represents an alkyl group, a haloalkyl group, a cycloalkyl group or a camphor residue:

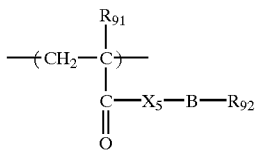

(III)

wherein $R_{91}$ represents a hydrogen atom, a lower alkyl group, a halogen atom or —CN; $X_5$ represents —O—, —S—, —NR$_{93}$— or NR$_{93}$SO$_2$—, wherein $R_{93}$ represents a hydrogen atom or a chain or cyclic alkyl group; B represents a single bond or a connecting group, and $R_{92}$ represents a hydrogen atom, a chain or cyclic alkyl group, an alkoxyl group, a hydroxyl group, a carboxyl group, a cyano group, —COOR$_{94}$ or a group represented by any one of the following formulas (IV) to (X), wherein $R_{94}$ represents a hydrogen atom or a chain or cyclic alkyl group:

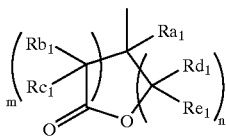

(IV)

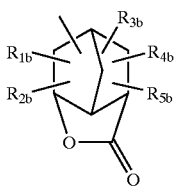

(V-1)

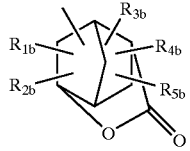

(V-2)

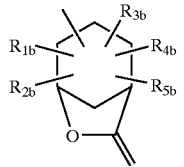

(V-3)

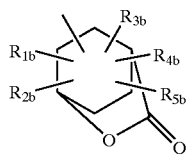

(V-4)

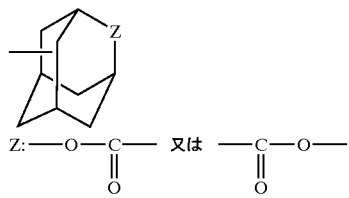

(VI)

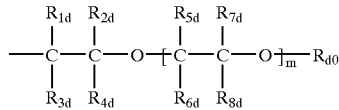

(VII)

—N$^+$(R$_{95}$)(R$_{96}$)(R$_{97}$)·X$^-$ (VIII)

—R$_{98}$—A$_{50}$—R$_{99}$ (IX)

—SO$_3$R$_{100}$ (X)

In formula (IV), $Ra_1$, $Rb_1$, $Rc_1$, $Rd_1$ and $Re_1$ each independently represents a hydrogen atom or an alkyl group having from 1 to 4 carbon atoms; and m and n each independently represents an integer of from 0 to 3, and m+n is from 2 to 6.

In formulas (V-1) to (V-4), $R_{1b}$ to $R_{5b}$ each independently represents a hydrogen atom, an alkyl group, a cycloalkyl group or an alkenyl group, and two of $R_{1b}$ to $R_{5b}$ may combine with each other to form a ring.

In formula (VII), $R_{1d}$ to $R_{8d}$ each independently represents a hydrogen atom or an alkyl group; $R_{d0}$ represents a hydrogen atom, a chain or cyclic alkyl group, an aryl group or an aralkyl group; and m represents an integer of from 1 to 10.

In formula (VIII), $R_{95}$ to $R_{97}$ each independently represents a hydrogen atom, a chain or cyclic alkyl group, an alkenyl group, an aryl group or an aralkyl group, with the proviso that $R_{95}$ to $R_{97}$ may combine with each other to form a non-aromatic or aromatic ring; and X$^-$ represents R—SO$_3^-$, wherein R represents an aliphatic hydrocarbon group or an aromatic hydrocarbon group.

In formula (IX), $R_{98}$ represents a single bond, an alkylene group, an arylene group or a divalent group which is a combination thereof; $A_{50}$ represents any one of the following functional groups:

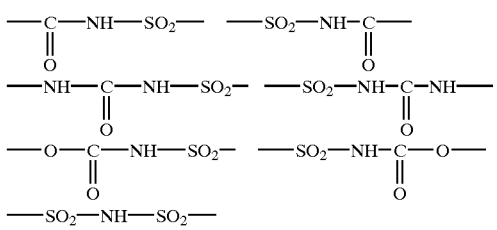

and $R_{99}$ represents a hydrogen atom or an alkyl group.

In formula (X), $R_{100}$ represents a chain or cyclic alkyl group, an aryl group or an aralkyl group.

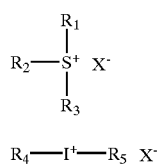

wherein $R_1$ to $R_5$ each independently represents an aliphatic or aromatic hydrocarbon group which may have a substituent group, with the proviso that two of $R_1$ to $R_3$ may combine with each other to form a ring, and that $R_4$ and $R_5$ may combine with each other to form a ring; and $X^-$ represents any one of the following anions:

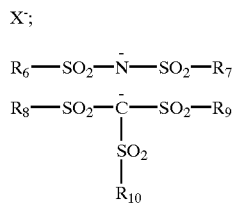

wherein $R_6$ to $R_{10}$ each independently represents an aliphatic hydrocarbon group which may have a substituent group, with the proviso that $R_6$ and $R_7$ may combine with each other to form a ring, and that two of $R_8$ to $R_{10}$ may combine with each other to form a ring;

(2) The positive-working resist composition described in (1), wherein $Z'$ in the formula (I) represents an atomic group for forming a bridge-containing alicyclic structure which contains two combined carbon atoms (C—C) and may have a substituent group;

(3) The positive-working resist composition described in (1), wherein the formula (I) is the following formula (II-A) or (II-B):

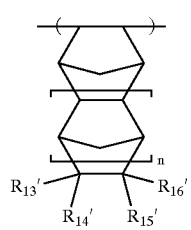

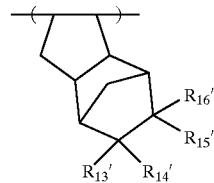

wherein $R_{13}'$ to $R_{16}'$ each independently represents a hydrogen atom, a halogen atom, a cyano group, —COOH, —COOR$_5$, a group decomposable by an action of an acid, —C(=O)—X—A'—R$_{17}'$, or an alkyl group or a cyclic hydrocarbon group which may have a substituent group, and at least two of $R_{13}'$ to $R_{16}'$ may combine with each other to form a ring, wherein $R_5$ represents an alkyl group, a cyclic hydrocarbon group or a —Y group shown below, which may have a substituent group, X represents an oxygen atom, a sulfur atom, —NH—, —NHSO$_2$— or —NHSO$_2$NH—, A' represents a single bond or a divalent connecting group, $R_{17}'$ represents —COOH, —COOR$_5$, —CN, a hydroxyl group, an alkoxyl group which may have a substituent group, —CO—NH—R$_6$, —CO—NH—SO$_2$—R$_6$ or a —Y group shown below, and $R_6$ represents an alkyl group or a cyclic hydrocarbon group, which may have a substituent group:

—Y group:

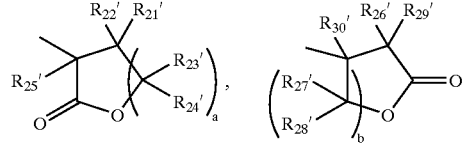

wherein $R_{21}'$ to $R_{30}'$ each independently represents a hydrogen atom or an alkyl group which may have a substituent group, and a and b each represents 1 or 2; and n represents 0 or 1;

(4) The positive-working resist composition described in any one of (1) to (3), which further contains a fluorine and/or silicone surfactant;

(5) The positive-working resist composition described in any one of (1) to (4), which further contains an organic basic compound;

(6) A positive-working resist composition comprising (A) a resin which has an aliphatic cyclic hydrocarbon group on its side chain and enhances in the dissolution rate in an alkaline developing solution by an action of an acid, and (B) a compound generating an acid by irradiation of actinic ray or radiation, wherein the resin of (A) is a resin containing at least repeating units having a partial structure containing an aliphatic hydrocarbon represented by the following formulas (pI) to (pVI), and the resin of (B) is a compound represented by the following formula (I') or (II'):

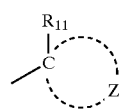

-continued

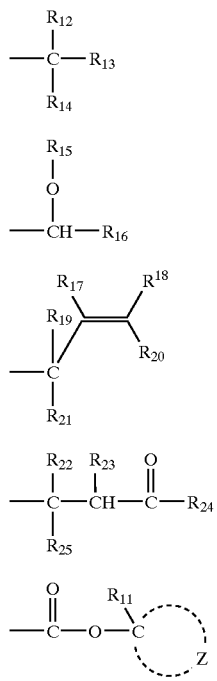

(pII)

(pIII)

(pIV)

(pV)

(pVI)

wherein $R_{11}$ represents a methyl group, an ethyl group, a n-propyl group, an isopropyl group, a n-butyl group, an isobutyl group or a sec-butyl group; Z represents an atomic group necessary for forming an alicyclic hydrocarbon group; $R_{12}$ to $R_{16}$ each independently represents a straight-chain or branched alkyl group having from 1 to 4 carbon atoms or an alicyclic hydrocarbon group, with the proviso that at least one of $R_{12}$ to $R_{14}$, or either of $R_{15}$ and $R_{16}$ represents an alicyclic hydrocarbon group; $R_{17}$ to $R_{21}$ each independently represents a hydrogen atom, a straight-chain or branched alkyl group having from 1 to 4 carbon atoms or an alicyclic hydrocarbon group, with the proviso that at least one of $R_{17}$ to $R_{21}$ represents an alicyclic hydrocarbon group, and either of $R_{19}$ and $R_{21}$ represents a straight-chain or branched alkyl group having from 1 to 4 carbon atoms or an alicyclic hydrocarbon group; and $R_{22}$ to $R_{25}$ each represents a straight-chain or branched alkyl group having from 1 to 4 carbon atoms or an alicyclic hydrocarbon group, with the proviso that at least one of $R_{22}$ to $R_{25}$ represents an alicyclic hydrocarbon group, and $R_{23}$ and $R_{24}$ may combine with each other to form a ring.

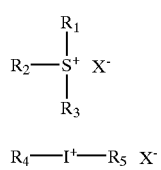

(I')

(II')

wherein $R_1$ to $R_5$ each independently represents an aliphatic or aromatic hydrocarbon group which may have a substituent group, with the proviso that two of $R_1$ to $R_3$ may combine with each other to form a ring, and that $R_4$ and $R_5$ may combine with each other to form a ring; and $X^-$ represents any one of the following anions:

$X^-$;

$R_6$—$SO_2$—$\overset{-}{N}$—$SO_2$—$R_7$ $R_8$—$SO_2$—$\underset{\underset{R_{10}}{|}}{\underset{SO_2}{|}}{\overset{-}{C}}$—$SO_2$—$R_9$ wherein $R_6$ to $R_{10}$ each independently represents an aliphatic hydrocarbon group which may have a substituent group, with the proviso that $R_6$ and $R_7$ may combine with each other to form a ring, and that two of $R_8$ to $R_{10}$ may combine with each other to form a ring;

(7) The positive-working resist composition described in (6), which further contains (C) a fluorine and/or silicone surfactant; and (8) The positive-working resist composition described in (6) or (7), which further contains (D) an organic basic compound.

DETAILED DESCRIPTION OF THE INVENTION

Components used in the invention (i.e., the present invention) will be described in detail below.

[1] (A) Resin Enhanced in the Dissolution Rate in Alkaline Developing Solution by Action of Acid (Hereinafter also Referred to as "Acid-Decomposable Resin")

As the acid-decomposable resin (A) of the (present) invention, there is used a resin which has an aliphatic cyclic hydrocarbon group and enhances in the dissolution rate in an alkaline developing solution by an action of an acid, and has repeating structural units represented by the above-mentioned general formula (I), repeating structural units represented by the above-mentioned general formula (II) and repeating structural units represented by the above-mentioned general formula (III).

In general formula (I), $R_{11}'$ and $R_{12}'$ each independently represents a hydrogen atom, a cyano group, a halogen atom or an alkyl group which may have a substituent group.

Z' represents an atomic group for forming an alicyclic structure which contains two combined carbon atoms (C—C) and may have a substituent group.

The halogen atoms represented by $R_{11}'$ and $R_{12}'$ include chlorine, bromine, fluorine and iodine.

The alkyl groups represented by $R_{11}'$, $R_{12}'$ and $R_{21}'$ to $R_{30}'$ are preferably a straight-chain or branched alkyl group having from 1 to 10 carbon atoms, more preferably a straight-chain or branched alkyl group having from 1 to 6 carbon atoms, and still more preferably methyl, ethyl, propyl, isopropyl, n-butyl, isobutyl, sec-butyl or t-butyl. Further, the alkyl groups represented by $R_{11}'$, $R_{12}'$ may have a substituent group.

Further substituent groups of the above-mentioned alkyl groups include a hydroxyl group, a halogen atom, a carboxyl group, an alkoxyl group, an acyl group, a cyano group and an acyloxy group. The halogen atoms include chlorine, bromine, fluorine and iodine, and the alkoxyl groups include an alkoxyl group having from 1 to 4 carbon atoms such as methoxy, ethoxy, propoxy or butoxy. The acyl groups include formyl and acetyl, and the acyloxy groups include acetoxy.

The atomic group for forming the alicyclic structure, which is represented by Z', is an atomic group for forming repeating units of an alicyclic hydrocarbon which may have a substituent group, in a resin. Above all, preferred is an atomic group for forming repeating units of a bridge-containing alicyclic hydrocarbon, that is to say, a bridge-containing alicyclic structure.

Skeletons of the alicyclic hydrocarbons formed include ones represented by the following structures:

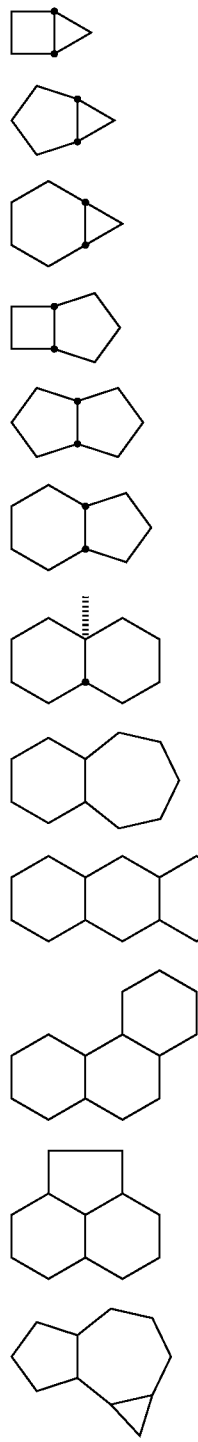

(1)
(2)
(3)
(4)
(5)
(6)
(7)
(8)
(9)
(10)
(11)
(12)

-continued

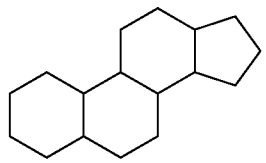

(13)

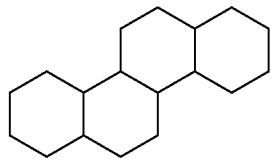

(14)

(15)

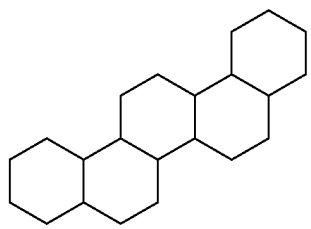

(16)

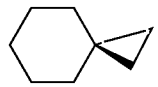

(17)

(18)

(19)

(20)

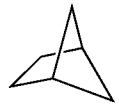

(21)

(22)

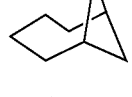

(23)

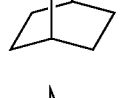

(24)

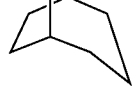

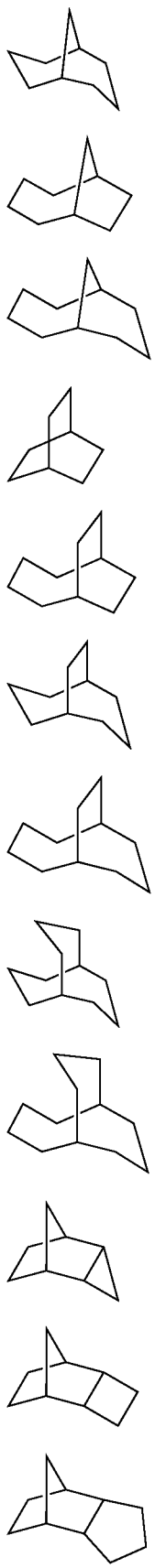
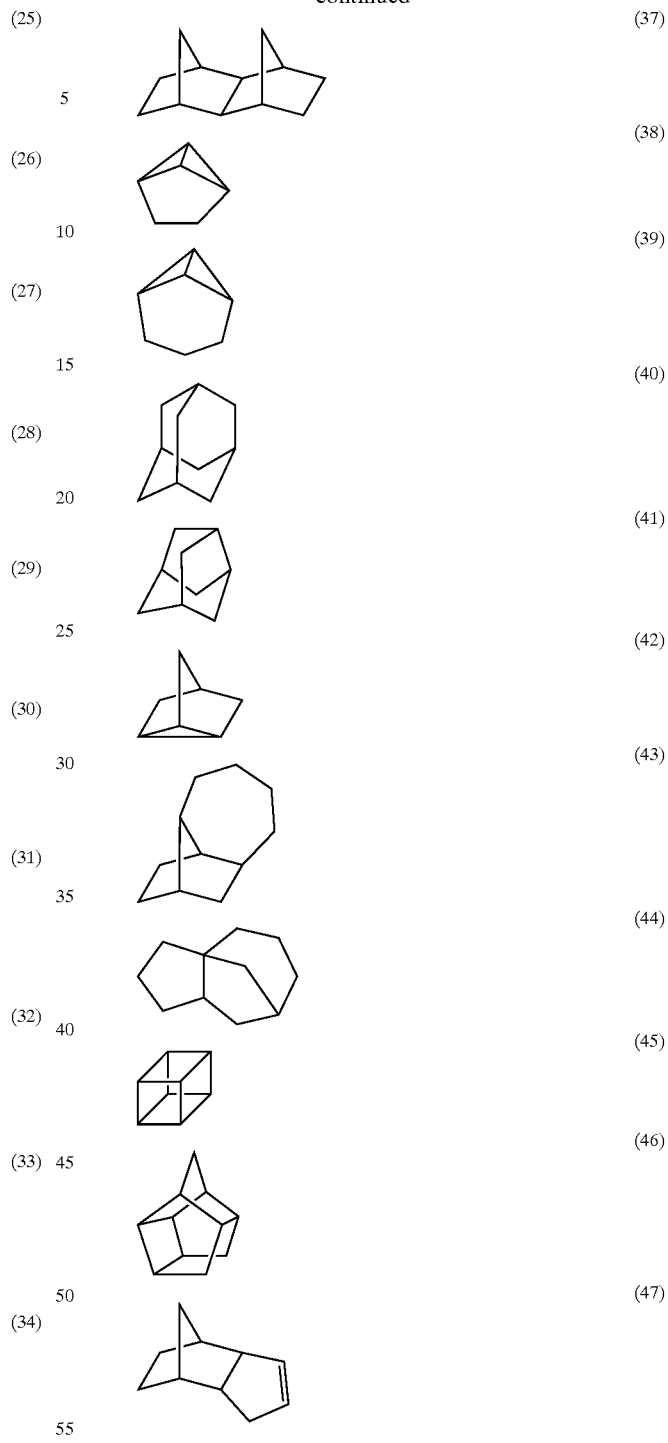

Preferred examples of the skeletons of the bridge-containing alicyclic hydrocarbons include, of the structures shown above, (5), (6), (7), (9), (10), (13), (14), (15), (23), (28), (36), (37), (42) and (47).

The skeletons of the alicyclic hydrocarbons may have a substituent group. Such substituent groups include $R_{13}'$ to $R_{16}'$ in the above-mentioned general formula (II-A) or (II-B).

Of the repeating units having the above-mentioned bridge-containing alicyclic hydrocarbons, more preferred are the repeating units represented by the above-mentioned general formula (II-A) or (II-B).

In the above-mentioned general formula (II-A) or (II-B), $R_{13}'$ to $R_{16}'$ each independently represents a hydrogen atom, a halogen atom, a cyano group, —COOH, —COOR$_5$, a group decomposable by an action of an acid, —C(=O)—X—A'—R$_{17}'$, or an alkyl group or a cyclic hydrocarbon group which may have a substituent group.

$R_5$ represents an alkyl group, a cyclic hydrocarbon group or the above-mentioned —Y group shown below, which may have a substituent group.

X represents an oxygen atom, a sulfur atom, —NH—, —NHSO$_2$— or —NHSO$_2$NH—.

A' represents a single bond or a divalent connecting group.

Further, at least two of $R_{13}'$ to $R_{16}'$ may combine with each other to form a ring. n represents 0 or 1.

$R_{17}'$ represents —COOH, —COOR$_5$, —CN, a hydroxyl group, an alkoxyl group which may have a substituent group, —CO—NH—R$_6$, —CO—NH—SO$_2$—R$_6$ or the above-mentioned —Y group.

$R_6$ represents an alkyl group or a cyclic hydrocarbon group, which may have a substituent group.

In the above-mentioned —Y group, $R_{21}'$ to $R_{30}'$ each independently represents a hydrogen atom or an alkyl group which may have a substituent group, and a and b each represents 1 or 2.

The halogen atoms represented by $R_{13}'$ and $R_{16}'$ include chlorine, bromine, fluorine and iodine.

The alkyl groups represented by $R_5$, $R_6$ and $R_{13}'$ to $R_{16}'$ are preferably a straight-chain or branched alkyl group having from 1 to 10 carbon atoms, more preferably a straight-chain or branched alkyl group having from 1 to 6 carbon atoms, and still more preferably methyl, ethyl, propyl, isopropyl, n-butyl, isobutyl, sec-butyl or t-butyl.

The cyclic hydrocarbon groups represented by $R_5$, $R_6$ and $R_{13}'$ to $R_{16}'$ are, for example, a cyclic alkyl group and a bridge-containing hydrocarbon. Examples thereof include cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl and tetracyclododecanyl.

The rings formed by the bonding of at least two of $R_{13}'$ to $R_{16}'$ include a ring having from 5 to 12 carbon atoms such as cyclopentene, cyclohexene, cycloheptane or cyclooctane.

The alkoxyl groups represented by $R_{17}'$ include an alkoxyl group having from 1 to 4 carbon atoms such as methoxy, ethoxy, propoxy or butoxy.

Further substituent groups of the above-mentioned alkyl, cyclic hydrocarbon and alkoxyl groups include a hydroxyl group, a halogen atom, a carboxyl group, an alkoxyl group, an acyl group, a cyano group, an acyloxy group, an alkyl group and a cyclic hydrocarbon group. The halogen atoms include chlorine, bromine, fluorine and iodine, and the alkoxyl groups include an alkoxyl group having from 1 to 4 carbon atoms such as methoxy, ethoxy, propoxy or butoxy. The acyl groups include formyl and acetyl, and the acyloxy groups include acetoxy.

The alkyl groups and the cyclic hydrocarbon groups include the groups described above.

The divalent connecting groups represented by A' include an combination of two or more groups selected from the group consisting of an alkylene group, a substituted alkylene group, an ether group, a thioether group, a carbonyl group, an ester group, an amido group, a sulfonamido group, a urethane group and a urea group.

The alkylene groups and the substituted alkylene groups represented by A' include a group represented by the following formula:

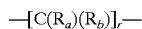

wherein $R_a$ and $R_b$, which may be the same or different, each represents a hydrogen atom, an alkyl group, a substituted alkyl group, a halogen atom, a hydroxyl group or an alkoxyl group. The alkyl group is a lower alkyl group such as methyl, ethyl, propyl, isopropyl or butyl, and more preferably selected from methyl, ethyl, propyl and isopropyl. Further substituent groups of the substituted alkyl groups include a hydroxyl group, a halogen atom and an alkoxyl group. The alkoxyl groups include an alkoxyl group having from 1 to 4 carbon atoms such as methoxy, ethoxy, propoxy or butoxy. The halogen atoms include chlorine, bromine, fluorine and iodine. r represents an integer of from 1 to 10.

Various substituent groups represented by $R_{13}'$ to $R_{16}'$ in the above-mentioned general formula (II-A) or (II-B) are also a substituent group of the atomic group for forming the alicyclic structure or the atomic group Z' for forming the bridge-containing alicyclic structure in the above-mentioned general formula (I).

Specific examples of the repeating units represented by the above-mentioned general formula (II-A) or (II-B) are exemplified below, but are not limited to [II-1] to [II-175] shown below:

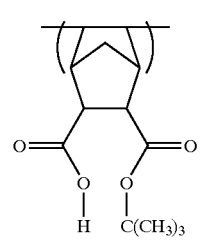

[II-1]

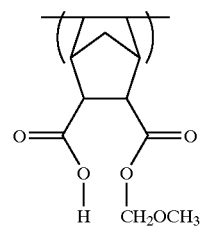

[II-2]

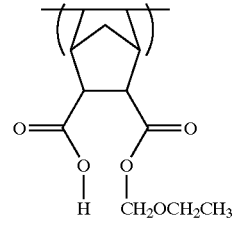

[II-3]

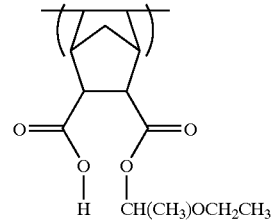

[II-4]

[II-5] 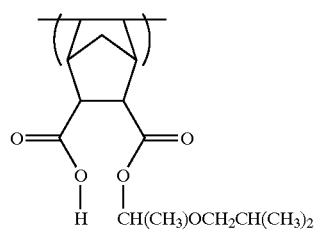
[II-6] 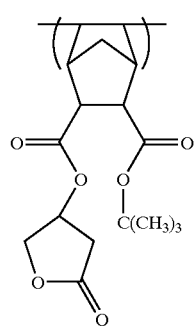
[II-7] 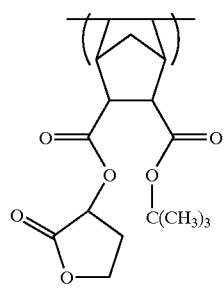
[II-8] 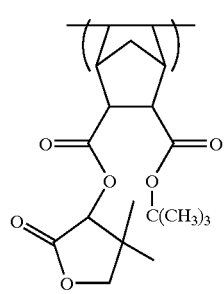
[II-9] 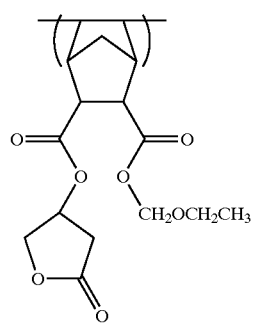
[II-10] 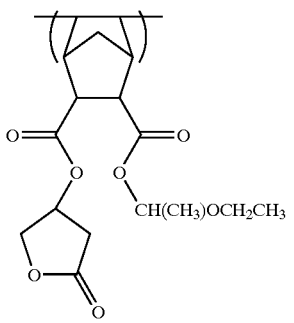
[II-11] 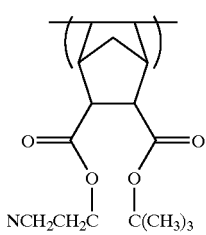
[II-12] 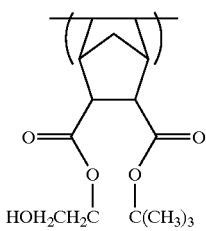
[II-13] 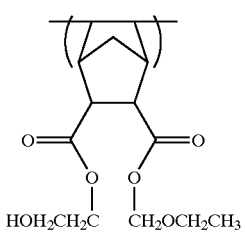
[II-14] 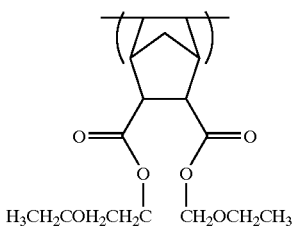
[II-15] 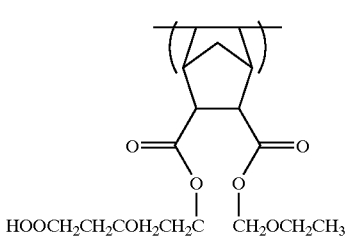

[II-16]
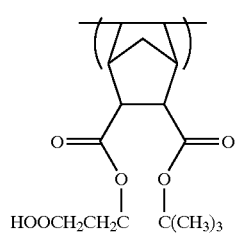
[II-17]
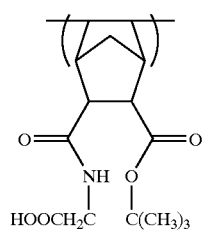
[II-18]
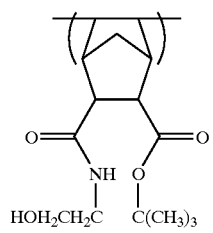
[II-19]
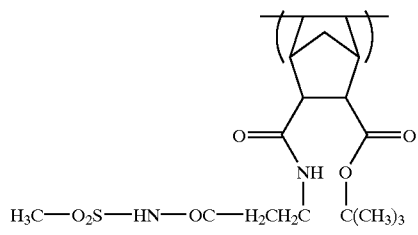
[II-20]
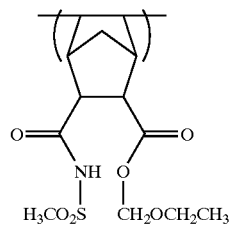
[II-21]
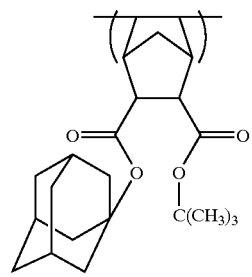
[II-22]
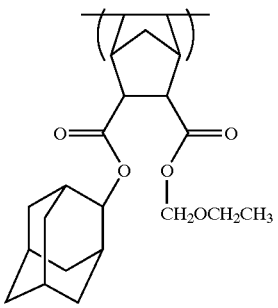
[II-23]
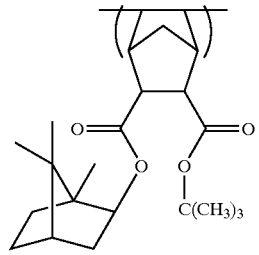
[II-24]
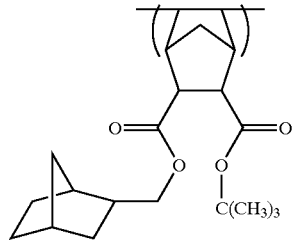
[II-25]
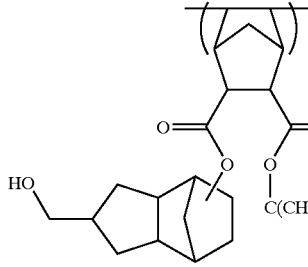
[II-26]
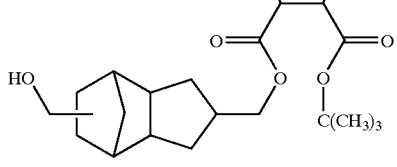
[II-27]
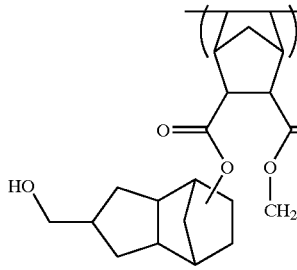

[II-28] 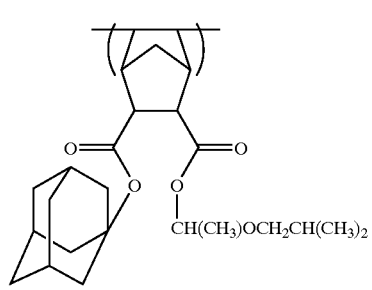
[II-29] 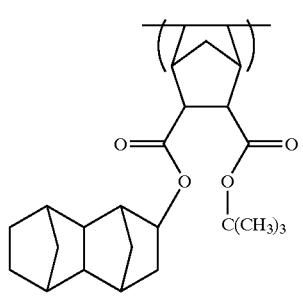
[II-30] 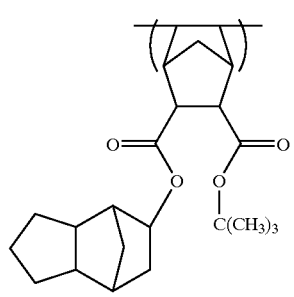
[II-31] 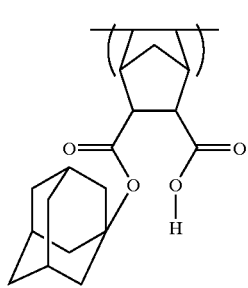
[II-32] 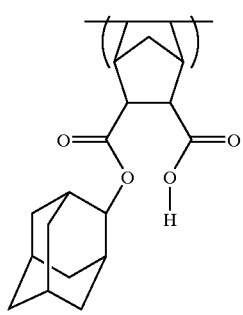
[II-33] 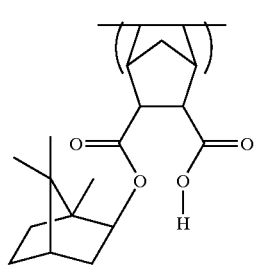
[II-34] 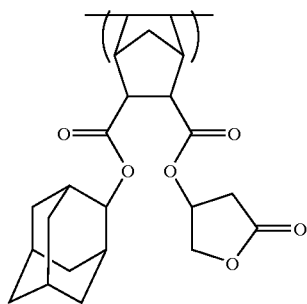
[II-35] 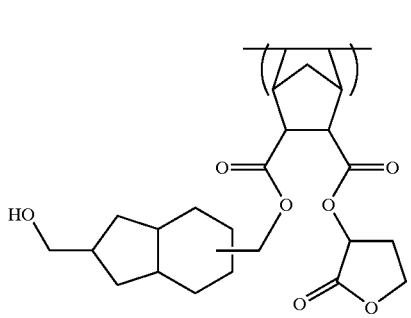
[II-36] 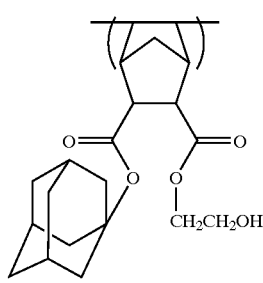
[II-37] 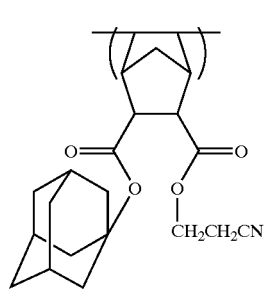

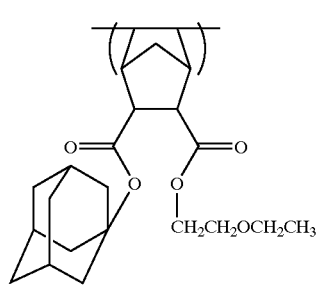
[II-38]
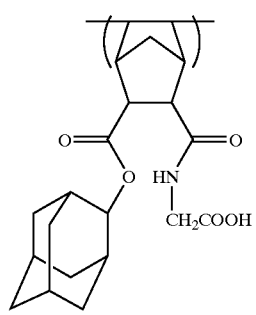
[II-39]
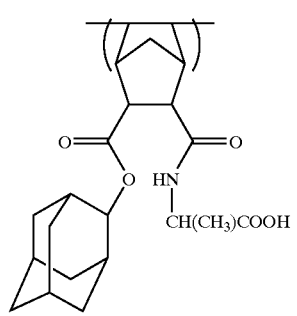
[II-40]
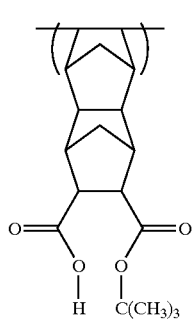
[II-41]
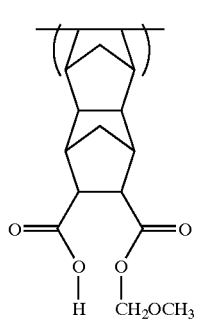
[II-42]
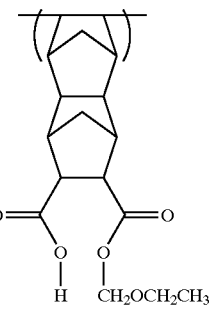
[II-43]
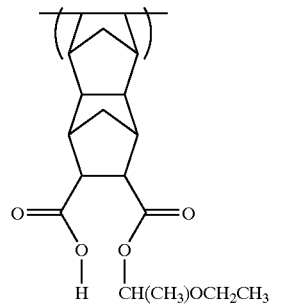
[II-44]
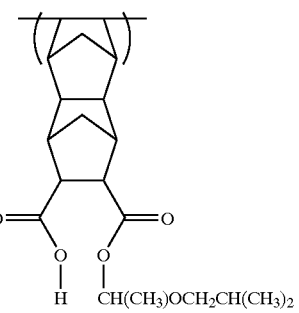
[II-45]
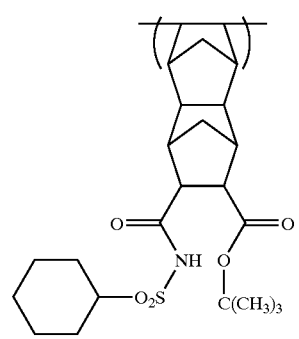
[II-46]
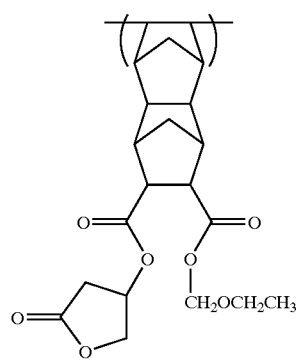
[II-47]

[II-48]
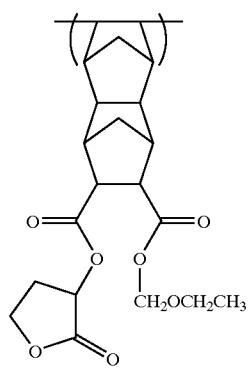
[II-49]
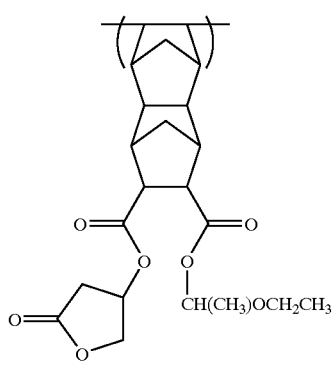
[II-50]
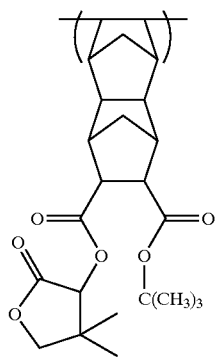
[II-51]
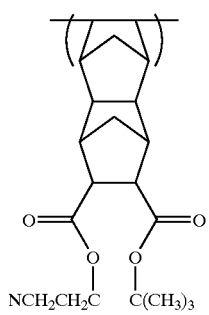
[II-52]
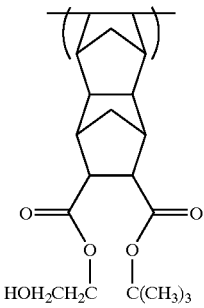
[II-53]
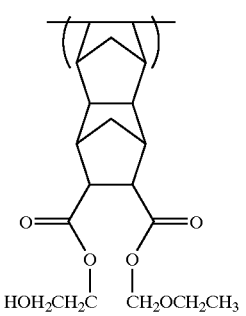
[II-54]
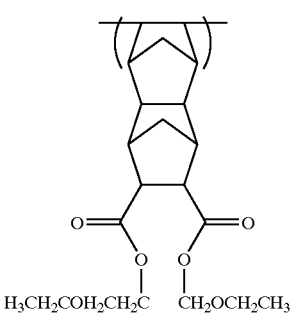
[II-55]
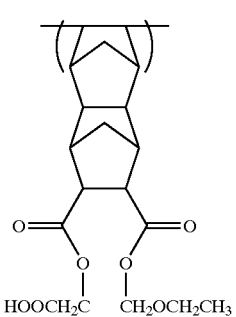
[II-56]
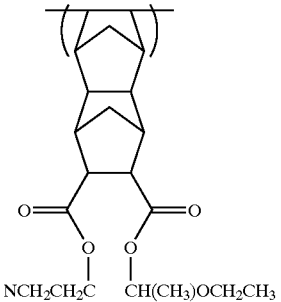

[II-57] 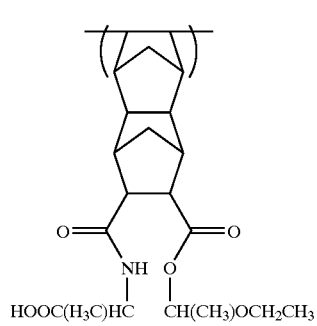
[II-58] 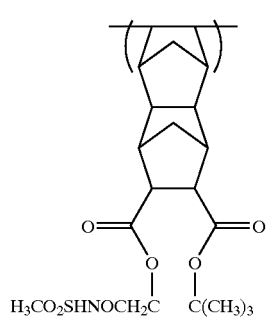
[II-59] 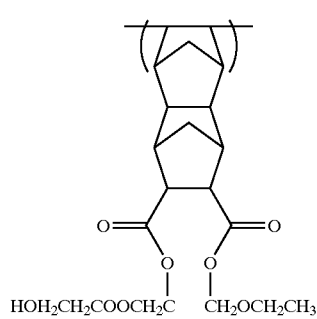
[II-60] 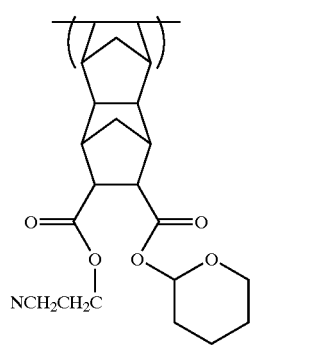
[II-61] 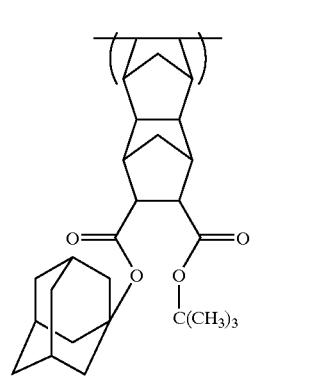
[II-62] 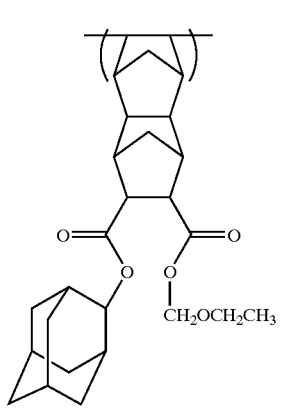
[II-63] 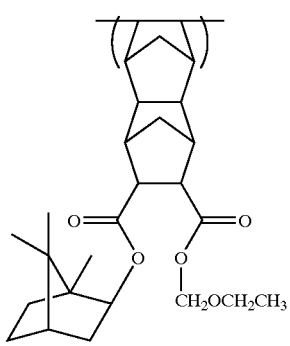
[II-64] 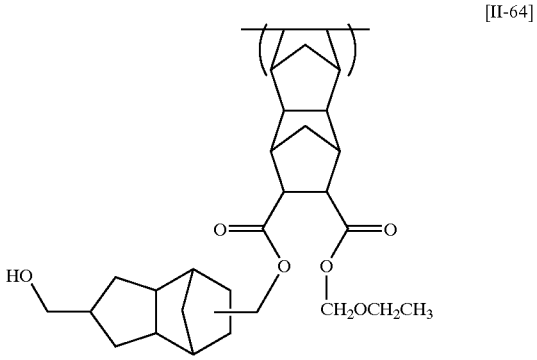
[II-65] 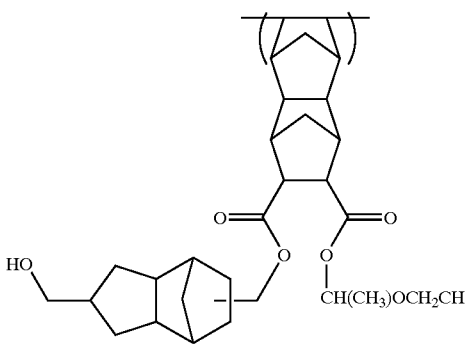

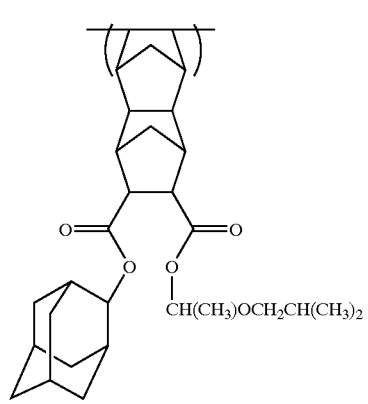 [II-66]
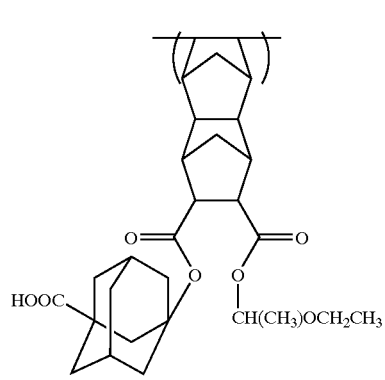 [II-70]
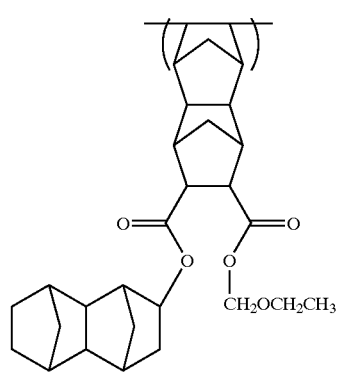 [II-67]
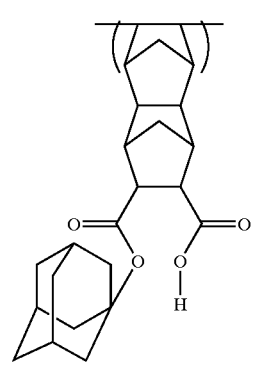 [II-71]
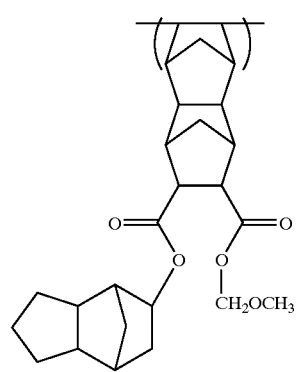 [II-68]
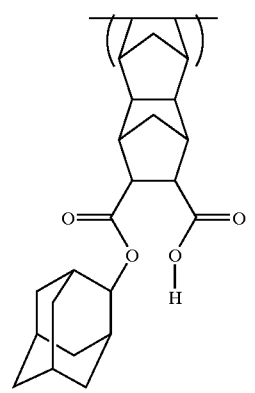 [II-72]
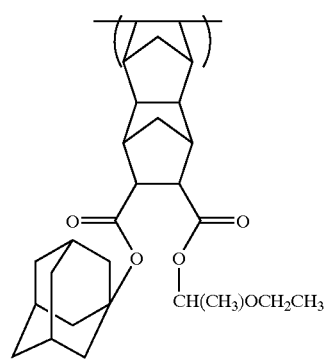 [II-69]
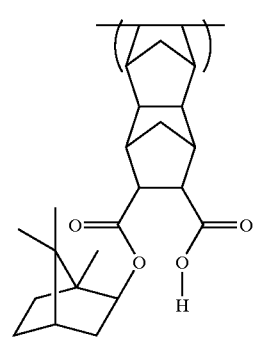 [II-73]

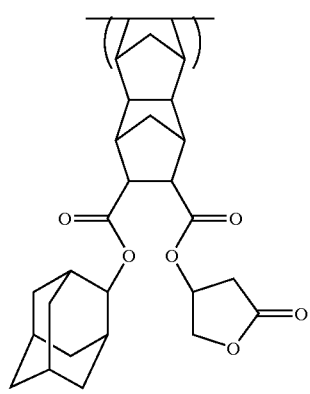
[II-74]
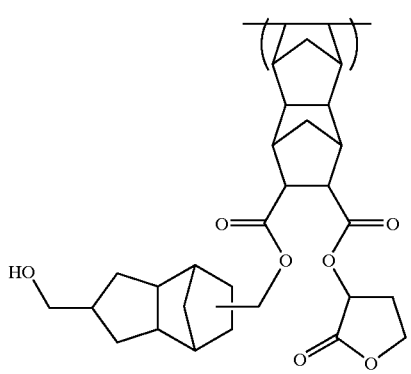
[II-75]
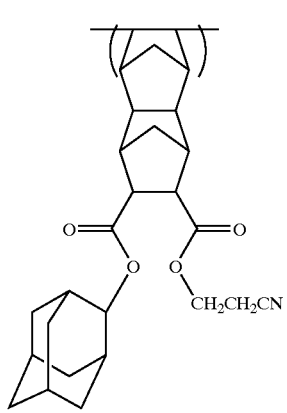
[II-76]
[II-77]
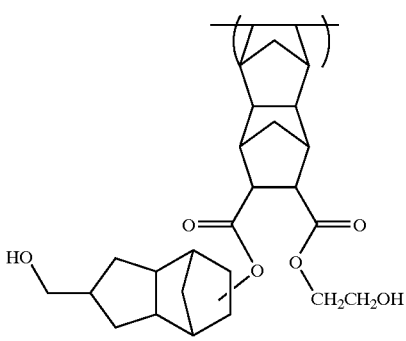
[II-78]
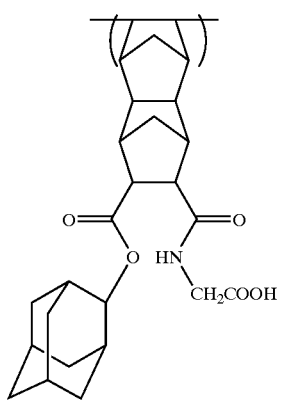
[II-79]
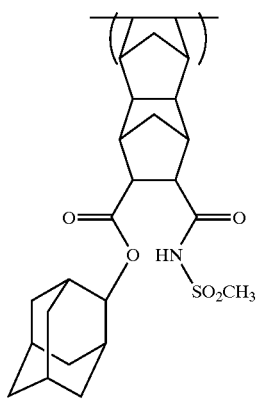
[II-80]
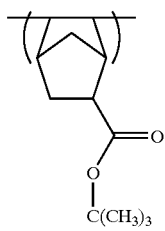
[II-81]
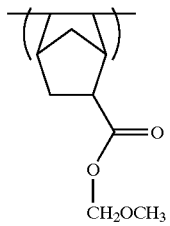
[II-82]

[II-83] 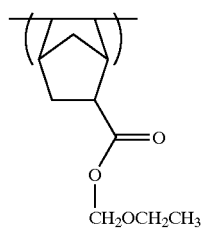
[II-84] 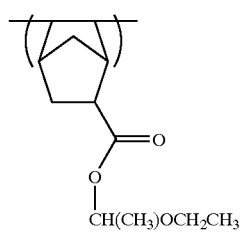
[II-85] 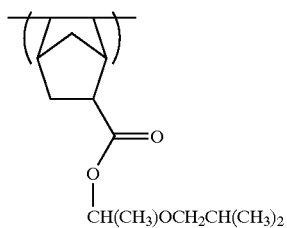
[II-86] 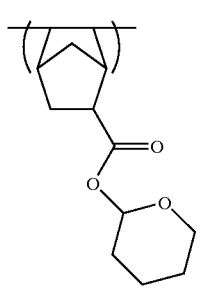
[II-87] 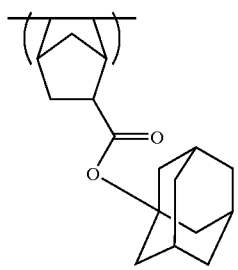
[II-88] 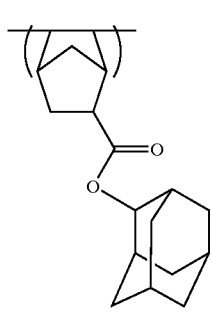
[II-89] 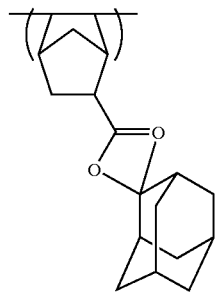
[II-90] 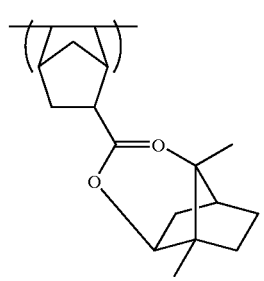
[II-91] 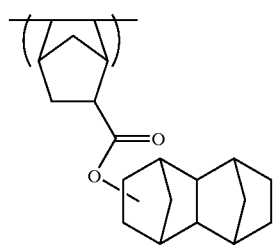
[II-92] 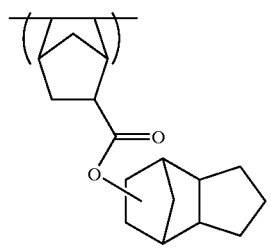
[II-93] 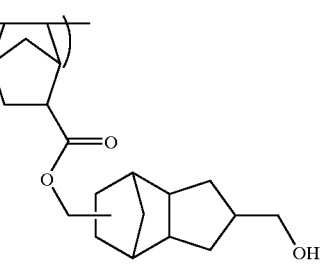
[II-94] 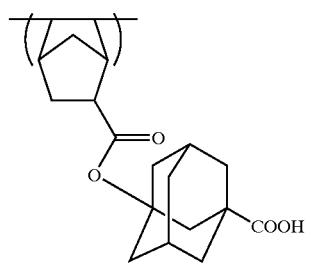

[II-95]
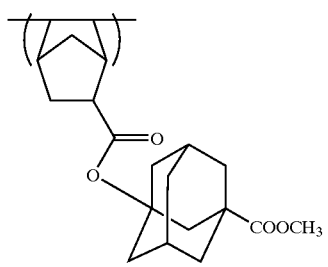
[II-96]
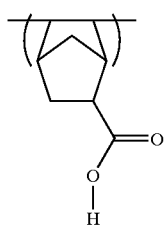
[II-97]
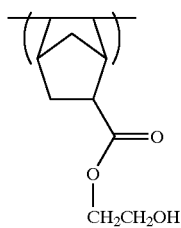
[II-98]
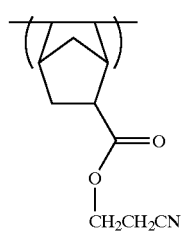
[II-99]
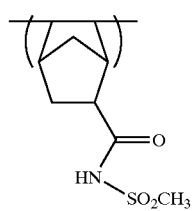
[II-100]
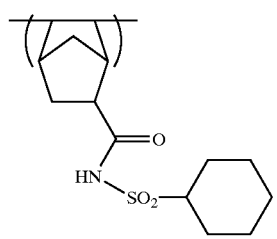
[II-101]
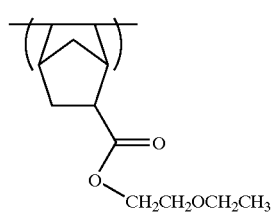
[II-102]
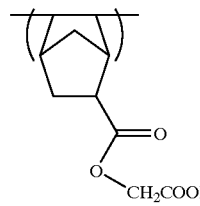
[II-103]
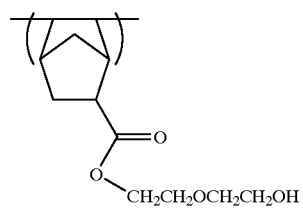
[II-104]
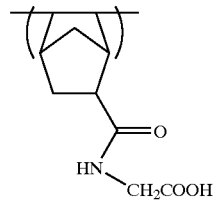
[II-105]
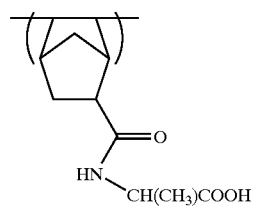
[II-106]
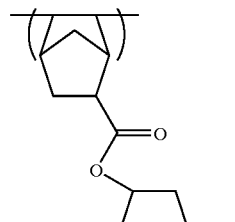
[II-107]
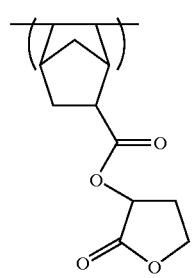
[II-108]
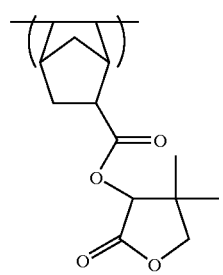

[II-109] 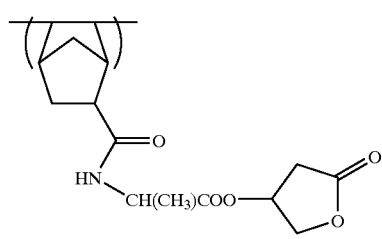
[II-110] 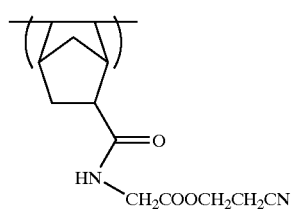
[II-111] 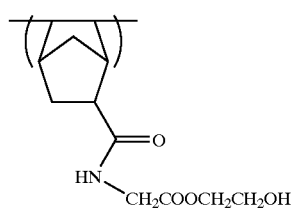
[II-112] 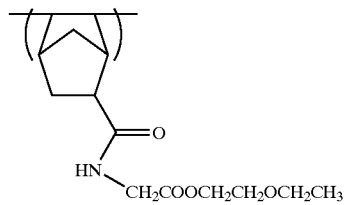
[II-113] 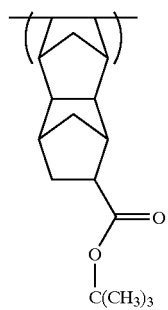
[II-114] 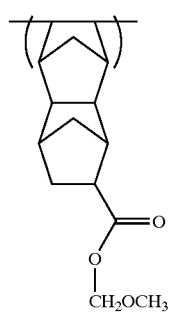
[II-115] 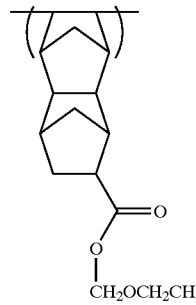
[II-116] 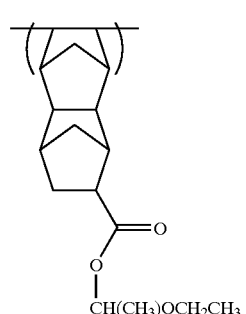
[II-117] 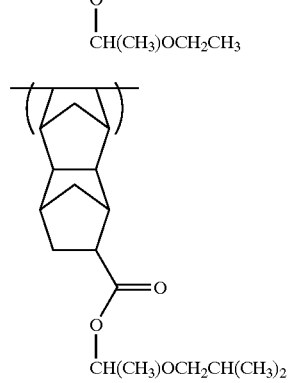
[II-118] 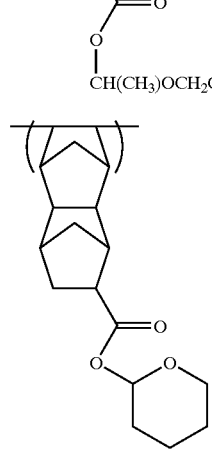
[II-119] 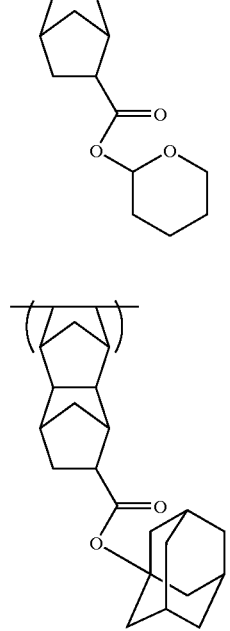

[II-120]
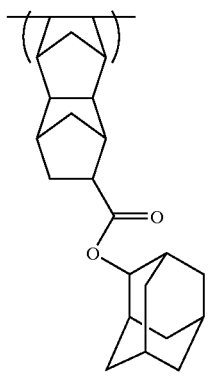
[II-121]
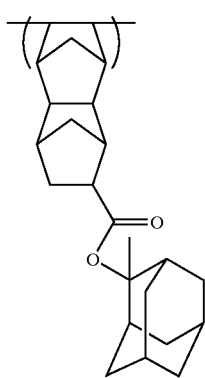
[II-122]
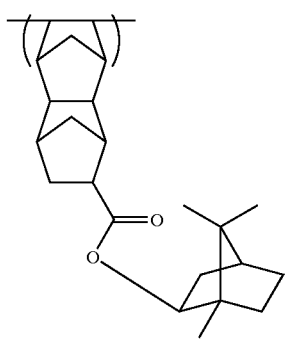
[II-123]
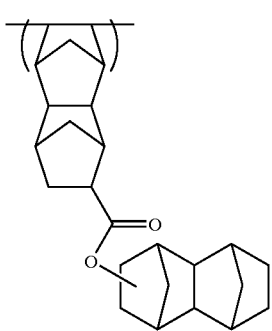
[II-124]
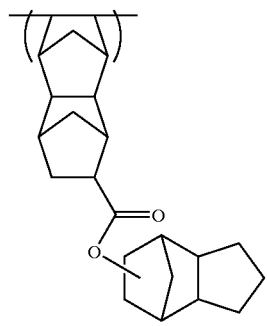
[II-125]
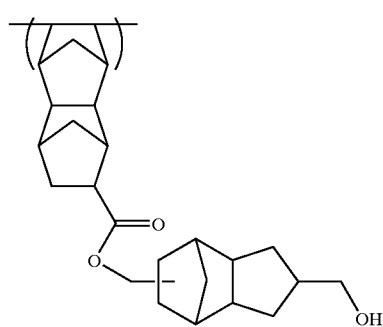
[II-126]
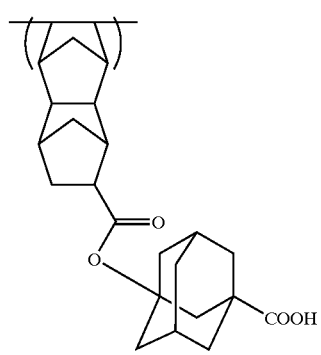
[II-127]
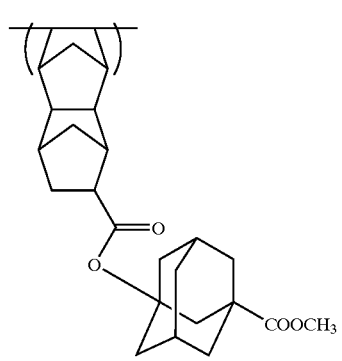
[II-128]

[II-129]
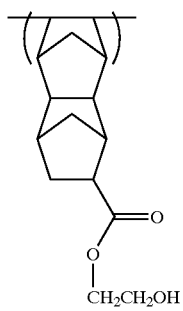
[II-130]
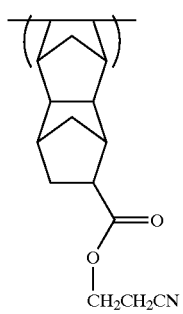
[II-131]
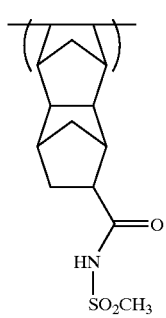
[II-132]
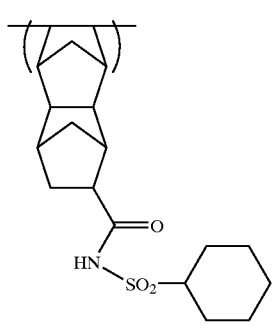
[II-133]
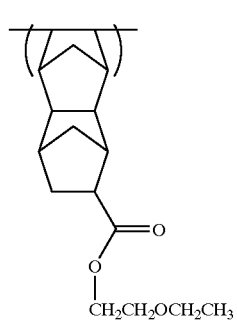
[II-134]
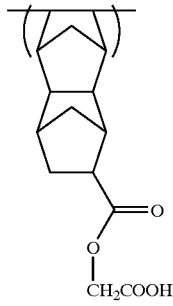
[II-135]
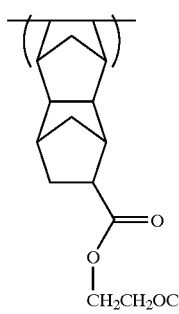
[II-136]
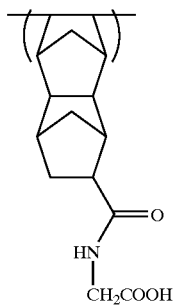
[II-137]
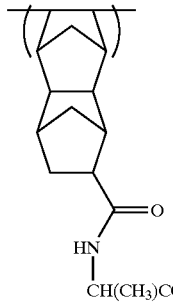
[II-138]
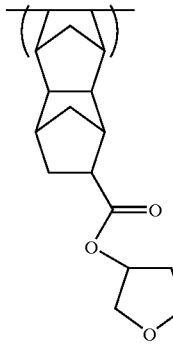

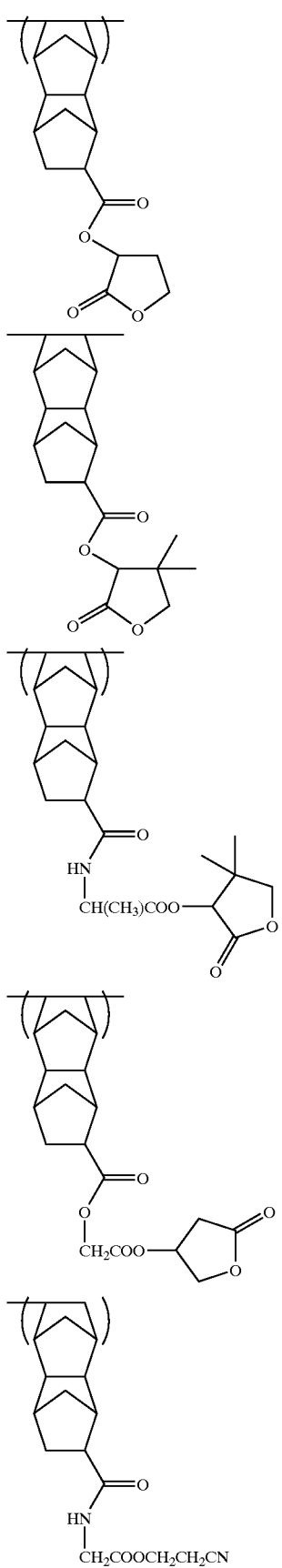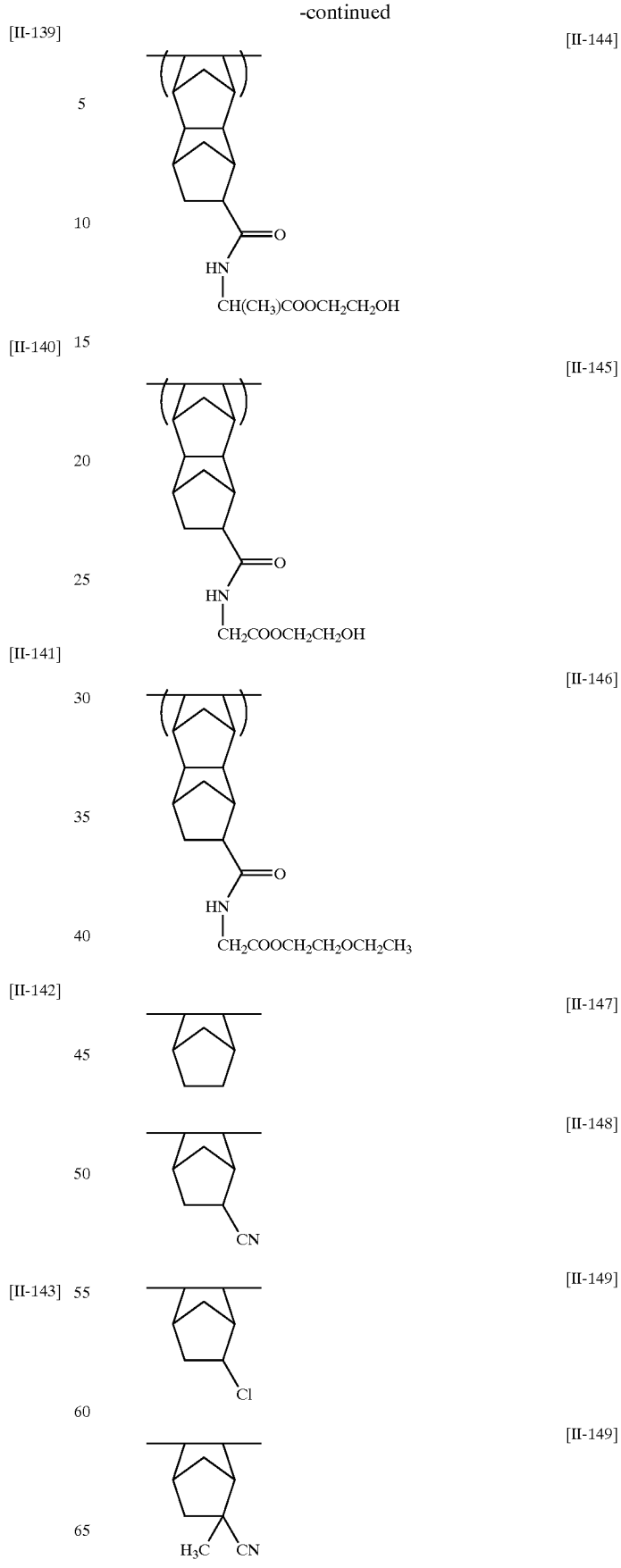

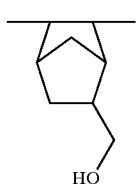
[II-150]
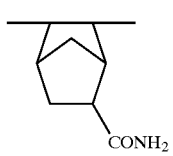
[II-151]
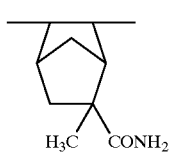
[II-152]
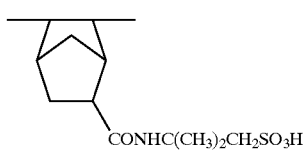
[II-153]
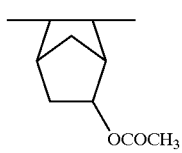
[II-154]
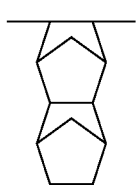
[II-155]
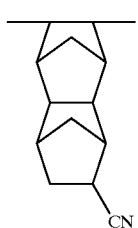
[II-156]
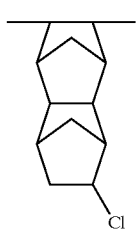
[II-157]
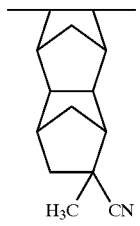
[II-158]
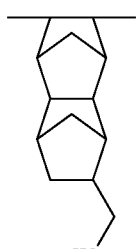
[II-159]
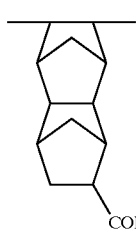
[II-160]
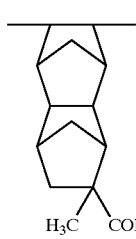
[II-161]
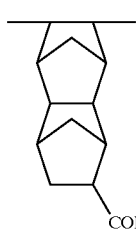
[II-162]
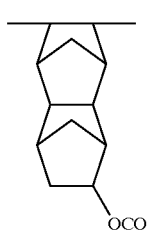
[II-163]
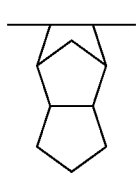
[II-164]

[II-165] 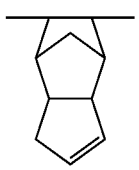

[II-166] 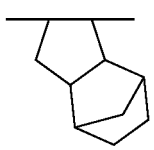

[II-167] 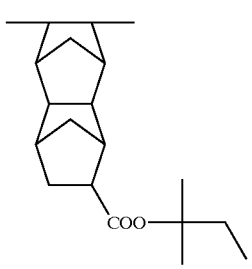

[II-168] 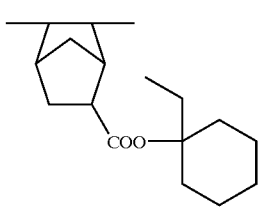

[II-169] 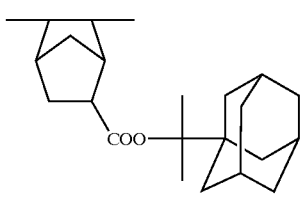

[II-170] 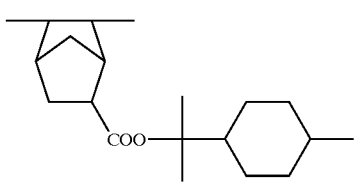

[II-171] 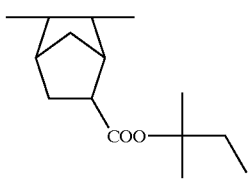

[II-172] 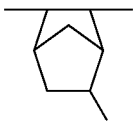
COOCH$_2$CH$_2$COOC(CH$_3$)$_3$

[II-173] 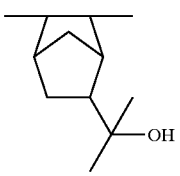

[II-174] 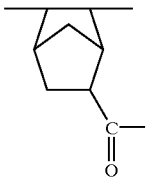
—O—CH$_2$—O—CH$_2$CH$_2$—O—CH$_2$CH$_3$

[II-175] 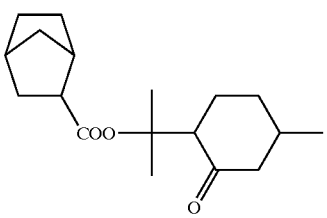

In the above-mentioned general formula (II), $Z_2$ represents —O— or —N(R$_{41}$)—, wherein R$_{41}$ represents a hydrogen atom, a hydroxyl group, an alkyl group, a haloalkyl group or —OSO$_2$—R$_{42}$. R$_{42}$ represents an alkyl group, a haloalkyl group, a cycloalkyl group or a camphor residue.

The alkyl groups represented by R$_{41}$ and R$_{42}$ are preferably a straight-chain or branched alkyl group having from 1 to 10 carbon atoms, more preferably a straight-chain or branched alkyl group having from 1 to 6 carbon atoms, and still more preferably methyl, ethyl, propyl, isopropyl, n-butyl, isobutyl, sec-butyl or t-butyl.

The haloalkyl groups represented by R$_{41}$ and R$_{42}$ include trifluoromethyl, nonafluorobutyl, pentadecafluorooctyl and trichloromethyl. The cycloalkyl groups represented by R$_{42}$ include cyclopentyl, cyclohexyl and cyclooctyl.

The alkyl groups and the haloalkyl groups represented by R$_{41}$ and R$_{42}$, and the cycloalkyl groups or the camphor residues represented by R$_{42}$ may each have a substituent group. Such substituent groups include, for example, a hydroxyl group, a carboxyl group, a cyano group, a halogen atom (for example, chlorine, bromine, fluorine or iodine), an alkoxyl group (preferably having from 1 to 4 carbon atoms, for example, methoxy, ethoxy, propoxy or butoxy), an acyl group (preferably having from 2 to 5 carbon atoms, for example, formyl or acetyl), an acyloxy group (preferably having from 2 to 5 carbon atoms, for example, acetoxy) and an aryl group (preferably having from 6 to 14 carbon atoms, for example, phenyl).

Specific examples of the repeating units represented by the above-mentioned general formula (II) exemplified below, but are not limited to [I'-1] to [I'-7] shown below:

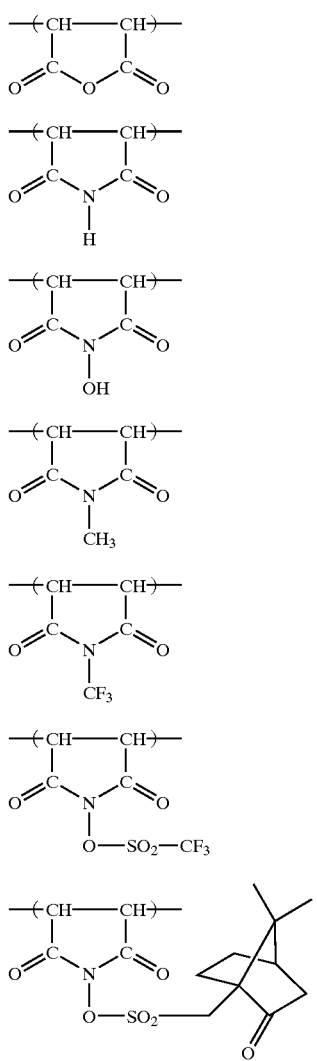

[I'-1]
[I'-2]
[I'-3]
[I'-4]
[I'-5]
[I'-6]
[I'-7]

Then, the repeating units represented by general formula (III) will be described.

In formula (III), $R_{91}$ represents a hydrogen atom, a lower alkyl group, a halogen atom or a cyano group.

The lower alkyl group represented by $R_{91}$ is preferably an alkyl group having from 1 to 5 carbon atoms, including methyl, ethyl, propyl, butyl or pentyl.

The lower alkyl group may further have a substituent group. Such substituent groups include, for example, a hydroxyl group, a carboxyl group, a cyano group, a halogen atom (for example, chlorine, bromine, fluorine or iodine), an alkoxyl group (preferably having from 1 to 4 carbon atoms, for example, methoxy, ethoxy, propoxy or butoxy), an acyl group (preferably having from 2 to 5 carbon atoms, for example, formyl or acetyl), an acyloxy group (preferably having from 2 to 5 carbon atoms, for example, acetoxy) and an aryl group (preferably having from 6 to 14 carbon atoms, for example, phenyl).

$X_5$ represents —O—, —S—, —NR$_{93}$— or NR$_{93}$SO$_2$—. $R_{93}$ represents a hydrogen atom or a chain or cyclic alkyl group. The chain alkyl group represented by $R_{93}$ is a lower alkyl group, and preferably a lower alkyl group having from 1 to 5 carbon atoms, including methyl, ethyl, propyl, butyl or pentyl. The cyclic alkyl groups include, for example, a cyclic alkyl group having from 3 to 12 carbon atoms. These may further have a substituent group. The substituent groups include, for example, a hydroxyl group, a carboxyl group, a cyano group, a halogen atom (for example, chlorine, bromine, fluorine or iodine), an alkoxyl group (preferably having from 1 to 4 carbon atoms, for example, methoxy, ethoxy, propoxy or butoxy), an acyl group (preferably having from 2 to 5 carbon atoms, for example, formyl or acetyl), an acyloxy group (preferably having from 2 to 5 carbon atoms, for example, acetoxy) and an aryl group (preferably having from 6 to 14 carbon atoms, for example, phenyl).

B represents a single bond or a connecting group. The connecting groups represented by B include, for example, a single group or a combination of two or more groups selected from the group consisting of an alkylene group, a cycloalkylene group, an ether group, a thioether group, a carbonyl group and an ester group.

The cycloalkylene groups represented by B include preferably a cycloalkylene group having from 3 to 10 carbon atoms, including, for example, cyclopentylene, cyclohexylene or cyclooctylene.

The alkylene groups represented by B include a group represented by the following formula:

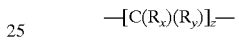

wherein $R_x$ and $R_y$ each independently represents a hydrogen atom, a hydroxyl group, a halogen atom, a chain or cyclic alkyl group which may have a substituent group, an alkoxyl group, an alkenyl group, an aryl group or an aralkyl group, and $R_x$ and $R_y$ may combine with each other to form a cyclic alkyl ring.

The cyclic alkyl groups represented by $R_x$ or $R_y$ include a straight-chain or branched alkyl group, which may have a substituent group. The straight-chain or branched alkyl group is preferably a straight-chain or branched alkyl group having from 1 to 12 carbon atoms, more preferably a straight-chain or branched alkyl group having from 1 to 10 carbon atoms, and still more preferably methyl, ethyl, propyl, isopropyl, n-butyl, isobutyl, sec-butyl, pentyl, neopentyl, hexyl, heptyl, octyl, nonyl or decyl.

The cyclic alkyl groups include a cyclic alkyl group having from 3 to 30 carbon atoms, which may contain a heteroatom such as an oxygen atom or a nitrogen atom. Specific examples thereof include cyclopropyl, cyclopentyl, cyclohexyl, adamantyl, norbornyl, bornyl, tricyclodecanyl, dicyclopentenyl, norbornaneepoxy, menthyl, isomenthyl, neomenthyl, tetracyclododecanyl, a steroid residue, tetrahydropyranyl and morpholino.

The alkoxyl group is generally an alkoxyl group having from 1 to 12 carbon atoms, preferably an alkoxyl group having from 1 to 10 carbon atoms, and more preferably an alkoxyl group having from 1 to 4 carbon atoms. Examples thereof include methoxy, ethoxy, propoxy and butoxy.

The alkenyl groups include an alkenyl group having from 2 to 6 carbon atoms, which may have a substituent group. Specific examples thereof include vinyl, propenyl, allyl, butenyl, pentenyl, hexenyl, cyclopentenyl, cyclohexenyl, 3-oxocyclohexenyl, 3-oxocyclopentenyl and 3-oxoindenyl. Of these, the cyclic alkenyl groups may each have an oxygen atom.

The aryl groups include an aryl group having from 6 to 10 carbon atoms, which may have a substituent group. Specific examples thereof include phenyl, tolyl and naphthyl.

The aralkyl groups include benzyl, phenetyl, naphthylmethyl, naphthylethyl and mesitylmethyl.

The substituent groups which may be contained in the above-mentioned chain or cyclic alkyl groups, alkoxyl groups, alkenyl groups aryl groups or aralkyl groups include, for example, a carboxyl group, a cyano group, a hydroxyl group, a halogen atom (chlorine, bromine, fluorine or iodine), an alkoxyl group (preferably having from 1 to 4 carbon atoms, for example, methoxy, ethoxy, propoxy or butoxy), an acetylamido group, an alkoxycarbonyl group, an acyl group (preferably having from 2 to 10 carbon atoms, for example, formyl, acetyl or propionyl), an acyloxy group (preferably having from 2 to 10 carbon atoms, for example, acetoxy) and an aryl group (preferably having from 6 to 14 carbon atoms, for example, phenyl). The aryl group or aralkyl group represented by $R_x$ or $R_y$ may further have an alkyl group (preferably having from 1 to 5 carbon atoms, for example, methyl, ethyl, propyl, isopropyl, butyl, cyclopropyl, cyclobutyl or cyclopentyl) as a substituent group. The alkyl group as a substituent group may further have a substituent group such as a hydroxyl group, a halogen atom or an alkoxyl group (preferably having from 1 to 4 carbon atoms, for example, methoxy, ethoxy, propoxy or butoxy).

Z is an integer of from 1 to 10, and preferably an integer of from 1 to 4.

$R_{92}$ represents a hydrogen atom, a chain or cyclic alkyl group, an alkoxyl group, a hydroxyl group, a carboxyl group, a cyano group, —$COOR_{94}$ or a group represented by any one of the above-mentioned general formulas (IV) to (X), wherein $R_{94}$ represents a hydrogen atom or a chain or cyclic alkyl group.

The chain alkyl group represented by $R_{92}$ or $R_{94}$ is generally a chain alkyl group having from 1 to 30 carbon atoms, and preferably a chain alkyl group having from 6 to 20 carbon atoms. Examples thereof include methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl.

The cyclic alkyl group represented by $R_{92}$ or $R_{94}$ is generally a cyclic alkyl group having from 3 to 40 carbon atoms, and preferably a cyclic alkyl group having from 6 to 20 carbon atoms. Examples thereof include cyclopropyl, cyclopentyl, cyclohexyl, adamantyl, norbornyl, bornyl, tricyclodecanyl, dicyclopentenyl, norbornaneepoxy, menthyl, isomenthyl, neomenthyl, tetracyclododecanyl, a steroid residue, tetrahydropyranyl and morpholino.

The chain alkyl group represented by $R_{92}$ or $R_{94}$ may have a substituent group. The substituent groups include, for example, a hydroxyl group, a carboxyl group, a cyano group, a halogen atom (chlorine, bromine, fluorine or iodine), an alkoxyl group (preferably having from 1 to 4 carbon atoms, for example, methoxy, ethoxy, propoxy or butoxy), an alkoxycarbonyl group, an acyl group (preferably having from 2 to 5 carbon atoms, for example, formyl or acetyl), an acyloxy group (preferably having from 2 to 5 carbon atoms, for example, acetoxy), an aryl group (preferably having from 6 to 14 carbon atoms, for example, phenyl) and an acetylamido group. Alkoxyl groups in the alkoxycarbonyl groups include, for example, an alkoxyl group having from 1 to 4 carbon atoms such as methoxy, ethoxy, propoxy or butoxy.

The cyclic alkyl group represented by $R_{92}$ or $R_{94}$ may have a carboxyl group, a cyano group, a halogen atom (chlorine, bromine, fluorine or iodine), an alkoxyl group (preferably having from 1 to 4 carbon atoms, for example, methoxy, ethoxy, propoxy or butoxy), an alkoxycarbonyl group, an acyl group (preferably having from 2 to 5 carbon atoms, for example, formyl or acetyl), an acyloxy group (preferably having from 2 to 5 carbon atoms, for example, acetoxy), an aryl group (preferably having from 6 to 14 carbon atoms, for example, phenyl) and an acetylamido group as a substituent group. Alkoxyl groups in the alkoxycarbonyl groups include, for example, an alkoxyl group having from 1 to 4 carbon atoms such as methoxy, ethoxy, propoxy or butoxy.

The repeating units represented by the above-mentioned general formula (III) in which $R_{92}$ is a cyclic alkyl group is preferably repeating units represented by the following general formula (IIIa) or (IIIb).

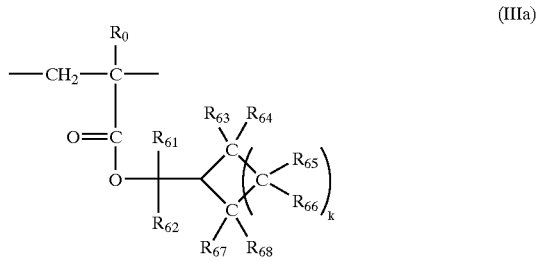

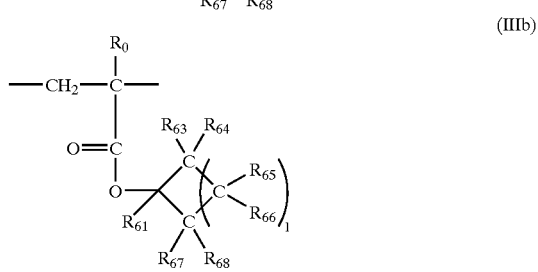

In general formulas (IIIa) and (IIIb), $R_0$ represents a hydrogen atom, a lower alkyl group, a halogen atom or a cyano group. $R_{61}$ and $R_{62}$ each represents a lower alkyl group. $R_{63}$ to $R_{68}$ each independently represents a hydrogen atom, a lower alkyl group, a lower alkoxyl group or a halogen atom. $R_{63}$ and $R_{64}$ or $R_{65}$ and $R_{66}$ may combine together to form a carbonyl group. $R_{63}$ and $R_{65}$ may combine with each other to form an alkylene chain. k and l are an integer of from 2 to 5.

The repeating units represented by the above-mentioned general formulas (IIIa) and (IIIb) indicate acid decomposability by the presence of a tertiary carbon atom bound to $R_{61}$.

$R_0$ is preferably a hydrogen atom.

The lower alkyl groups represented by $R_0$ and $R_{61}$ to $R_{68}$ each has from 1 to 6 carbon atoms, and preferably from 1 to 4 carbon atoms. Specific examples thereof include methyl, ethyl, straight-chain or branched propyl and straight-chain or branched butyl.

The lower alkoxyl groups represented by $R_{63}$ to $R_{68}$ each has from 1 to 6 carbon atoms, and preferably from 1 to 4 carbon atoms. Specific examples thereof include methoxy, ethoxy, straight-chain or branched propoxy and straight-chain or branched butoxy.

The lower alkyl groups represented by $R_0$ and $R_{61}$ to $R_{68}$ and the lower alkoxyl groups represented by $R_{63}$ to $R_{68}$ may have a substituent group. The substituent groups include, for example, a halogen atom such as chlorine or bromine, and an alkoxyl group (preferably having from 1 to 3 carbon atoms) such as methoxy or ethoxy.

$R_{63}$ and $R_{64}$ or $R_{65}$ and $R_{66}$ may form together a carbonyl group.

k and l are preferably an integer of from 2 to 4, and more preferably 2 or 3.

The alkylene chain which may be formed by combining $R_{63}$ with $R_{65}$ is preferably an alkylene chain having 3 or less carbon atoms such as a methylene chain, an ethylene chain or a propylene chain.

The alkoxyl group represented by $R_{92}$ is generally an alkoxyl group having from 1 to 30 carbon atoms, preferably an alkoxyl group having from 3 to 20 carbon atoms and more preferably an alkoxyl group having from 4 to 15 carbon atoms. Examples thereof include methoxy, ethoxy propoxy and butoxy.

The alkoxyl group represented by $R_{92}$ may further have a substituent group. The substituent groups are similar to, for example, those described as the substituent groups to the chain or cyclic alkyl groups represented by $R_{92}$.

The specific examples of the repeating units represented by general formula (III) in which $R_{92}$ is an alkyl group, an alkoxyl group or a hydrogen atom and the repeating units represented by general formulas (IIIa) and (IIIb) are exemplified below, but are not limited thereto:

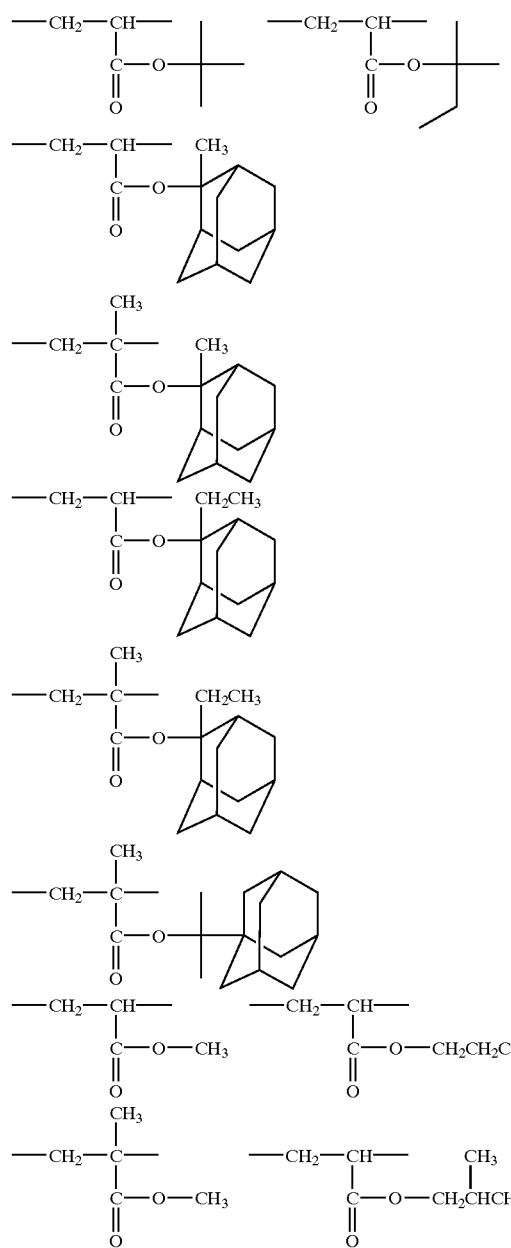

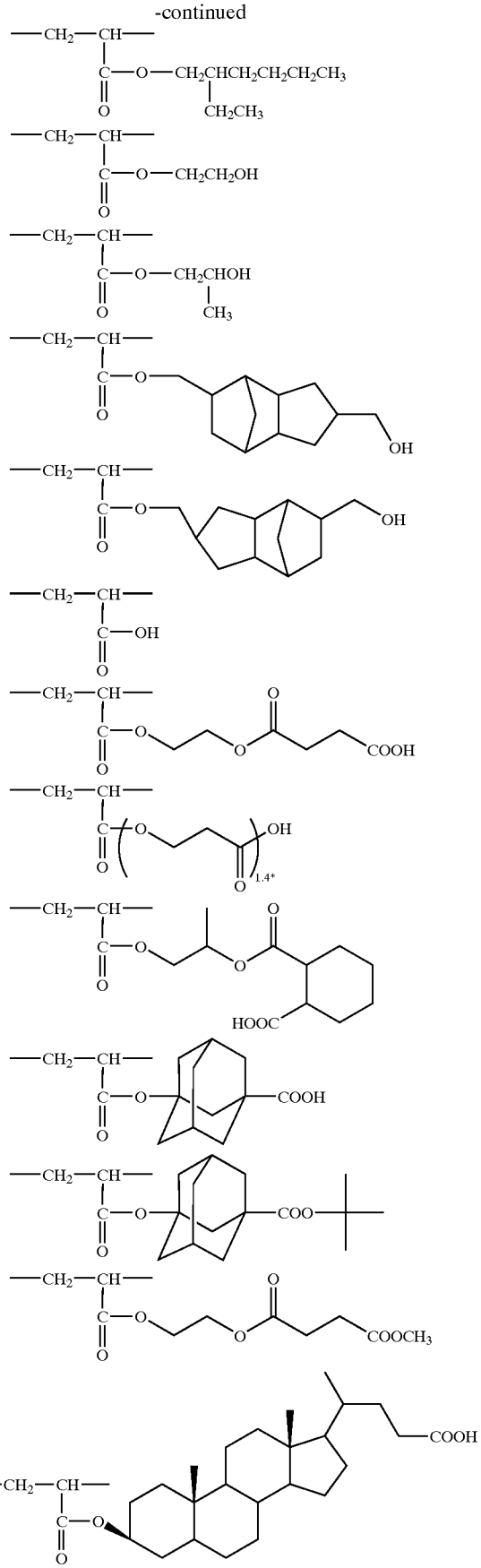

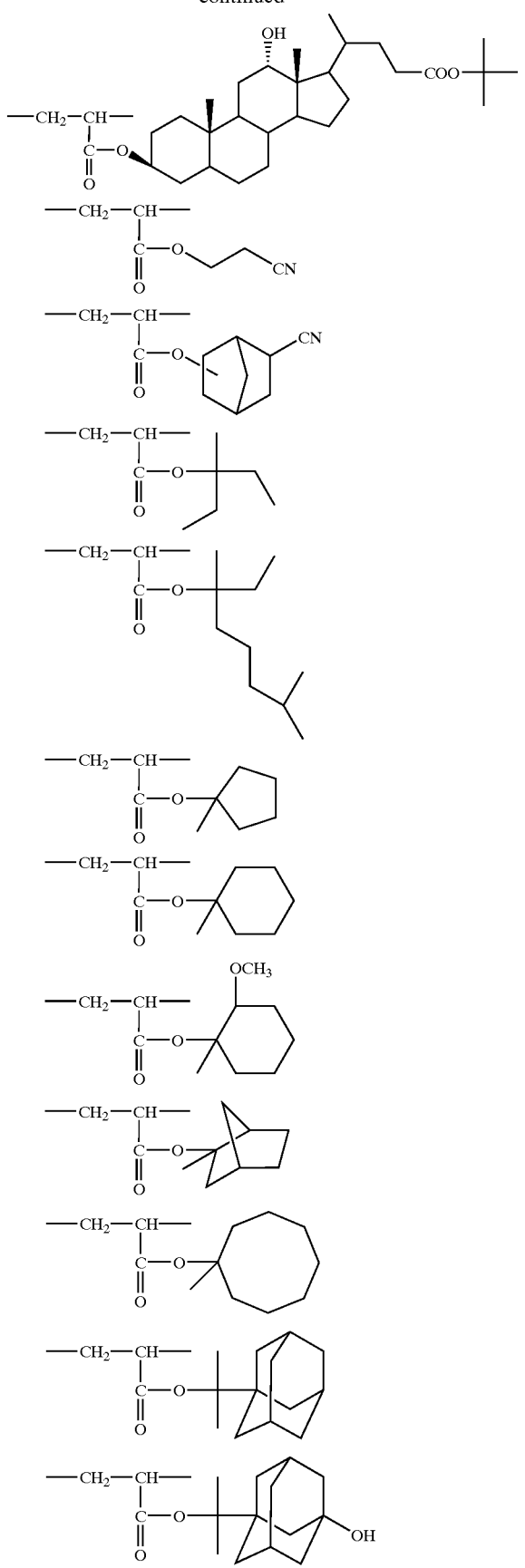
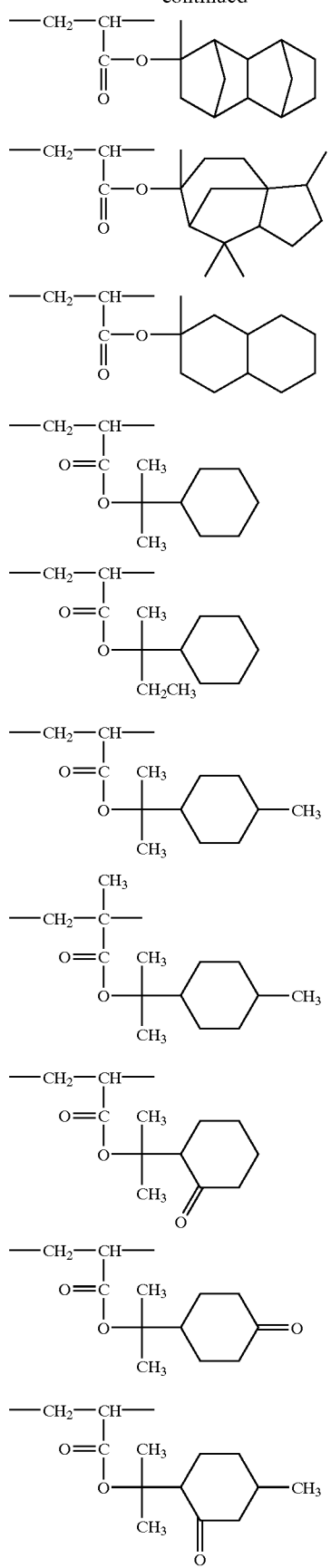

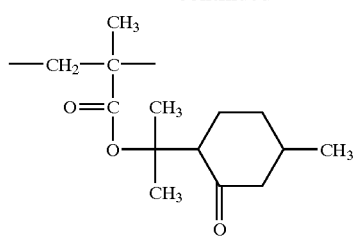
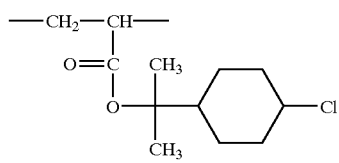
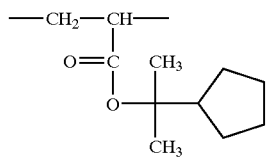
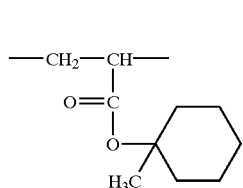
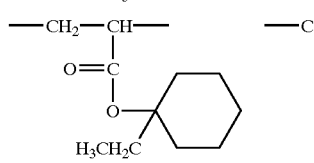
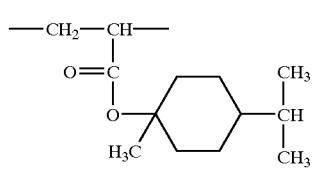
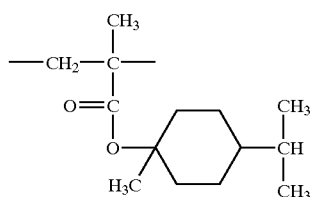
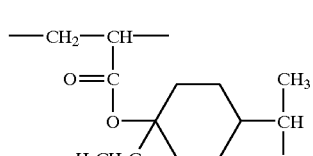
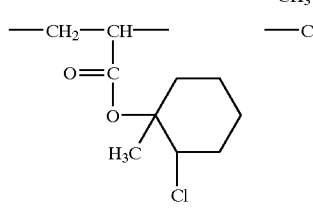
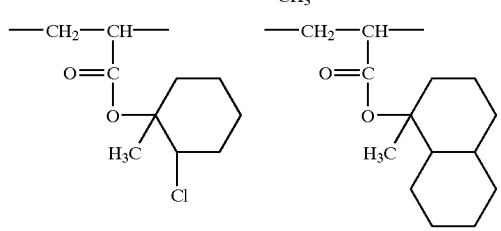

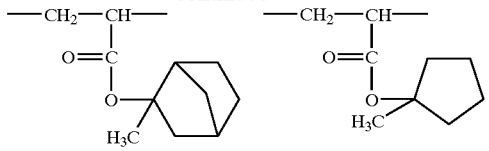
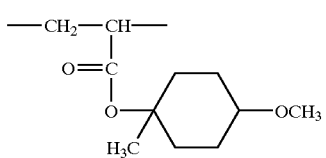

*) This indicates a mixture of units different in the umber of groups in parentheses, and that 1.4 groups in parentheses are contained on average.

Specific examples of monomers corresponding to the repeating units represented by formula (III), the repeating units represented by formula (IIIa) and the repeating units represented by formula (IIIb) are sown below, but are not limited thereto.

1

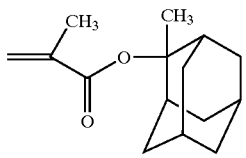

2

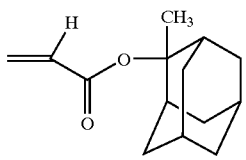

3

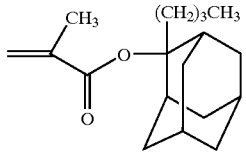

4

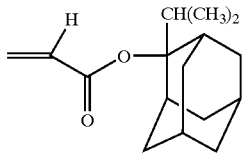

5

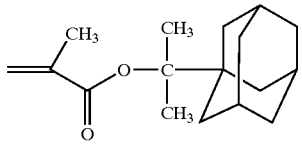

6

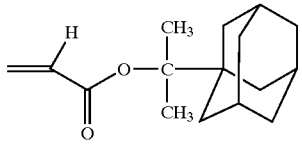

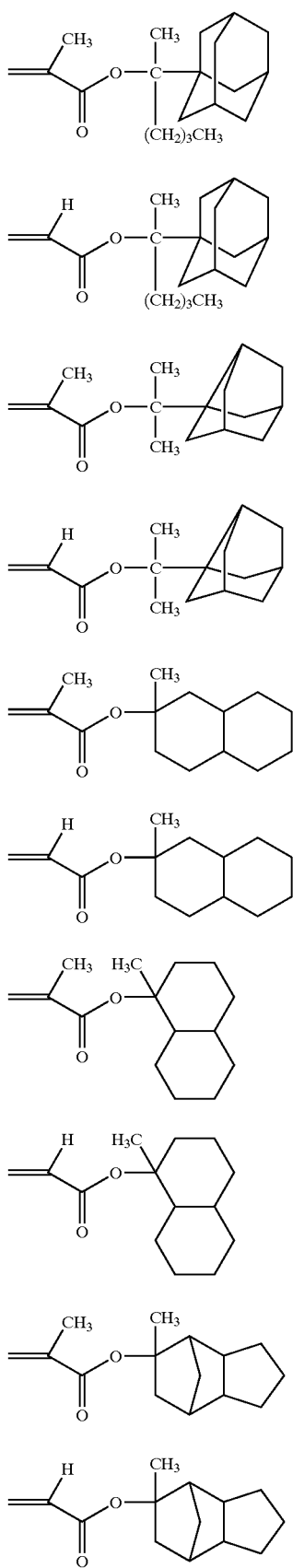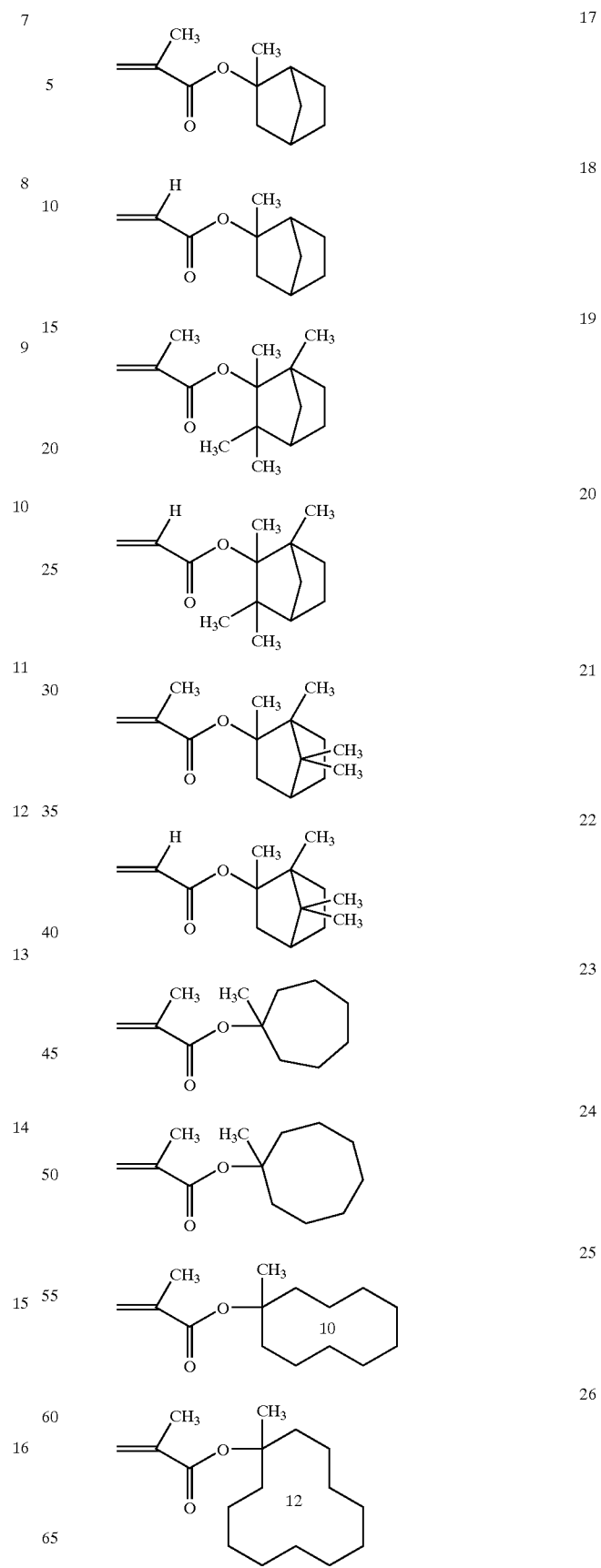

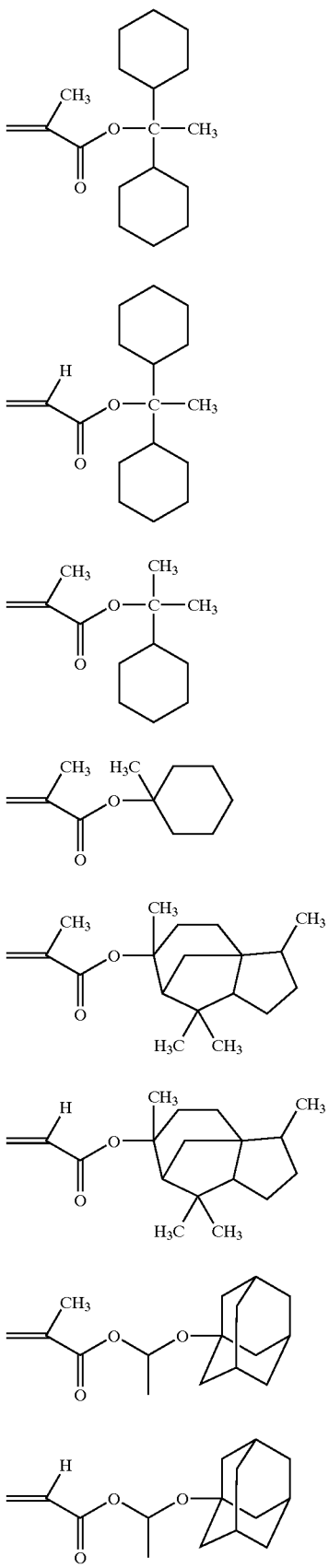
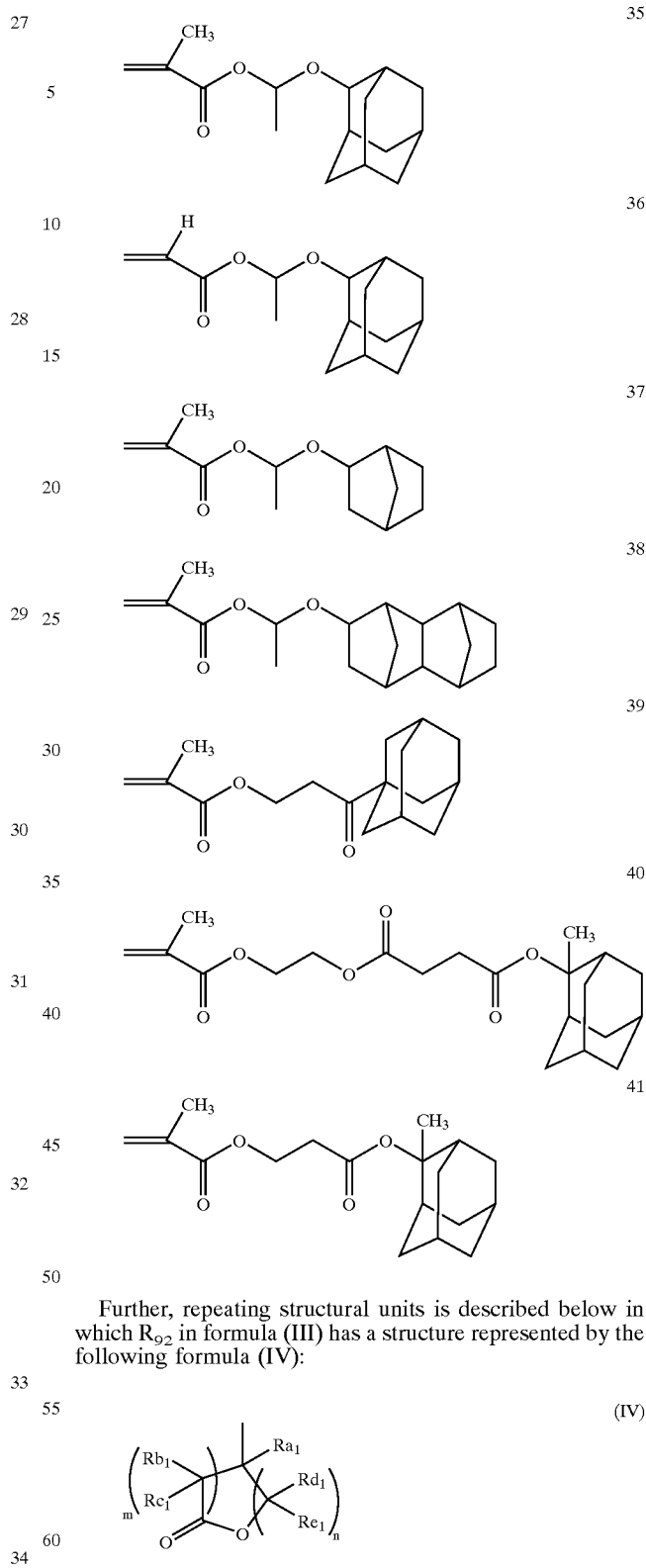

Further, repeating structural units is described below in which $R_{92}$ in formula (III) has a structure represented by the following formula (IV):

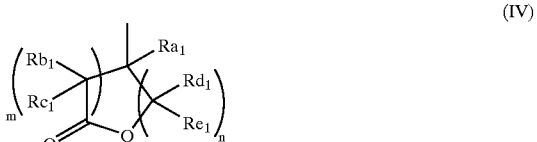

(IV)

$Ra_1$, $Rb_1$, $Rc_1$, $Rd_1$ and $Re_1$ each independently represents a hydrogen atom or an alkyl group having from 1 to 4 carbon atoms. m and n each independently represents an integer of from 0 to 3, and m+n is from 2 to 6.

The alkyl groups of 1 to 4 carbon atoms represented by $Ra_1$ to $Re_1$ include methyl, ethyl, propyl, isopropyl, n-butyl, isobutyl, sec-butyl and t-butyl. These alkoxyl groups may be substituted by a substituent group such as an alkoxyl group (preferably having from 1 to 4 carbon atoms).
Specific examples of the repeating structural units having the structure of formula (IV) are shown below, but are not limited thereto:
(IV-1)
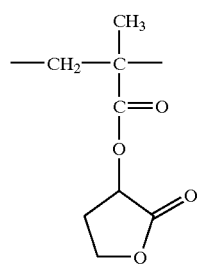
(IV-2)
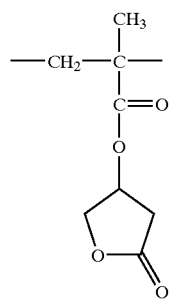
(IV-3)
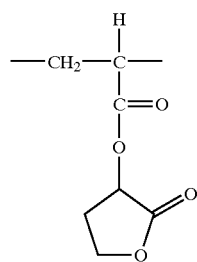
(IV-4)
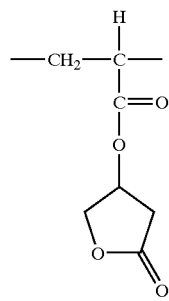
(IV-5)
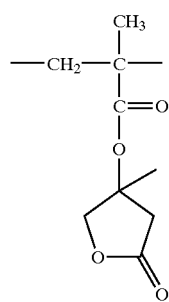
-continued
(IV-6)
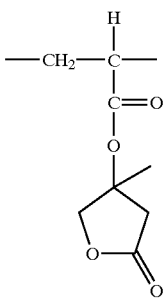
(IV-7)
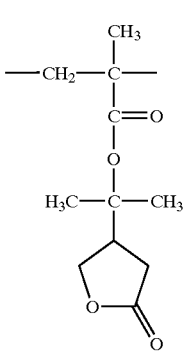
(IV-8)
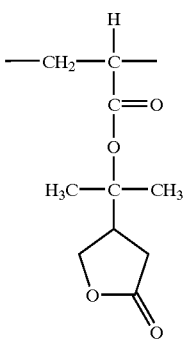
(IV-9)
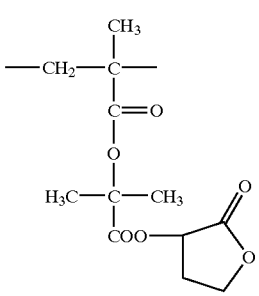
(IV-10)
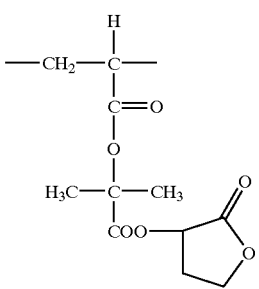

(IV-11) 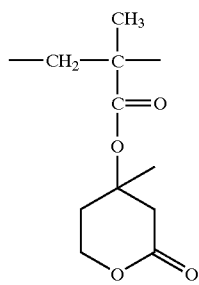
(IV-12) 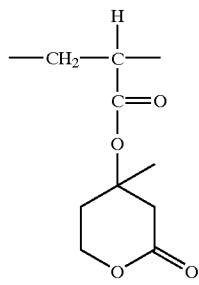
(IV-13) 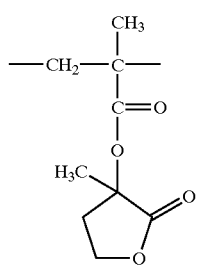
(IV-14) 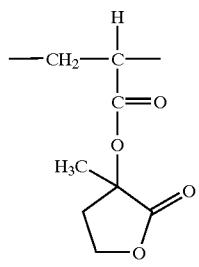
(IV-15) 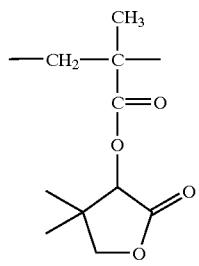
(IV-16) 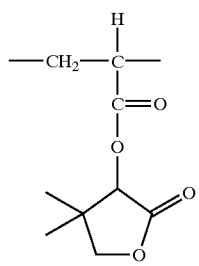
(IV-17) 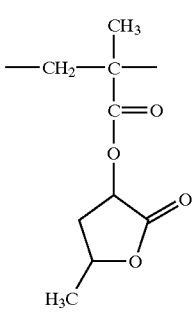
(IV-18) 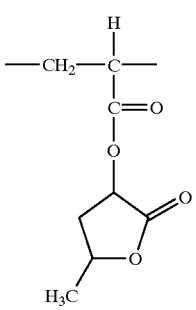
(IV-19) 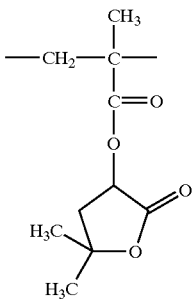
(IV-20) 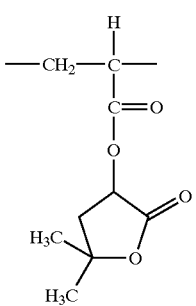
(IV-21) 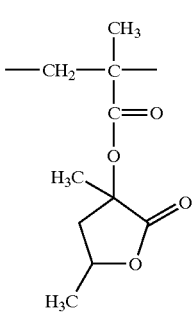

(IV-22) 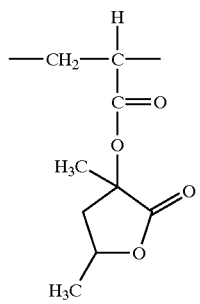
(IV-23) 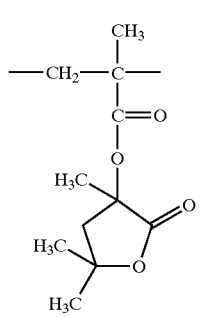
(IV-24) 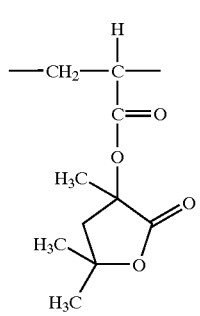
(IV-25) 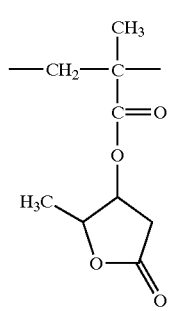
(IV-26) 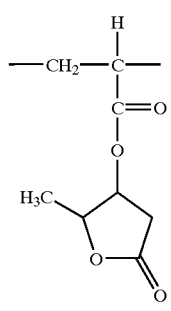
(IV-27) 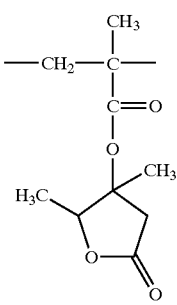
(IV-28) 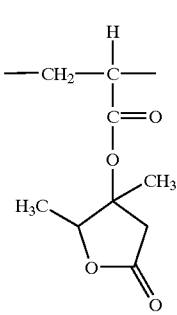
(IV-29) 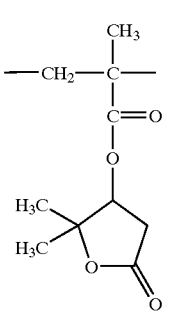
(IV-30) 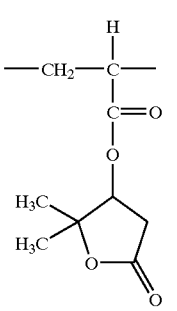
(IV-31) 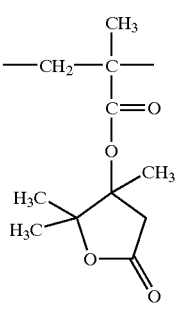

-continued

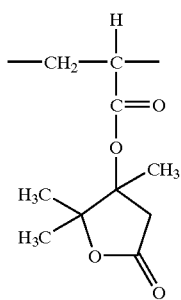
(IV-32)

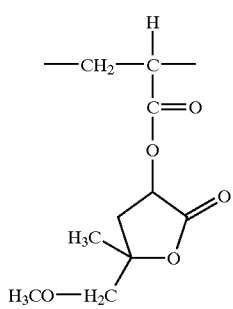
(IV-33)

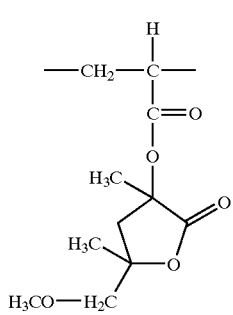
(IV-34)

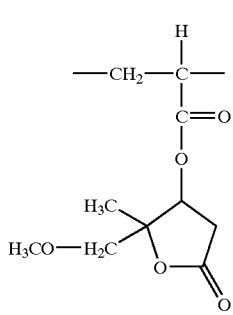
(IV-35)

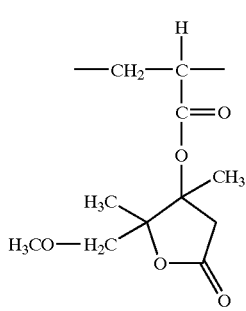
(IV-36)

Of the above-mentioned specific examples, the repeating structural units having the structure of formula (IV), (IV-17) to (IV-36) are preferred in view of the point that the exposure margin is more improved.

Further, the structure of formula (IV) is preferably an acrylate structure in that edge roughness is improved.

Still further, repeating unit structures having a group represented by any one of the following formulas (V-1) to (V-4) will be described.

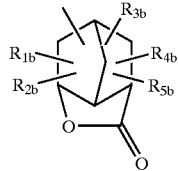
(V-1)

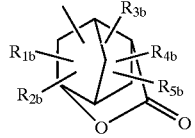
(V-2)

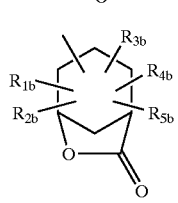
(V-3)

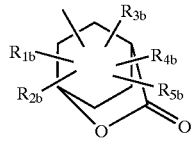
(V-4)

In formulas (V-1) to (V-4), $R_{1b}$ to $R_{5b}$ each independently represents a hydrogen atom, an alkyl group which may have a substituent group, a cycloalkyl group or an alkenyl group. Two of $R_{1b}$ to $R_{5b}$ may combine with each other to form a ring.

In formulas (V-1) to (V-4), the alkyl groups represented by $R_{1b}$ to $R_{5b}$ include a straight-chain or branched alkyl group, which may have a substituent group. The straight-chain or branched alkyl group is preferably a straight-chain or branched alkyl group having from 1 to 12 carbon atoms, more preferably a straight-chain or branched alkyl group having from 1 to 10 carbon atoms, and still more preferably methyl, ethyl, propyl, isopropyl, n-butyl, isobutyl, sec-butyl, t-butyl, pentyl, hexyl, heptyl, octyl, nonyl or decyl.

The cycloalkyl groups represented by $R_{1b}$ to $R_{5b}$ are preferably an alkenyl group having from 3 to 8 carbon atoms such as cyclopropyl, cyclopentyl, cyclohexyl, cycloheptyl or cyclooctyl.

The alkenyl groups represented by $R_{1b}$ to $R_{5b}$ are preferably an alkenyl group having from 2 to 6 carbon atoms such as vinyl, propenyl, butenyl or hexenyl.

Further, the rings formed by combining two of $R_{1b}$ to $R_{5b}$ with each other include 3- to 8-membered rings such as a cyclopropane ring, a cyclobutane ring, a cyclopentane ring, a cyclohexane ring, and cyclooctane ring.

The alkyl groups, the cycloalkyl groups and the alkenyl groups represented by $R_{1b}$ to $R_{5b}$ and the rings formed by combining two of $R_{1b}$ to $R_{5b}$ with each other may each have a substituent group. Preferred examples of the substituent groups include a hydroxyl group, a carboxyl group, a nitro group, a cyano group, a halogen atom (fluorine, chlorine, bromine or iodine), an alkoxyl group having from 1 to 4 carbon atoms, an alkoxycarbonyl group having from 2 to 5 carbon atoms, an acyl group having from 2 to 5 carbon atoms and an acyloxy group having from 2 to 5 carbon atoms.

$R_{1b}$ to $R_{5b}$ in formulas (V-1) to (V-4) may combine with any carbon atom constituting a cyclic skeleton.

Preferred examples of the repeating units having the groups represented by formulas (V-1) to (V-4) include repeating units represented by the following formula (AI):

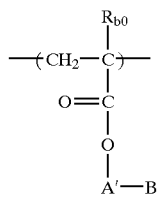

(AI)

In formula (AI), $R_{b0}$ represents a hydrogen atom, a halogen atom or an unsubstituted or substituted alkyl group having from 1 to 4 carbon atoms. The alkyl group represented by $R_{b0}$ may have a substituent group. Preferred examples of the substituent groups include the substituent groups exemplified above as the preferred ones which may be contained in the alkyl groups represented by $R_{1b}$ in the above-mentioned formulas (V-1) to (V-4).

The halogen atoms represented by $R_{b0}$ include fluorine, chlorine, bromine and iodine. $R_{b0}$ is preferably hydrogen.

$B_2$ represents a group indicated by any one of formulas (V-1) to (V-4).

A' has the same definition as given for B in formula (III). In A', the combined divalent groups include, for example, groups represented by the following formulas:

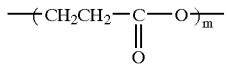

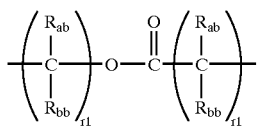

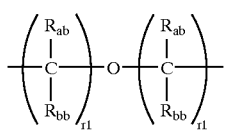

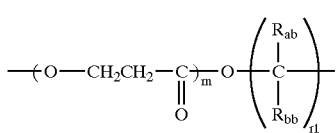

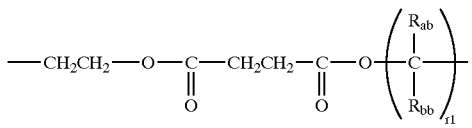

In the above-mentioned formulas, $R_{ab}$ and $R_{bb}$, which may be the same or different each represents a hydrogen atom, an alkyl group, a substituted alkyl group, a halogen atom, a hydroxyl group or an alkoxyl group.

The alkyl group is preferably a lower alkyl group such as methyl, ethyl, propyl, isopropyl or butyl, and more preferably selected from methyl, ethyl, propyl and isopropyl. Substituent groups of the substituted alkyl groups include a hydroxyl group, a halogen atom and an alkoxyl group having from 1 to 4 carbon atoms.

The alkoxyl groups include an alkoxyl group having from 1 to 4 carbon atoms such as methoxy, ethoxy, propoxy or butoxy.

The halogen atoms include chlorine, bromine, fluorine and iodine. r1 represents an integer of from 1 to 10, and preferably an integer of from 1 to 4. m represents an integer of from 1 to 3, and preferably 1 or 2.

Specific examples of the repeating units represented by formula (AI) are enumerated below, but the scope of the invention is not limited thereto:

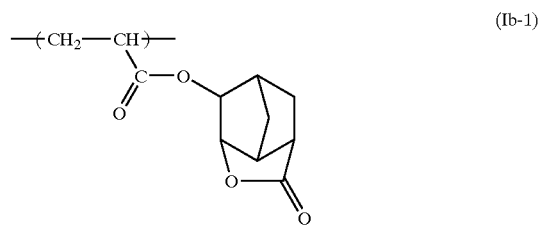

(Ib-1)

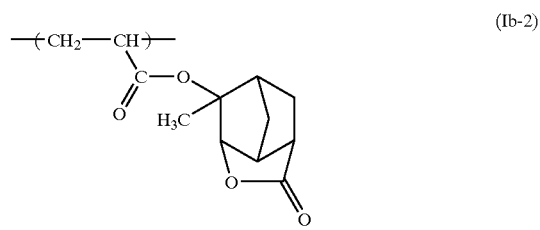

(Ib-2)

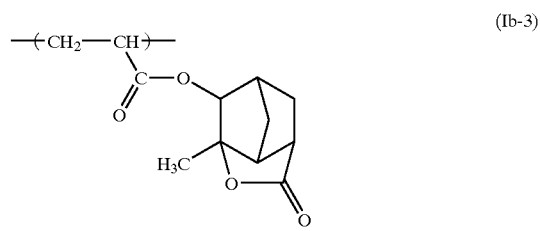

(Ib-3)

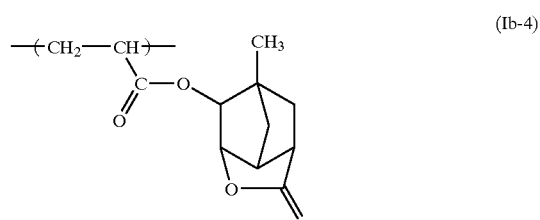

(Ib-4)

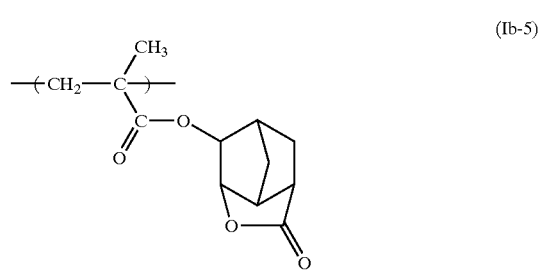

(Ib-5)

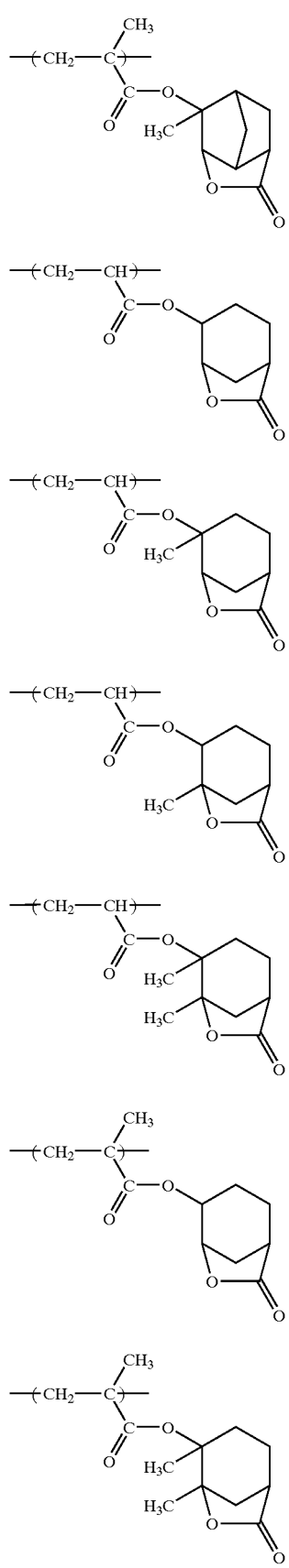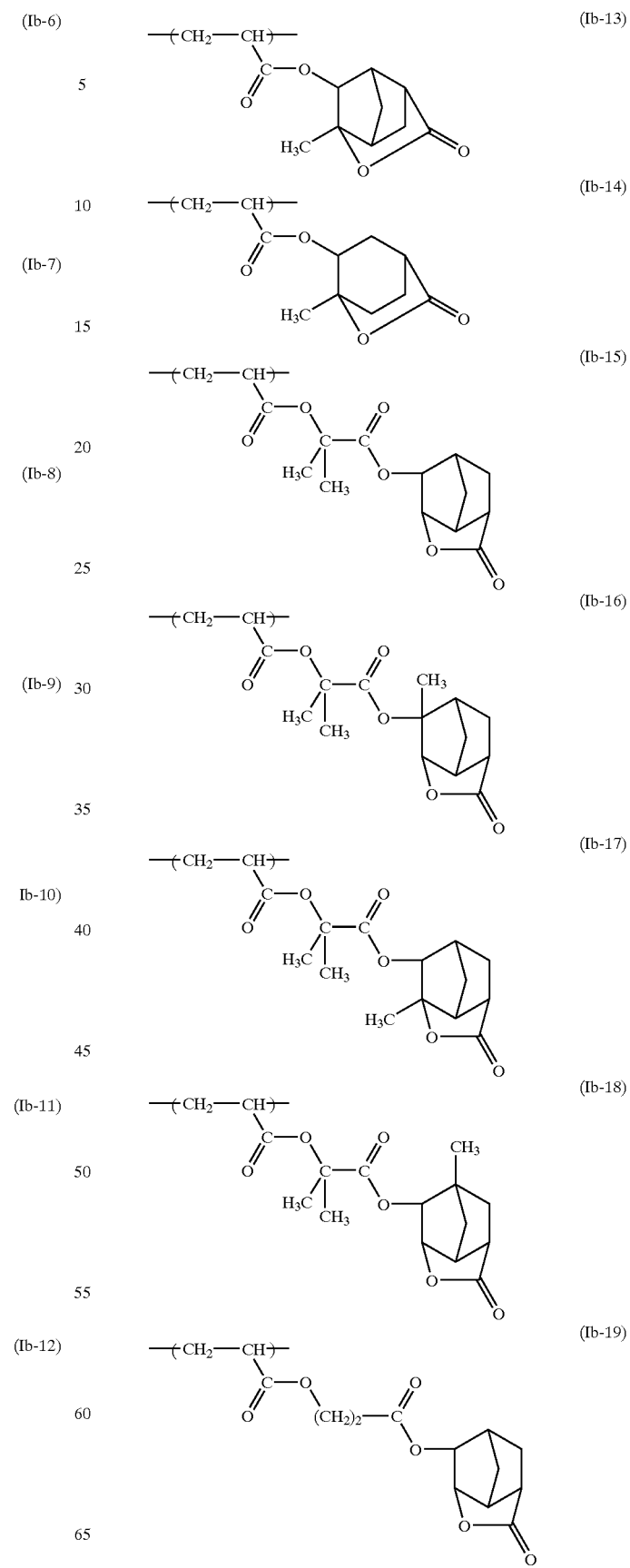

(Ib-20)
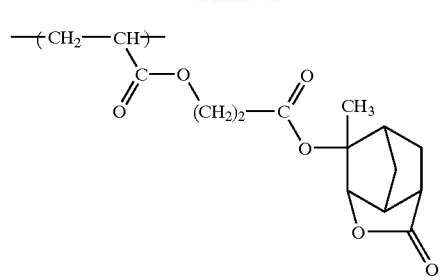
(Ib-21)
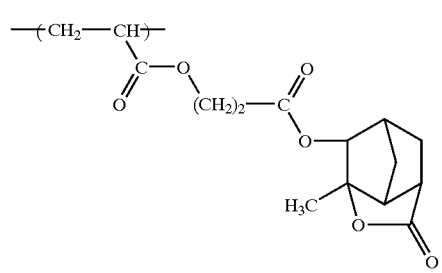
(Ib-22)
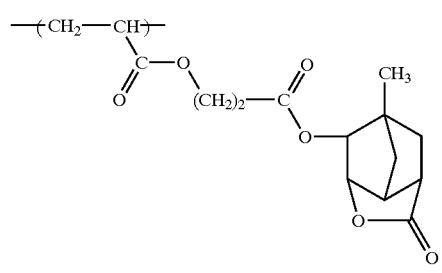
(Ib-23)
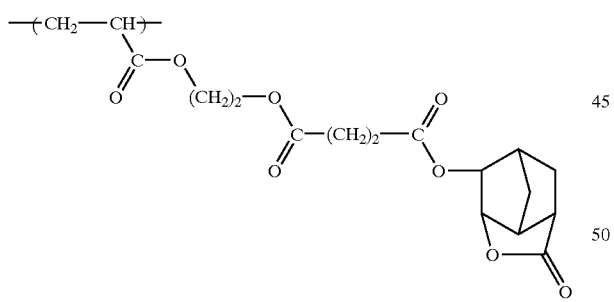
(Ib-24)
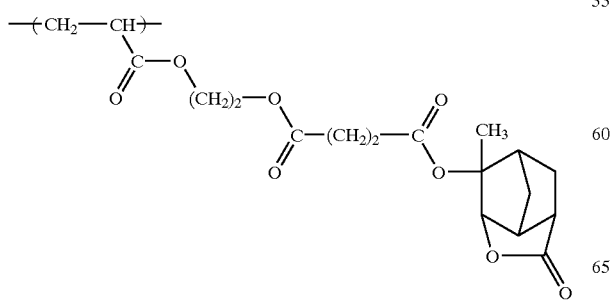
(Ib-25)
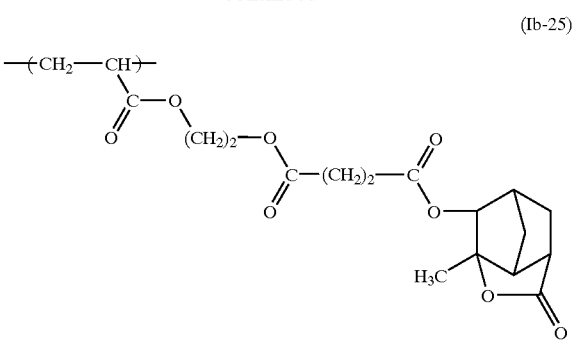
(Ib-26)
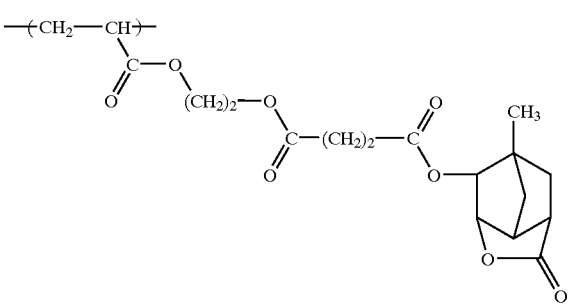
(Ib-27)
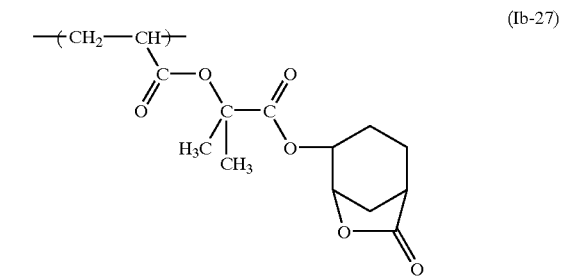
(Ib-28)
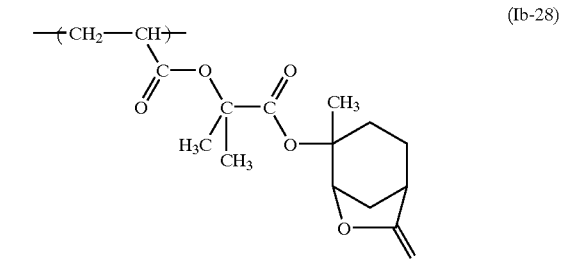
(Ib-29)
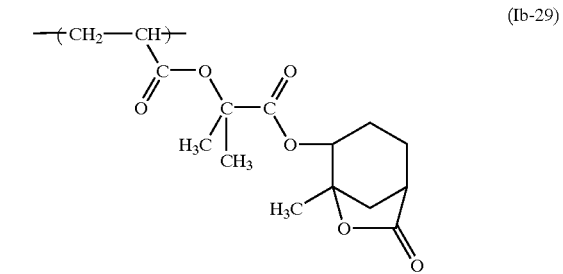

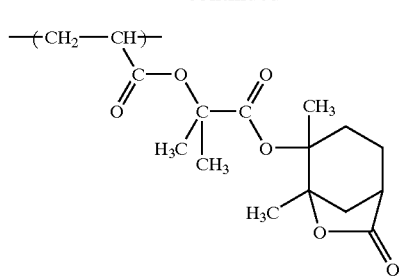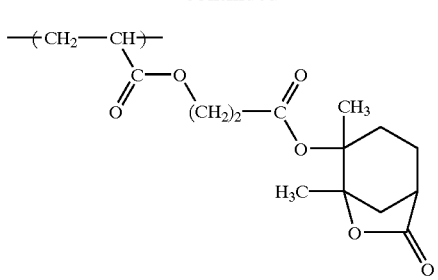

(Ib-41)
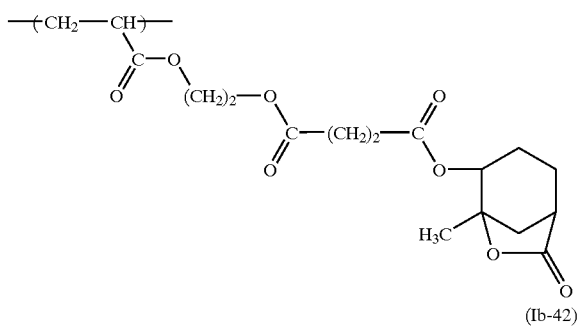

(Ib-42)
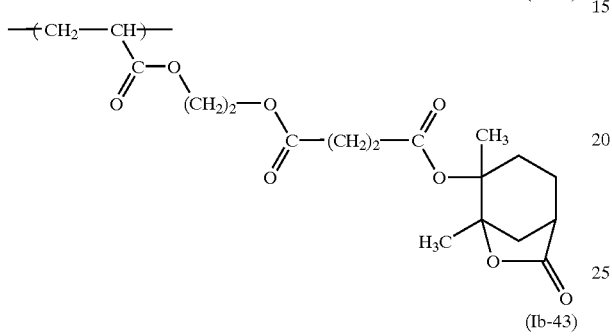

(Ib-43)
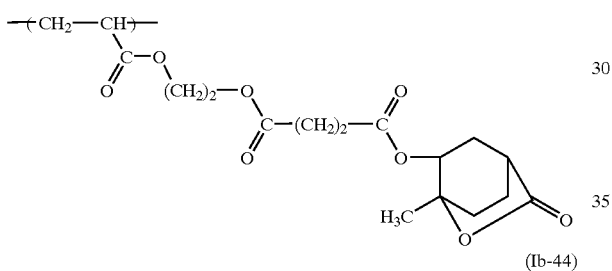

(Ib-44)
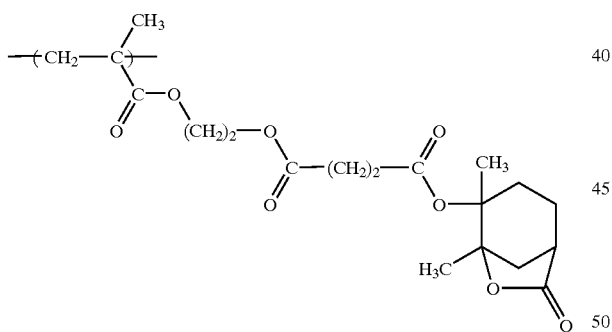

Then, repeating structural units having a structure represented by the following formula (VI) is described below:

(VI)
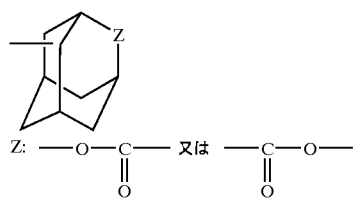

The bridge-containing alicyclic ring containing Z may have a substituent group. The substituent groups include, for example, a carboxyl group, a hydroxyl group, a halogen atom, an alkyl group (preferably having from 1 to 4 carbon atoms), an alkoxyl group (preferably having from 1 to 4 carbon atoms), an alkoxycarbonyl group (preferably having from 2 to 5 carbon atoms), an acyl group (for example, formyl or benzoyl), an acyloxy group (for example, propylcarbonyloxy or benzoyloxy) and an alkylsulfonylsulfamoyl group (such as $-CONHSO_2CH_3$). The alkyl group as the substituent group may further be substituted by a hydroxyl group, a halogen atom or an alkoxyl group (preferably having from 1 to 4 carbon atoms).

B in formula (III) may combine with a carbon atom constituting the bridge-containing alicyclic ring structure containing Z in formula (VI) at any position.

Specific examples of the repeating units having the structure represented by formula (VI) are exemplified below, but are not limited thereto:

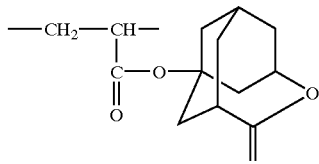

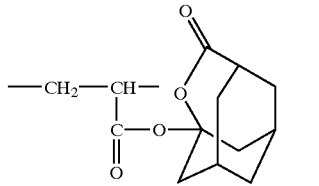

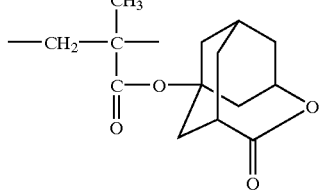

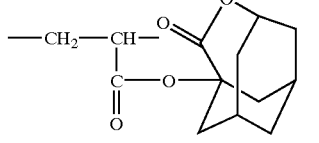

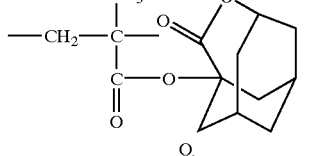

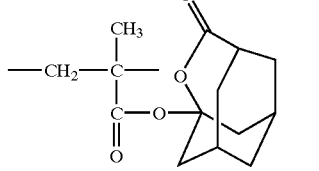

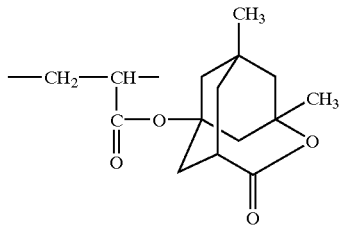

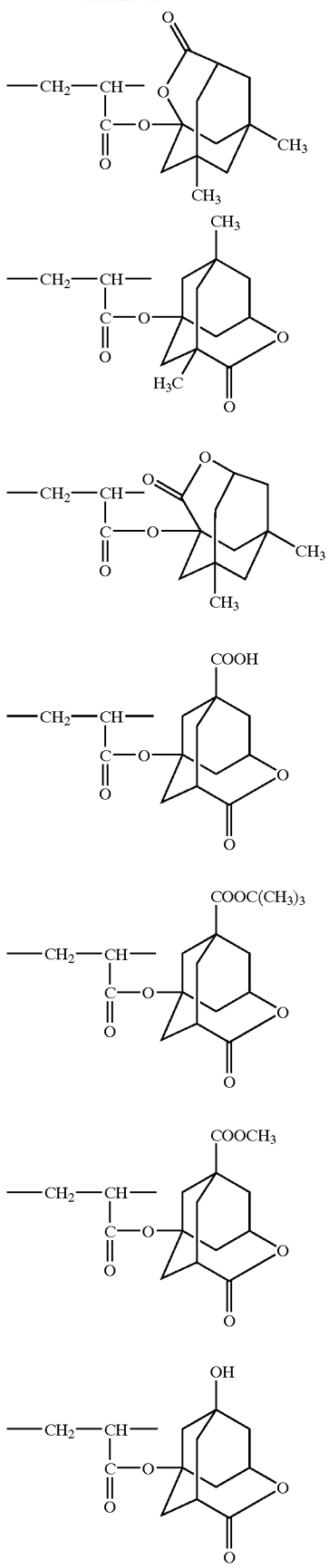

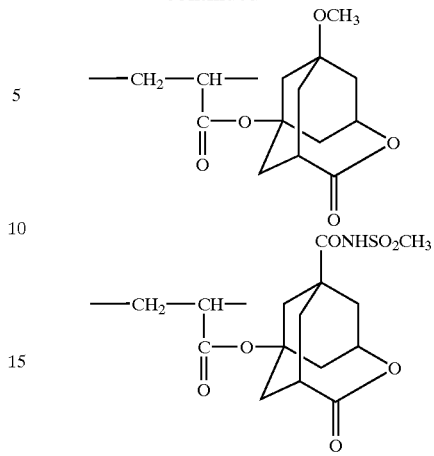

Further, repeating structural units will be described in which $R_{92}$ in formula (III) has a structure represented by the following formula (VII):

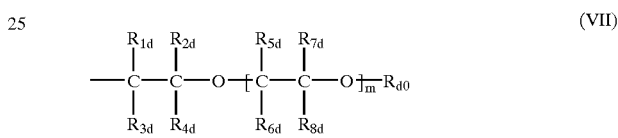

(VII)

In formula (VII), $R_{1d}$ to $R_{8d}$ each independently represents a hydrogen atom or a chain alkyl group.

$R_{d0}$ represents a hydrogen atom, a chain or cyclic alkyl group, an aryl group or an aralkyl group.

m represents an integer of from 1 to 10.

The chain alkyl groups represented by $R_{1d}$ to $R_{8d}$ and $R_{d0}$ in formula (VII) include a straight-chain, branched or cyclic alkyl group, which may have a substituent group. The straight-chain or branched alkyl group is preferably a straight-chain or branched alkyl group having from 1 to 12 carbon atoms, more preferably a straight-chain or branched alkyl group having from 1 to 10 carbon atoms, and still more preferably methyl, ethyl, propyl, isopropyl, n-butyl, isobutyl, sec-butyl, t-butyl, pentyl, hexyl, heptyl, octyl, nonyl or decyl.

The cyclic alkyl groups represented by $R_{d0}$ include a cyclic alkyl group having from 3 to 30 carbon atoms. Specific examples thereof include cyclopropyl, cyclopentyl, cyclohexyl, adamantyl, norbornyl, bornyl, tricyclodecanyl, dicyclopentenyl, norbornaneepoxy, menthyl, isomenthyl, neomenthyl, tetracyclododecanyl and a steroid residue.

The aryl groups represented by $R_{d0}$ include an aryl group having from 6 to 20 carbon atoms, which may have a substituent group. Specific examples thereof include phenyl, tolyl and naphthyl.

The aralkyl groups represented by $R_{d0}$ include an aralkyl group having from 7 to 20 carbon atoms, which may have a substituent group. Specific examples thereof include benzyl, phenetyl and cumyl.

In the invention, $R_{1d}$ to $R_{8d}$ are preferably a hydrogen atom or a methyl group. $R_{d0}$ is preferably a hydrogen atom or an alkyl group having from 1 to 4 carbon atoms. m is preferably from 1 to 6.

Further substituent groups of the above-mentioned chain or cyclic alkyl groups, aryl groups, aralkyl groups, alkylene groups, cyclic alkylene groups and arylene groups include a carboxyl group, a cyano group, a hydroxyl group, a halogen atom (for example, chlorine, bromine, fluorine or iodine), an alkyl group, a substituted alkyl group, an alkoxyl group (preferably having from 1 to 4 carbon atoms, for example, methoxy, ethoxy, propoxy or butoxy), an alkoxycarbonyl group, an acyl group, an acyloxy group (for example, acetoxy) and an acetylamido group. The alkyl groups include a lower alkyl group such as methyl, ethyl, propyl, isopropyl, butyl, cyclopropyl, cyclobutyl or cyclopentyl. Substituent groups of the substituted alkyl groups include a hydroxyl group, a halogen atom and an alkoxyl group (preferably having from 1 to 4 carbon atoms).

Specific examples of the repeating units having the structure represented by formula (VII) are exemplified below, but are not limited thereto:

Then, repeating structural units will be described in which $R_{92}$ in formula (III) has a structure represented by the following formula (VIII):

$$-N^+(R_{95})(R_{96})(R_{97})\cdot X^- \qquad \text{(VIII)}$$

In formula (VIII), $R_{95}$ to $R_{97}$ each independently represents a hydrogen atom, a chain or cyclic alkyl group, an alkenyl group, an aryl group or an aralkyl group. $R_{95}$ to $R_{97}$ may combine with each other to form a non-aromatic or aromatic ring.

The chain alkyl groups include a straight-chain or branched alkyl group, which may have a substituent group. Preferred is a straight-chain or branched alkyl group having from 1 to 12 carbon atoms, more preferred is a straight-chain or branched alkyl group having from 1 to 10 carbon atoms, and still more preferred is methyl, ethyl, propyl, isopropyl, n-butyl, isobutyl, sec-butyl, pentyl, neopentyl, hexyl, heptyl, octyl, nonyl or decyl.

The cyclic alkyl groups include a cyclic alkyl group having from 3 to 30 carbon atoms, which may contain a

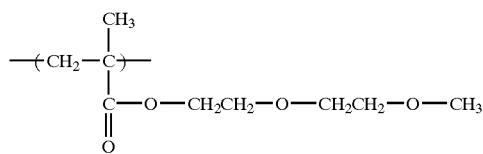
(i) (ii)

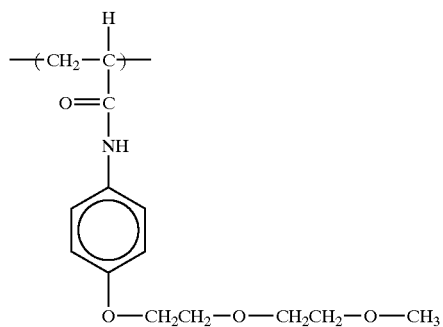
(vi) (vii)

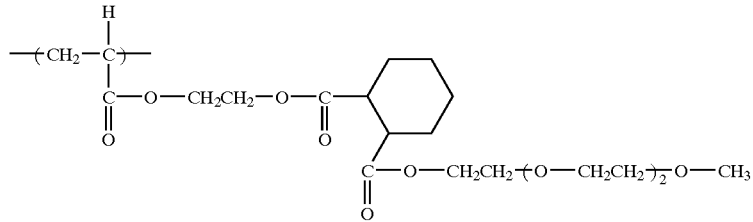
(viii)

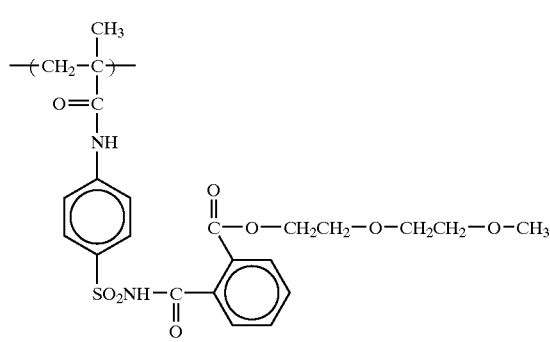
(ix) (x)

heteroatom such as an oxygen atom or a nitrogen atom. Specific examples thereof include cyclopropyl, cyclopentyl, cyclohexyl, adamantyl, norbornyl, bornyl, tricyclodecanyl, dicyclopentenyl, norbornaneepoxy, menthyl, isomenthyl, neomenthyl, tetracyclododecanyl, a steroid residue, tetrahydropyranyl and morpholino.

The alkenyl groups include an alkenyl group having from 2 to 6 carbon atoms, which may have a substituent group. Specific examples thereof include vinyl, propenyl, allyl, butenyl, pentenyl, hexenyl, cyclopentenyl, cyclohexenyl, 3-oxocyclohexenyl, 3-oxocyclopentenyl and 3-oxoindenyl. Of these, the cyclic alkenyl groups may each have an oxygen atom.

The aryl groups include an aryl group having from 6 to 10 carbon atoms, which may have a substituent group. Specific examples thereof include phenyl, tolyl and naphthyl.

The aralkyl groups include benzyl, phenetyl, naphthylmethyl, naphthylethyl and mesitylmethyl.

The substituent groups which may be contained in the chain or cyclic alkyl groups, alkenyl groups, aryl groups or aralkyl groups represented by $R_{95}$ to $R_{97}$, and the non-aromatic rings and aromatic rings which may be formed by combining $R_{95}$ to $R_{97}$ with each other include, for example, a carboxyl group, a cyano group, a hydroxyl group, a halogen atom (chlorine, bromine, fluorine or iodine), an alkoxyl group (preferably having from 1 to 4 carbon atoms, for example, methoxy, ethoxy, propoxy or butoxy), an acetylamido group, an alkoxycarbonyl group, an acyl group (preferably having from 2 to 10 carbon atoms, for example, formyl, acetyl or propionyl), an acyloxy group (preferably having from 2 to 10 carbon atoms, for example, acetoxy) and an aryl group (preferably having from 6 to 14 carbon atoms, for example, phenyl). The aryl groups or aralkyl groups represented by $R_{95}$ to $R_{97}$ and the non-aromatic rings and aromatic rings which may be formed by combining $R_{95}$ to $R_{97}$ with each other may further have an alkyl group (preferably having from 1 to 5 carbon atoms, for example, methyl, ethyl, propyl, isopropyl, butyl, cyclopropyl, cyclobutyl or cyclopentyl) as a substituent group. The alkyl group as a substituent group may further have a substituent group such as a hydroxyl group, a halogen atom or an alkoxyl group (preferably having from 1 to 4 carbon atoms, for example, methoxy, ethoxy, propoxy or butoxy).

$X^-$ has the specified structure $R-SO_3^-$ as described above.

The aliphatic hydrocarbon group represented by R is preferably a straight-chain or branched alkyl group having from 1 to 20 carbon atoms or a cyclic alkyl group, which may have a substituent group.

Further, the aromatic hydrocarbon group represented by R is preferably an aromatic group having from 6 to 14 carbon atoms, which may have a substituent group.

The alkyl groups represented by R include methyl, ethyl, propyl, n-butyl, n-pentyl, n-hexyl, n-octyl, 2-ethylhexyl, decyl and dodecyl which may have a substituent group, and the cyclic alkyls include cyclopentyl, cyclohexyl, cyclooctyl, cyclododecyl, adamantyl, norbornyl, camphor, tricyclodecanyl and menthyl which may have a substituent group.

The aromatic groups include phenyl and naphthyl which may have a substituent group.

The substituent groups which may be contained in the above-mentioned aliphatic hydrocarbon groups and aromatic hydrocarbon groups include, for example, a halogen atom, a hydroxyl group, an alkoxyl group, an alkoxycarbonyl group and a camphor group. Specific examples thereof include methyl, t-butyl, methoxy, ethoxy, t-butoxy, fluorine, chlorine, bromine, cyano, hydroxyl, methoxycarbonyl, ethoxycarbonyl, t-butoxycarbonyl and t-amyloxycarbonyl. Further, the substituent groups include an aryl group (preferably having from 6 to 14 carbon atoms for the aliphatic hydrocarbon groups, and an alkyl group (having from 1 to 15 carbon atoms) for the aromatic hydrocarbon groups.

Specific examples of the repeating units having the structure represented by formula (VIII) are shown below, but the scope of the invention is not limited thereto.

(1)
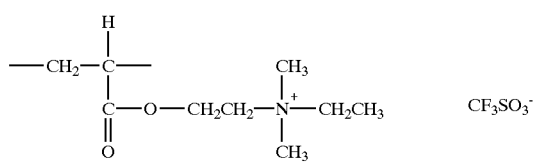

(2)]
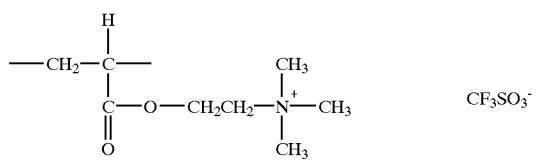

(3)
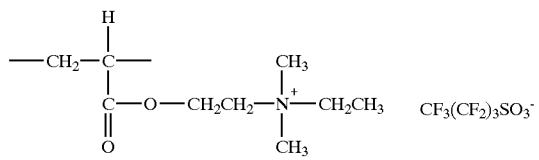

(4)
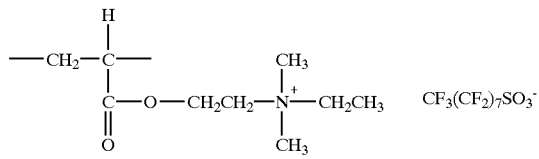

(5)
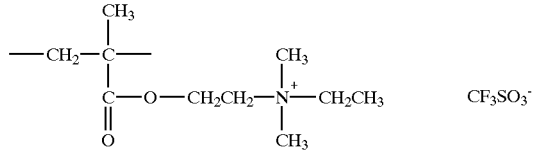

(6)
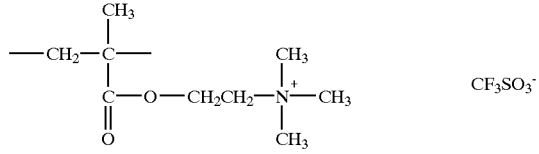

(7)
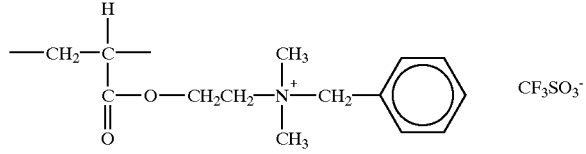

(8)
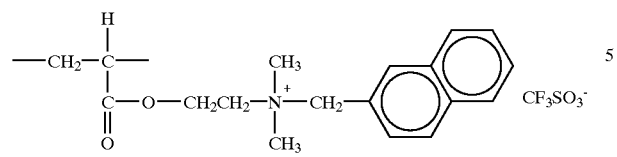
(9)
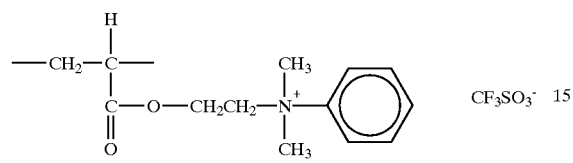
(10)
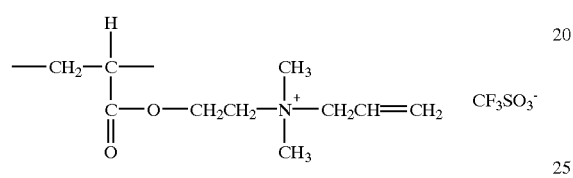
(11)
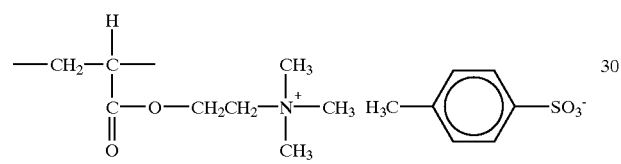
(12)
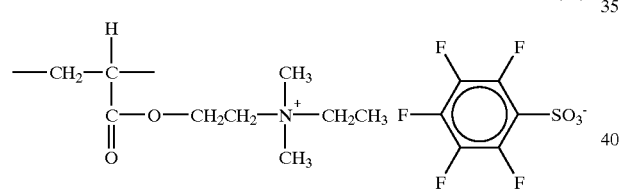
(13)
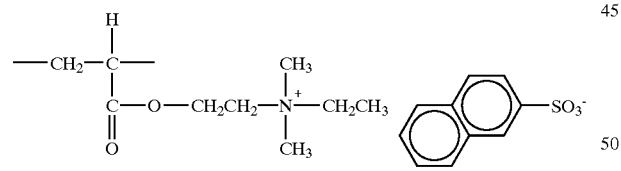
(14)
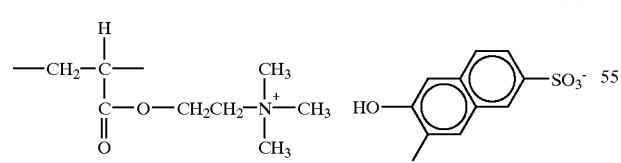
(15)
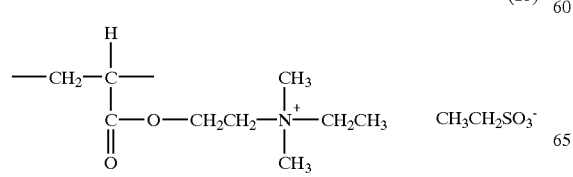
(16)
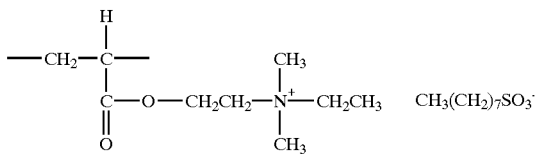
(17)
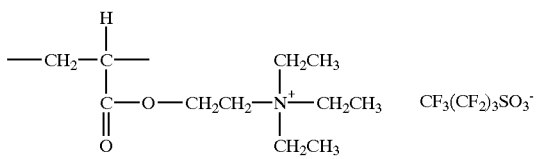
(18)
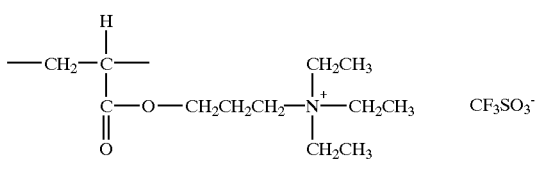
(19)
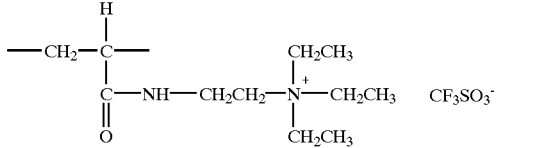
(20)
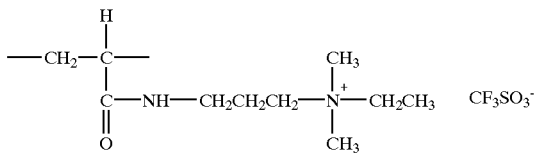
(21)
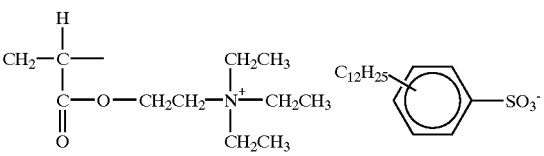
(22)
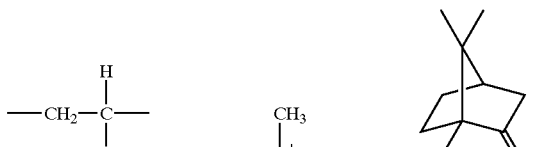
(23)
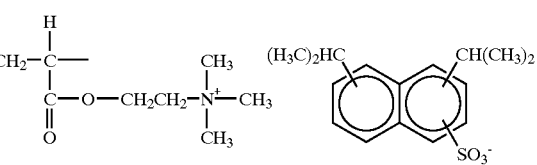

-continued

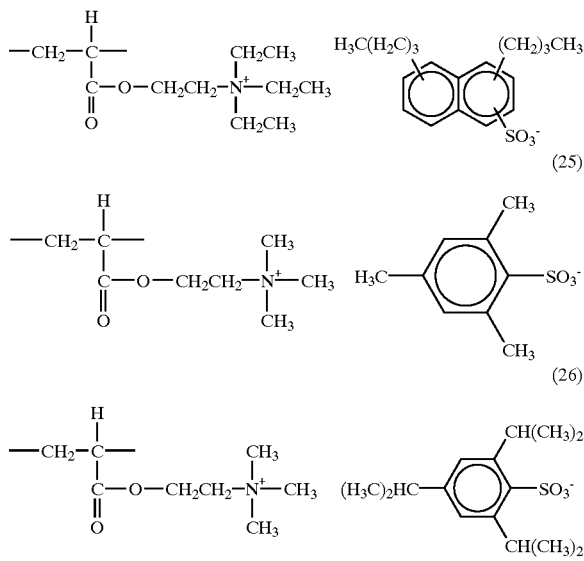

(24)

(25)

(26)

Further, repeating structural units will be described in which $R_{92}$ in formula (III) has a structure represented by the following formula (IX) or (X):

—$R_{98}$—$A_{50}$—$R_{99}$     (IX)

—$SO_3R_{100}$     (X)

In formula (IX), $R_{98}$ represents a single bond, an alkylene group, an arylene group or a divalent group which is a combination thereof.

The arylene groups include an arylene group having from 6 to 10 carbon atoms, which may have a substituent group. Specific examples thereof include phenylene, tolylene and naphthylene.

The alkylene groups include a group shown below:

—[C(Rf)(Rg)]r— wherein Rf and Rg, which may be the same or different, each represents a hydrogen atom, an alkyl group, a substituted alkyl group, a halogen atom, a hydroxyl group or an alkoxyl group. The alkyl group is preferably a lower alkyl group such as methyl, ethyl, propyl, isopropyl or butyl, and more preferably selected from the group consisting of methyl, ethyl, propyl and isopropyl. Substituted groups of the substituted alkyl groups include a hydroxyl group, a halogen atom and an alkoxyl group. The alkoxyl groups include an alkoxyl group having from 1 to 4 carbon atoms such as methoxy, ethoxy, propoxy or butoxy. r is an integer of from 1 to 10.

In the above, the halogen atoms include chlorine, bromine, fluorine and iodine.

$A_{50}$ represents any one of functional groups shown below:

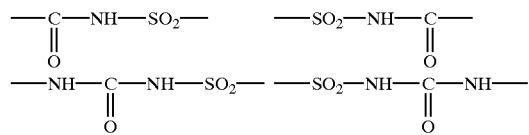

-continued

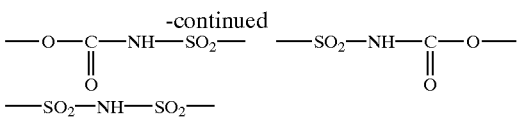

$R_{99}$ represents a hydrogen atom or an alkyl group.

The chain alkyl group represented by $R_{99}$ may be either straight-chain or branched, and may have a substituent group. The straight-chain or branched alkyl group is preferably a straight-chain or branched alkyl group having from 1 to 12 carbon atoms, and more preferably a straight-chain or branched alkyl group having from 1 to 10 carbon atoms. Preferred specific examples thereof include methyl, ethyl, propyl, isopropyl, n-butyl, isobutyl, sec-butyl, t-butyl, pentyl, hexyl, heptyl, octyl, nonyl and decyl.

$R_{100}$ in formula (X) represents a straight-chain or branched alkyl group, an aryl group or an aralkyl group, which may have a substituent group.

The chain alkyl group represented by $R_{100}$ may be either straight-chain or branched, and may have a substituent group. The straight-chain or branched alkyl group is preferably a straight-chain or branched alkyl group having from 1 to 12 carbon atoms, and more preferably a straight-chain or branched alkyl group having from 1 to 10 carbon atoms. Preferred specific examples thereof include methyl, ethyl, propyl, isopropyl, n-butyl, isobutyl, sec-butyl, t-butyl, pentyl, hexyl, heptyl, octyl, nonyl and decyl.

The cyclic alkyl groups represented by $R_{100}$ include a cyclic alkyl group having from 3 to 30 carbon atoms. Specific examples thereof include cyclopropyl, cyclopentyl, cyclohexyl, adamantyl, norbornyl, bornyl, tricyclodecanyl, dicyclopentenyl, norbornaneepoxy, menthyl, isomenthyl, neomenthyl, tetracyclododecanyl and a steroid residue. The ring structure may have a heteroatom or a double bond. Such examples include a tetrahydropyran ring and a pentene ring.

The aryl groups represented by $R_{100}$ include an aryl group having from 6 to 20 carbon atoms, which may have a substituent group. Specific examples thereof include phenyl, tolyl and naphthyl.

The aralkyl groups represented by $R_{100}$ include an aralkyl group having from 7 to 20 carbon atoms, which may have a substituent group. Specific examples thereof include benzyl, phenetyl and cumyl.

The substituent groups which may be contained in the chain alkyl groups represented by $R_{99}$ and the chain or cyclic alkyl groups, alkoxyl groups, aryl groups or aralkyl groups represented by $R_{100}$ include, for example, a carboxyl group, a cyano group, a hydroxyl group, a halogen atom (chlorine, bromine, fluorine or iodine), an alkoxyl group (preferably having from 1 to 4 carbon atoms, for example, methoxy, ethoxy, propoxy or butoxy), an acetylamido group, an alkoxycarbonyl group, an acyl group (preferably having from 2 to 10 carbon atoms, for example, formyl, acetyl or propionyl), an acyloxy group (preferably having from 2 to 10 carbon atoms, for example, acetoxy) and an aryl group (preferably having from 6 to 14 carbon atoms, for example, phenyl). The aryl groups or aralkyl groups represented by $R_{100}$ may further have an alkyl group (preferably having from 1 to 5 carbon atoms, for example, methyl, ethyl, propyl, isopropyl, butyl, cyclopropyl, cyclobutyl or cyclopentyl) as a substituent group. The alkyl group as a substituent group may further have a substituent group such as a hydroxyl group, a halogen atom or an alkoxyl group (preferably having from 1 to 4 carbon atoms, for example, methoxy, ethoxy, propoxy or butoxy). The ring structure may form a condensed ring.

Specific examples (2) to (5) of monomers corresponding to the —NH—SO$_2$—-containing repeating units represented by formula (III), and specific examples (6) to (15) of monomers corresponding to the repeating structural units having the structure represented by formula (IX) are shown below, but are not limited thereto.

(2)
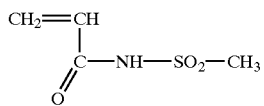

(3)
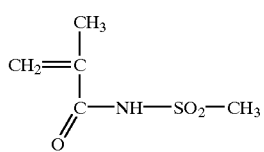

(4)
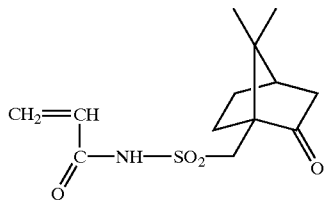

(5)
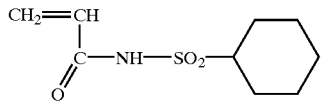

(6)
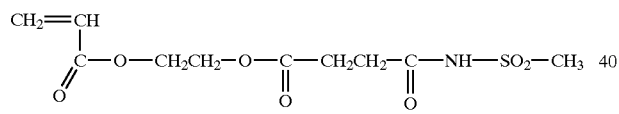

(7)
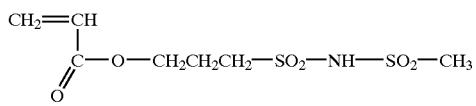

(8)
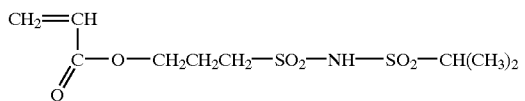

(9)
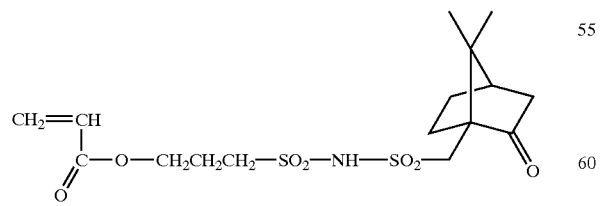

(10)
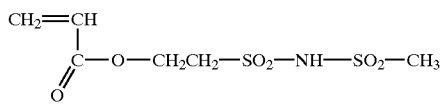

(11)
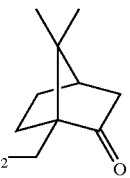

(12)
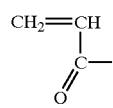

(13)
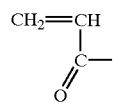

(14)
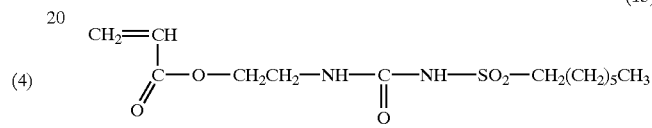

(15)

Specific examples of monomers corresponding to the repeating structural units having the structure represented by formula (X) are shown below, but are not limited thereto:

(1)
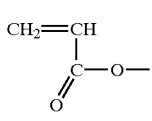

(2)
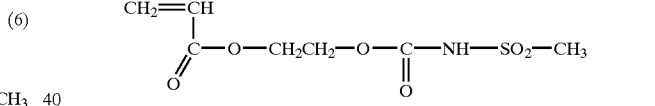

(3)
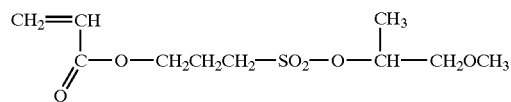

(4)
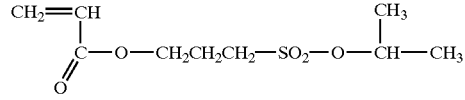

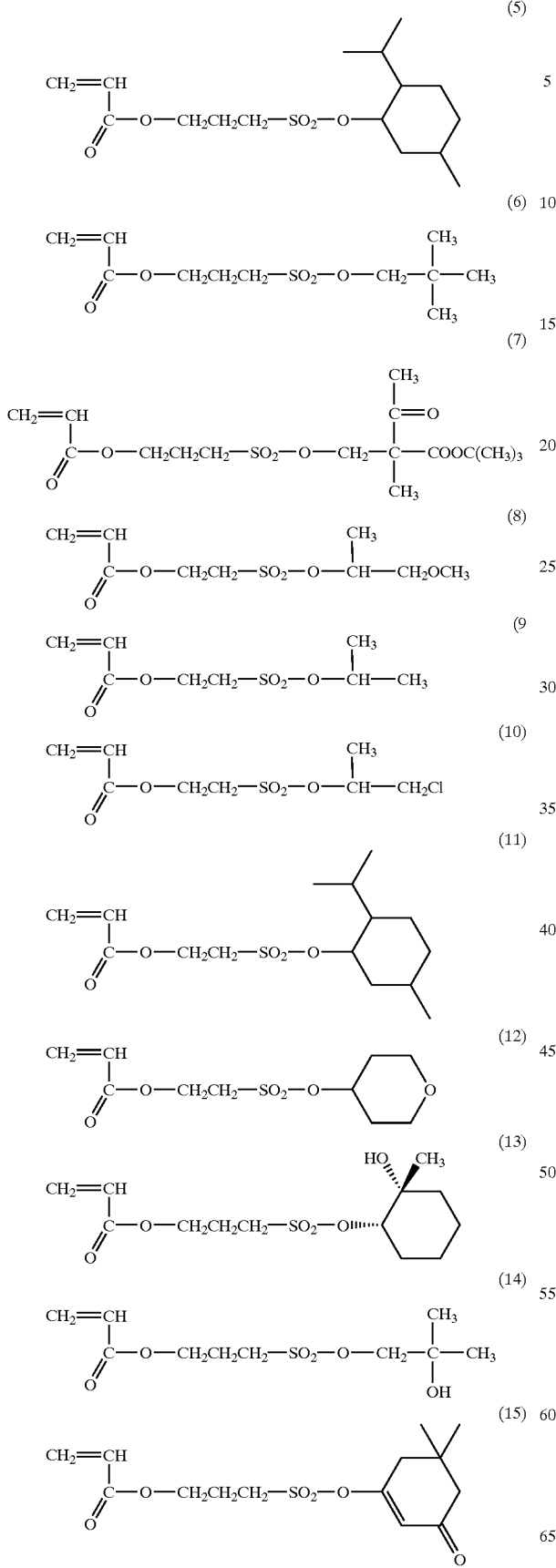

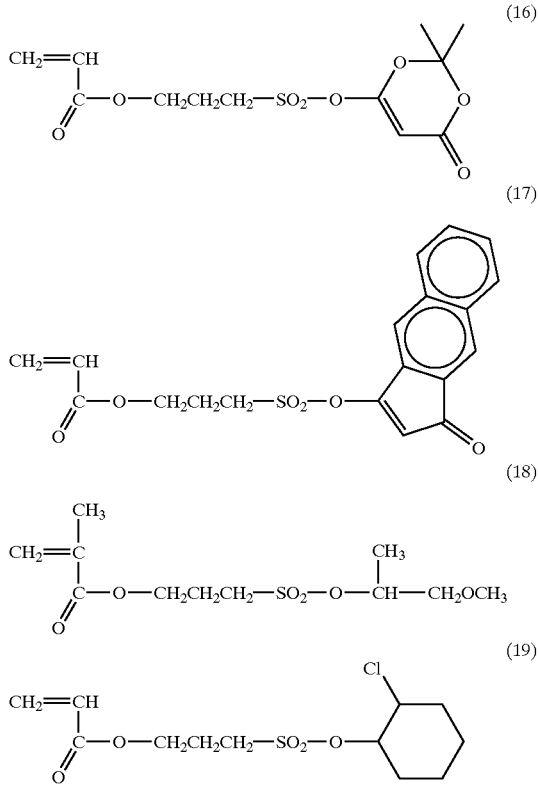

The acid-decomposable resins used in the (present) invention can also further contain repeating units represented by the following formula (XI):

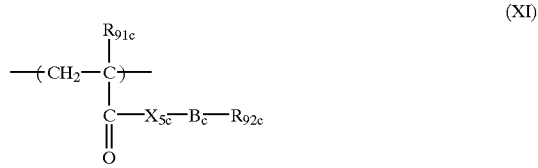

Referring to formula (XI), $R_{91}c$, $X_5c$, $R_{93}c$ and Bc each has the same meaning as given for $R_{91}$, $X_5$, $R_{93}$ and B in the above-mentioned formula (III).

$R_{92}c$ represents a group represented by the following formula (XI').

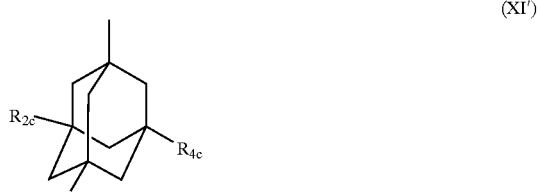

In formula (XI'), $R_2c$ to $R_4c$ each independently represents a hydrogen atom or a hydroxyl group, with the proviso that at least one of $R_2c$ to $R_4c$ represents a hydroxyl group.

The structure represented by formula (XI) is preferably a dihydroxyl form or a monohydroxyl form, and more preferably a dihydroxyl form.

Specific examples of the repeating units having the structure represented by formula (XI) are shown below, but are not limited thereto:

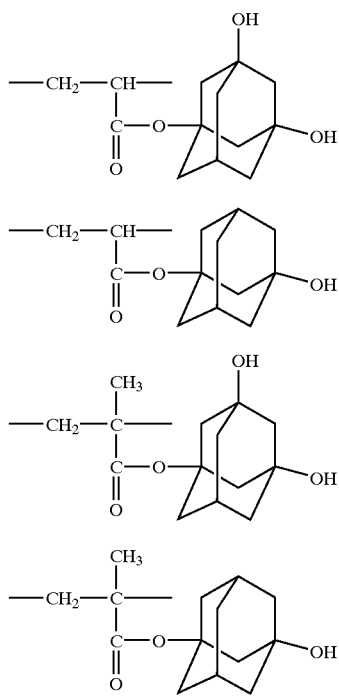

In the resin used in the invention, the structure of the acid-decomposable group is represented, for example, by —C(=O)—X₁—R₀, wherein R₀ represents a tertiary alkyl group such as t-butyl or t-amyl, a 1-alkoxyethyl group such as isobornyl, 1-ethoxyethyl, 1-butoxyethyl, 1-isobutoxyethyl or 1-cyclohexyloxyethyl, an alkoxymethyl group such as 1-methoxymethyl or 1-ethoxymethyl, 3-oxoalkyl group, a tetrahydropyranyl group, a tetrahydrofuranyl group, a trialkylsilyl ester group, a 3-oxocyclohexyl ester group, a 2-methyl-2-adamantyl group or a mevalonic lactone residue; and $X_1$ represents an oxygen atom, a sulfur atom, —NH—, —NHSO₂— or —NHSO₂NH—.

In the resin used in the invention, more preferred is an acid-decomposable group indicated by the following formula (a), and particularly preferred is an acid-decomposable group indicated by the following formula (b):

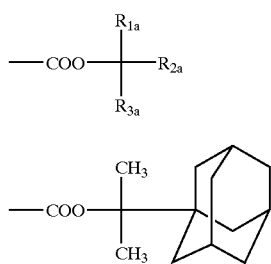

In the above-mentioned structure, $R_{1a}$ to $R_{3a}$ each independently represents an alkyl group such as methyl, ethyl, propyl, butyl, cyclohexyl or adamantyl.

Monomers having such acid-decomposable groups include, for example, 5, 6, 7, 8, 9, 10, 27, 28 and 29 described above as the monomers corresponding to the repeating structural units indicated by formula (III). Further, repeating structural units having such acid-decomposable groups include, for example, II-6 to II-8, II-11, II-12, II-16 to II-19, II-21, II-23 to II-26, II-29, II-30, II-41, II-46, II-50 to II-52, II-58, II-61, II-81, II-113, II-167 and II-169 to II-171 described above as the repeating structural units represented by formulas (II-A) and (II-B).

In the resin used in the invention, the acid-decomposable group can be contained in at least one of the repeating structural units having the partial structure containing the alicyclic hydrocarbon represented by the above-mentioned formula (I), the repeating structural units represented by formula (III) and repeating units of copolymerizable components described later.

The acid-decomposable resin, component (A), can contain various repeating structural units, in addition to the above-mentioned repeating structural units, for controlling dry etching resistance, standard developing solution suitability, substrate adhesion, resist profiles, and further resolving power, heat resistance and sensitivity which are characteristics generally necessary for resists.

Such repeating structural units include but are not limited to repeating structural units corresponding to the following monomers. This makes it possible to perform fine adjustments of performances required for the acid—decomposable reins, particularly, (1) Solubility in coating solvents;
(2) Film forming properties (glass transition point);
(3) Alkali developing properties;
(4) Film decrease (hydrophilicity and hydrophobicity, selection of alkali-soluble groups);
(5) Adhesion of unexposed areas to substrates; and
(6) Dry etching resistance.

Such monomers include, for example, a compound having one addition-polymerizable unsaturated bond selected from an acrylic acid ester, a methacrylic acid ester, an acrylamide, a methacrylamide, an allyl compound, a vinyl ether and a vinyl ester.

Specific examples thereof include the following monomers:

Acrylic acid esters (preferably alkyl acrylates wherein the alkyl groups each has from 1 to 10 carbon atoms):

Methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate.

Methacrylic acid esters (preferably alkyl methacrylates wherein the alkyl groups each has from 1 to 10 carbon atoms)

Methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Acrylamides

Acrylamide, N-alkylacrylamides (the alkyl groups each has from 1 to 10 carbon atoms, for example, methyl, ethyl, propyl, butyl, t-butyl, heptyl, octyl, cyclohexyl and hydroxyethyl), N,N-dialkylacrylamides (the alkyl groups each has from 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Methacrylamides

Methacrylamide, N-alkylmethacrylamides (the alkyl groups each has from 1 to 10 carbon atoms, for example, methyl, ethyl, t-butyl, ethylhexyl, hydroxyethyl and cyclohexyl) N,N-dialkylmethacrylamides (the alkyl groups include ethyl, propyl and butyl) and N-hydroxyethyl-N-methylacrylamide.

Allyl Compounds

Allyl esters (for example, allyl acetate, allyl caproate, allyl caprylate, allyl laurate, allyl palmitate, allyl stearate, allyl benzoate, allyl acetoacetate and allyl lactate) and allyloxyethanol.

Vinyl Ethers

Alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether).

Vinyl Eaters

Vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate and vinyl cyclohexylcarboxylate.

Dialkyl Itaconate

Dimethyl itaconate, diethyl itaconate and dibutyl itaconate.

Dialkyl or Monoalkyl Esters of Fumaric Acid:

Dibutyl fumarate.

Others

Crotonic acid, itaconic acid, maleic anhydride, maleimide, acrylonitrile, methacrylonitrile and maleylonitrile.

Besides, addition-polymerizable unsaturated compounds may be copolymerized, as long as they are copolymerizable with monomers corresponding to the above-mentioned various repeating structural units.

In the acid-decomposable resin, the molar ratio of the respective repeating structural units contained is appropriately established for controlling dry etching resistance, standard developing solution suitability, substrate adhesion, resist profiles, and further resolving power, heat resistance and sensitivity which are characteristics generally necessary for resists.

In the acid-decomposable resin, the content of the repeating units represented by formula (I) is preferably from 10 mol % to 60 mol %, more preferably from 15 mol % to 55 mol %, and still more preferably from 20 mol % to 50 mol %, based on the total repeating structural units.

In the acid-decomposable resin, the content of the repeating units represented by formula (II) is preferably from 10 mol % to 70 mol %, more preferably from 15 mol % to 60 mol %, and still more preferably from 20 mol % to 50 mol %, based on the total repeating structural units.

In the acid-decomposable resin, the content of the repeating units represented by formula (III) is preferably from 2 mol % to 80 mol %, more preferably from 4 mol % to 70 mol %, and still more preferably from 6 mol % to 60 mol %, based on the total repeating structural units.

The content of the repeating units having the acid-decomposable group, including the case that the repeating units represented by formula (I) or (III) has the acid-decomposable group, is preferably from 15 mol % to 90 mol %, more preferably from 15 mol % to 85 mol %, and still more preferably from 20 mol % to 80 mol %, The acid-decomposable resins used in the invention can be synthesized by usual methods (for example, radical polymerization). For example, according to a general synthesis method, monomer species are placed in a reaction vessel collectively or during the reaction, and dissolved in a reaction solvent, for example, an ether such as tetrahydrofuran, 1,4-dioxane or dinsopropyl ether, a ketone such as methyl ethyl ketone or methyl isobutyl ketone, an ester solvent such as ethyl acetate, or a solvent dissolving the composition of the invention such as propylene glycol monomethyl ether acetate described later, as needed, to homogenize them. Then, polymerization is initiated in an atmosphere of an inert gas such as nitrogen or argon by heating as needed and by using a commercially available radical initiator (such as an azo initiator or a peroxide). The initiator may be added additionally or in parts as desired. After the reaction is completed, the reaction product is poured into a solvent to recover a desired polymer by powder or solid recovery. The reaction concentration is 20% by weight or more, preferably 30% by weight or more, and more preferably 40% by weight or more. The reaction temperature is from 10° C. to 150° C., preferably from 30° C. to 120° C., and more preferably from 50° C. to 100° C.

The weight average molecular weight of the resin used in the invention is preferably from 1,000 to 200,000, as a value measured by the GPC method and converted to that of polystyrene. When the weight average molecular weight is less than 1,000, deterioration of heat resistance or dry etching resistance is unfavorably observed. On the other hand, exceeding 200,000 unfavorably results in deterioration of developing properties or deterioration of film forming properties because of its extremely increased viscosity.

When the composition of the invention is used for ArF exposure, it is preferred that the resin has no aromatic ring from the viewpoint of transparency to ArF light.

In the positive-working photoresist composition for far ultraviolet exposure of the invention, the amount of all resins used in the invention compounded in the whole composition is preferably from 40% to 99.99% by weight, and more preferably from 50% to 99.97% by weight, based on the total resist solid content.

[1'] Another embodiment of the resin enhanced in the dissolution rate in an alkaline developing solution by an action of an acid (acid-decomposable resin) (A) used in the (present) invention will be shown below.

As the acid-decomposable resin (A) used in the invention, there is used a resin having an aliphatic cyclic hydrocarbon group, enhanced in the dissolution rate in an alkaline developing solution by an action of an acid, and containing at least one of repeating units having a partial structure containing an alicyclic hydrocarbon represented by any one of the above-mentioned formulas (pI) to (pVI).

In formulas (pI) to (pVI), the alkyl groups represented by $R_{12}$ to $R_{25}$, which may be either substituted or unsubstituted, indicate a straight-chain or branched alkyl group having from 1 to 4 carbon atoms. The alkyl groups include, for example, methyl, ethyl, n-propyl, isopropyl, n-butyl, isobutyl, sec-butyl and t-butyl.

Further substituent groups of the above-mentioned alkyl groups include an alkoxyl group having 1 to 4 carbon atoms, a halogen atom (fluorine, chlorine, bromine or iodine), an acyl group, an acyloxy group, a cyano group, a hydroxyl group, a carboxyl group, an alkoxycarbonyl group and a nitro group.

The alicyclic hydrocarbon groups represented by $R_{11}$ to $R_{25}$ or the alicyclic hydrocarbon groups each formed by Z and a carbon atom may be either monocyclic or polycyclic. Specific examples thereof include a group having a monocyclic, bicyclic, tricyclic or tetracyclic structure of 5 or more carbon atoms. The carbon number thereof is preferably from 6 to 30, and particularly preferably from 7 to 25. These alicyclic hydrocarbon groups may have a substituent group.

Of the alicyclic hydrocarbon groups, structure examples of alicyclic moieties are shown below:

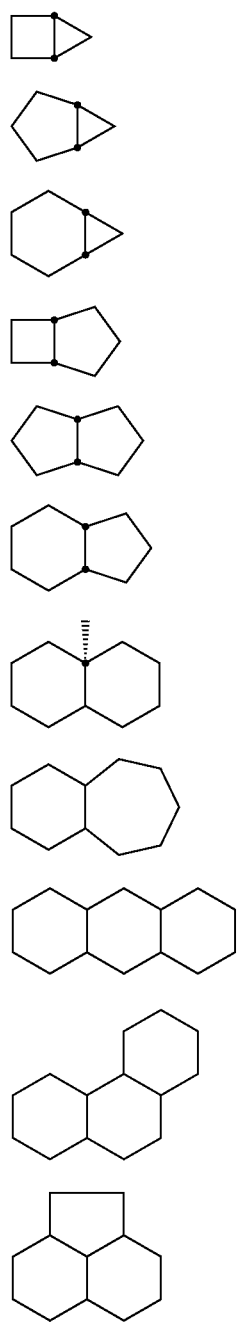

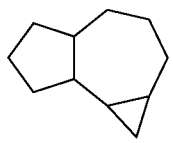

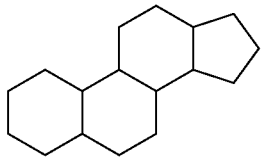

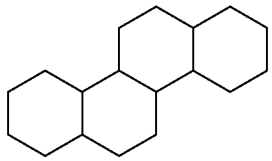

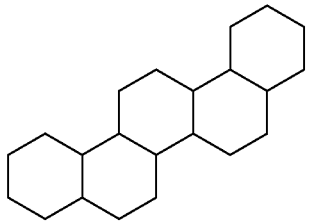

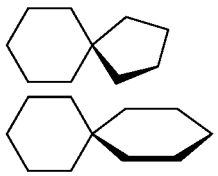

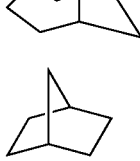

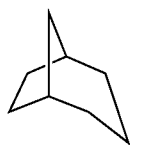 (24)
 (25)
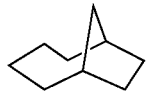 (26)
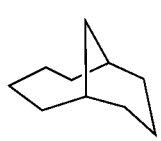 (27)
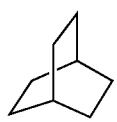 (28)
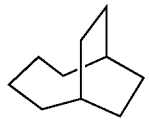 (29)
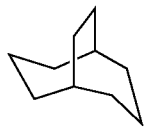 (30)
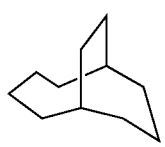 (31)
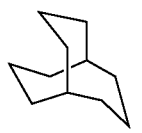 (32)
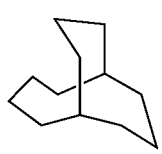 (33)
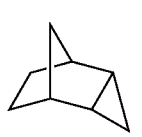 (34)
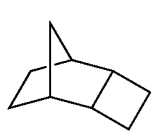 (35)
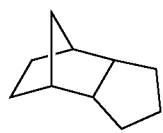 (36)
 (37)
 (38)
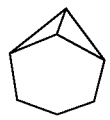 (39)
 (40)
 (41)
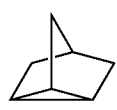 (42)
 (43)
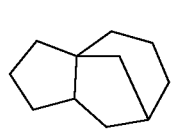 (44)
 (45)
 (46)
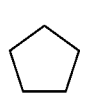 (47)
 (48)

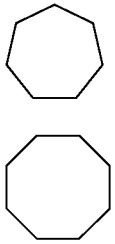

In the invention, preferred examples of the above-mentioned alicyclic moieties include an adamantly group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. More preferred are an adamantly group, a decalin residue, a norbornyl group, a cedrol group, a cyclohexyl group, a cycloheptyl group, a cyclooctyl group, a cyclodecanyl group and a cyclododecanyl group.

Substituent groups of these alicyclic hydrocarbon groups include an alkyl group, a substituted alkyl group, a halogen atom, a hydroxyl group, an alkoxyl group, a carboxyl group and an alkoxycarbonyl group. The alkyl group is preferably a lower alkyl group such as methyl, ethyl, propyl, isopropyl or butyl, and more preferably selected from the group consisting of methyl, ethyl, propyl and isopropyl. Substituent groups of the substituted alkyl groups include a hydroxyl group, a halogen atom and an alkoxyl group. The alkoxyl groups include an alkoxyl group having from 1 to 4 carbon atoms such as methoxy, ethoxy, propoxy or butoxy.

The structures represented by formulas (pI) to (pVI) in the above-mentioned resins can be used for the protection of alkali-soluble groups. The alkali-soluble groups include various groups known in the art.

Specific examples thereof include a carboxylic acid group, a sulfonic acid group, a phenol group and a thiol group, and preferred are a carboxylic acid group and a sulfonic acid group.

Preferred examples of the alkali-soluble groups protected with the structures represented by formulas (pI) to (pVI) in the above-mentioned resins include groups represented by the following formulas (pVII) to (pXI):

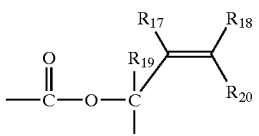

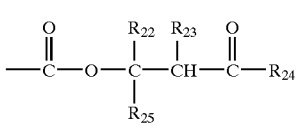

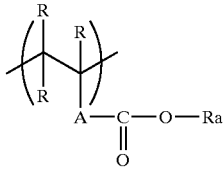

wherein $R_{11}$ to $R_{25}$ and Z have the same meanings as given above, respectively.

As the repeating units having the alkali-soluble groups protected with the structures represented by formulas (pI) to (pVI), repeating units represented by the following formula (pA) are preferred.

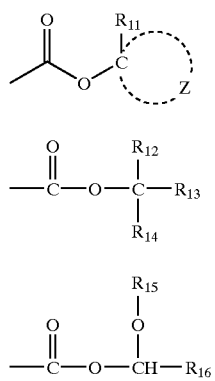

wherein R represents a hydrogen atom, a halogen atom or an unsubstituted or substituted, straight-chain or branched alkyl group having 1 to 4 carbon atoms, and a plurality of R's may be the same or different; A represents a single group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group; and Ra represents any one of the groups represented by the above-mentioned formulas (pI) to (pVI).

Specific examples of monomers corresponding to the repeating units represented by formula (pA) are shown below:

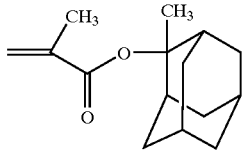

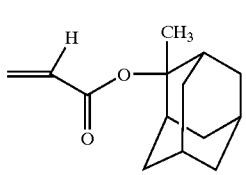

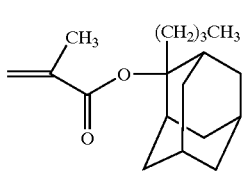

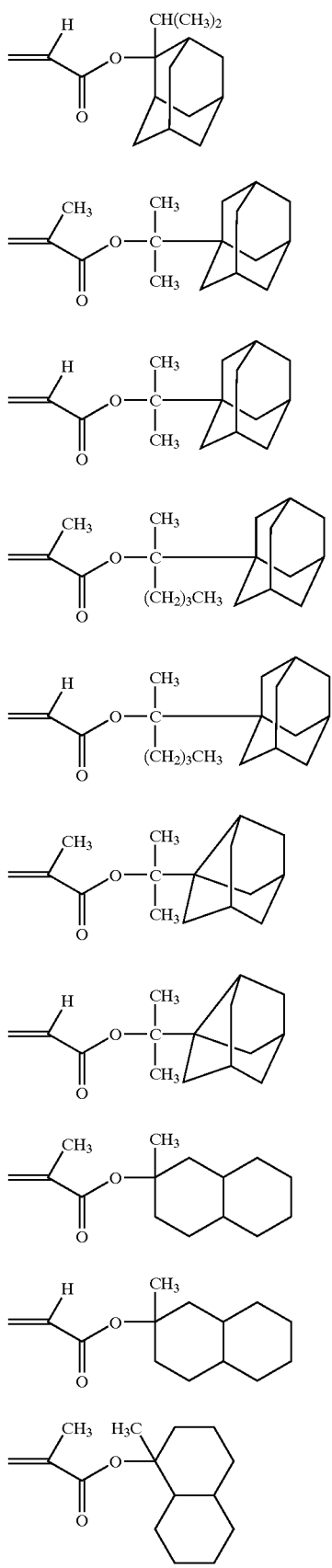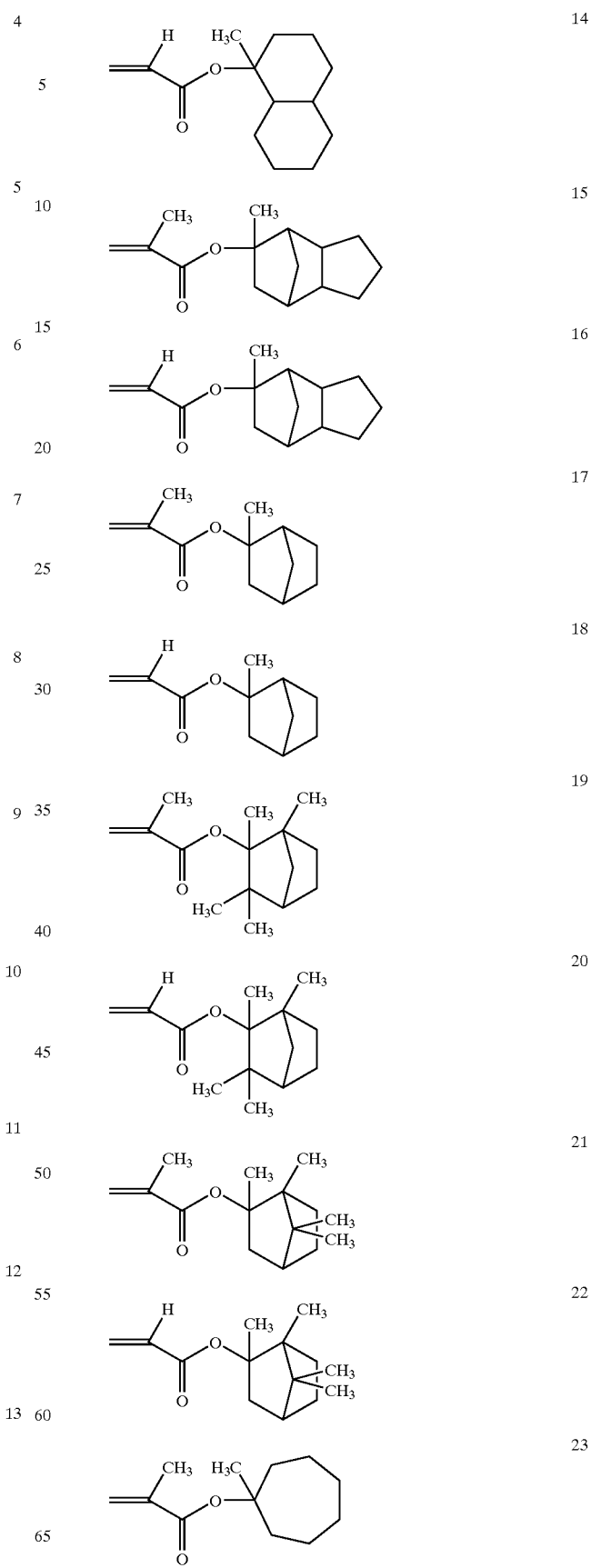

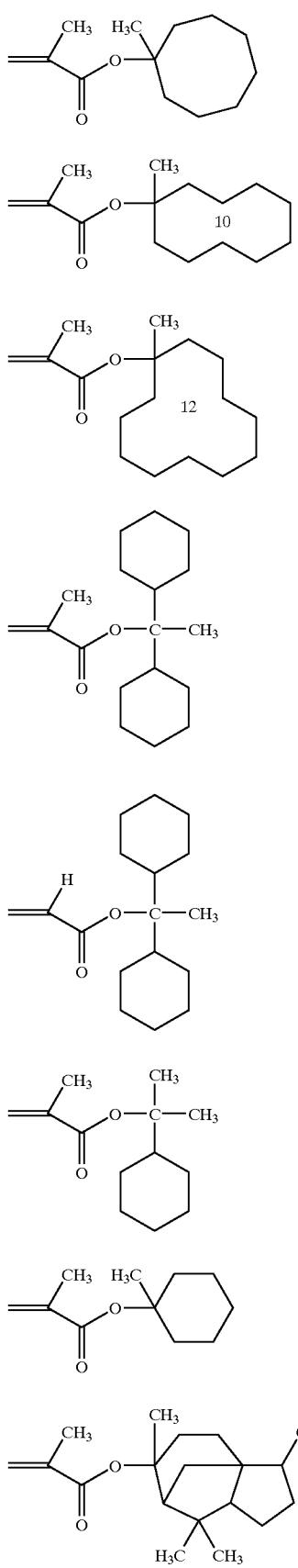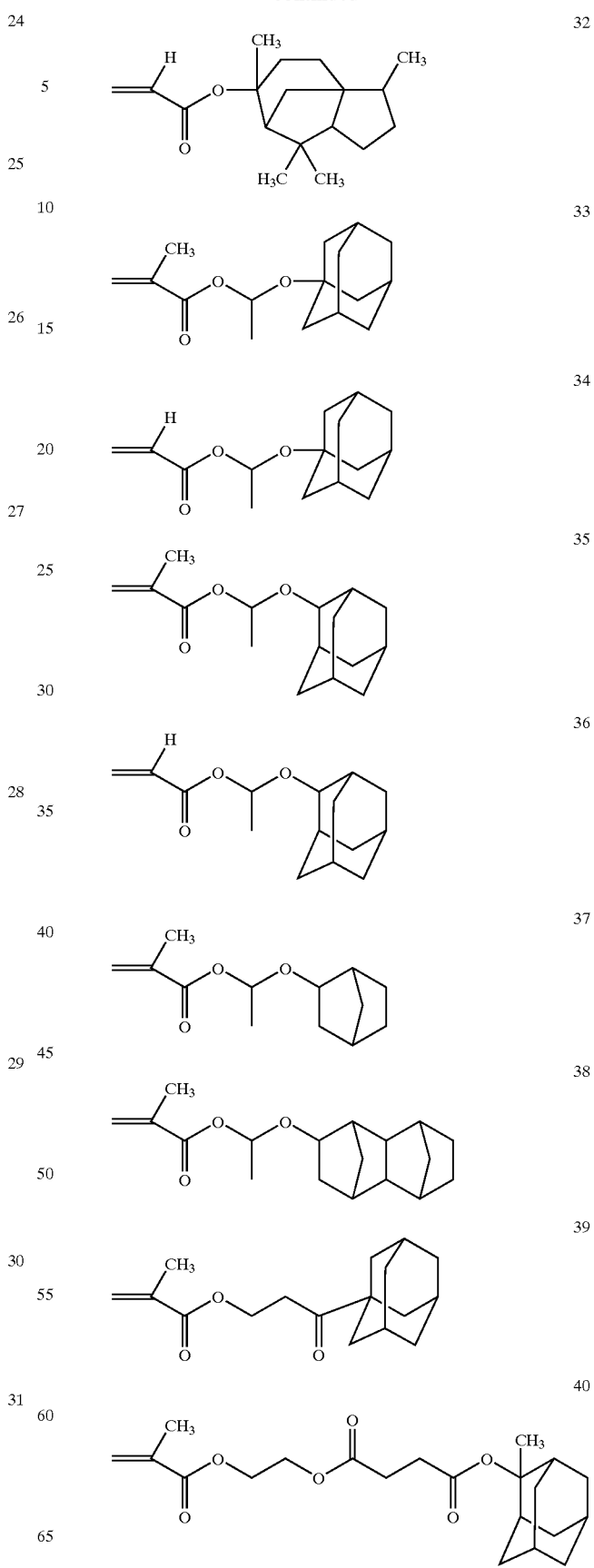

-continued

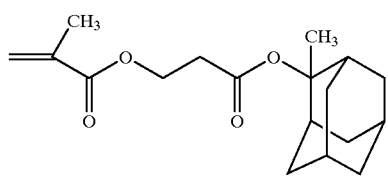

41

In the resin used in the invention, the structure of the acid-decomposable group is represented by —(=O)—$X_1$—$R_0$, wherein $R_0$ represents a tertiary alkyl group such as t-butyl or t-amyl, a 1-alkoxyethyl group such as isobornyl, 1-ethoxyethyl, 1-butoxyethyl, 1-isobutoxyethyl or 1-cyclohexyloxyethyl, an alkoxymethyl group such as 1-methoxymethyl or 1-ethoxymethyl, 3-oxoalkyl group, a tetrahydropyranyl group, a tetrahydrofuranyl group, a trialkylsilyl ester group, a 3-oxocyclohexyl ester group, a 2-methyl-2-adamantyl group or a mevalonic lactone residue; and $X_1$ represents an oxygen atom, a sulfur atom, —NH—, —$NHSO_2$— or —$NHSO_2NH$—.

In the resin used in the invention, more preferred is an acid-decomposable group indicated by the following formula (a), and particularly preferred is an acid-decomposable group indicated by the following formula (b):

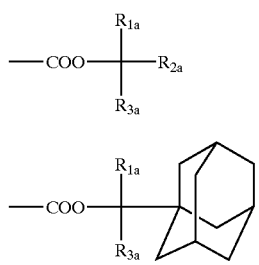

(a)

(b)

In the above-mentioned structure, $R_{1a}$ to $R_{3a}$ each independently represents an alkyl group such as methyl, ethyl, propyl, butyl, cyclohexyl or adamantyl.

Monomers having such acid-decomposable groups include, for example, 5, 6, 7, 8, 9, 10, 27, 28 and 29 described above as the monomers corresponding to the repeating structural units indicated by formula (pA).

In the resin used in the invention, the acid-decomposable group can be contained in at least one of the repeating structural units having the partial structures containing the alicyclic hydrocarbons represented by the above-mentioned formulas (pI) to (pVI) and repeating units of copolymerizable components described later.

The acid-decomposable resin of the invention can further contain repeating units having a lactone structure represented by the following formula (IV'):

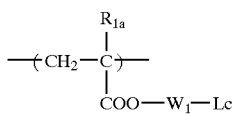

(IV')

-continued

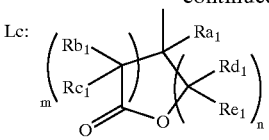

In formula (IV'), $R_{1a}$ represents a hydrogen atom or a methyl group.

$W_1$ represents a single group or a combination of two or more groups selected from the group consisting of a single bond, an alkylene group, an ether group, a thioether group, a carbonyl group and an ester group.

$R_{a1}$, $R_{b1}$, $Rc_1$, $Rd_1$ and $Re_1$ each independently represents a hydrogen atom or an alkyl group having from 1 to 4 carbon atoms. m and n each independently represents an integer of from 0 to 3, and m+n is from 2 to 6.

The alkyl groups of 1 to 4 carbon atoms represented by $Ra_1$ to $Re_1$, include methyl, ethyl, propyl, isopropyl, n-butyl, isobutyl, sec-butyl and t-butyl.

In formula (IV), the alkylene groups represented by $W_1$ include a group represented by the following formula:

—[C(Rf)(Rg)]$_{r_1}$— wherein Rf and Rg, which may be the same or different, each represents a hydrogen atom, an alkyl group, a substituted alkyl group, a halogen atom, a hydroxyl group or an alkoxyl group. The alkyl group is preferably a lower alkyl group such as methyl, ethyl, propyl, isopropyl or butyl, and more preferably selected from methyl, ethyl, propyl and isopropyl. Substituent groups of the substituted alkyl groups include a hydroxyl group, a halogen atom and an alkoxyl group. The alkoxyl groups include an alkoxyl group having from 1 to 4 carbon atoms such as methoxy, ethoxy, propoxy or butoxy. The halogen atoms include chlorine, bromine, fluorine and iodine. $r_1$ is an integer of from 1 to 10.

Further substituent groups of the above-mentioned alkyl groups include a carboxyl group, an acyloxy group, a cyano group, an alkyl group, a substituted alkyl group, a halogen atom, a hydroxyl group, an alkoxyl group, a substituted alkoxyl group, acetylamido group, an alkoxycarbonyl group and an acyl group.

The alkyl groups used herein include a lower alkyl group such as methyl, ethyl, propyl, isopropyl, butyl, cyclopropyl, cyclobutyl or cyclopentyl. Substituent groups of the substituted alkyl groups include a hydroxyl group, a halogen atom and an alkoxyl group. Substituent groups of the substituted alkoxyl groups include an alkoxyl group. The alkoxyl groups include an alkoxyl group having from 1 to 4 carbon atoms such as methoxy, ethoxy, propoxy or butoxy. The acyloxy groups include an acetoxy group. The halogen atoms include chlorine, bromine, fluorine and iodine.

Specific examples of monomers corresponding to the repeating structural units represented by formula (IV') are shown below, but are not limited thereto:

(IV'-1) 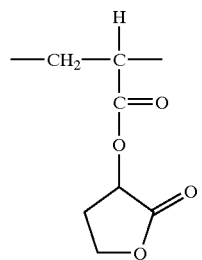
(IV'-2) 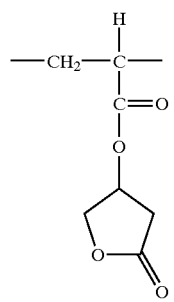
(IV'-3) 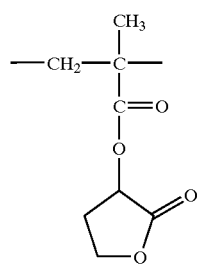
(IV'-4) 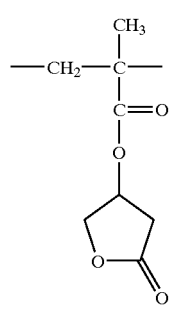
(IV'-5) 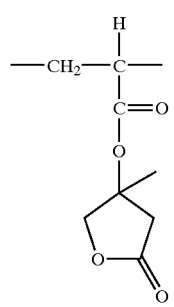
(IV'-6) 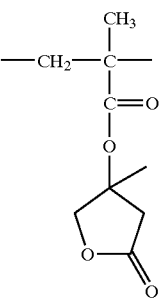
(IV'-7) 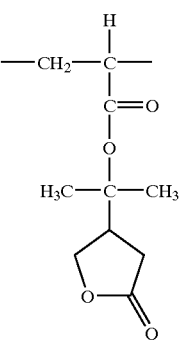
(IV'-8) 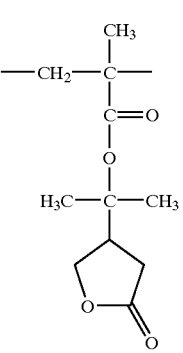
(IV'-9) 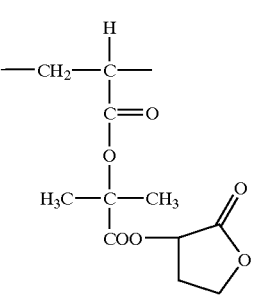
(IV'-10) 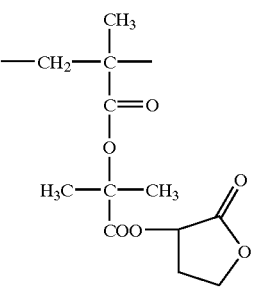

(IV'-11) 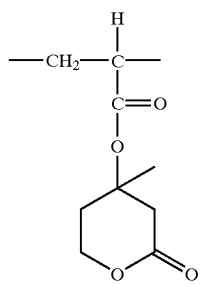
(IV'-12) 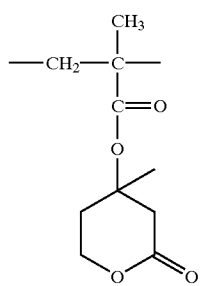
(IV'-13) 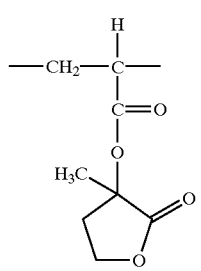
(IV'-14) 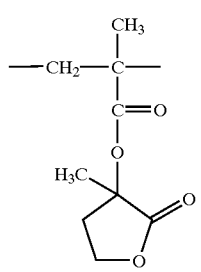
(IV'-15) 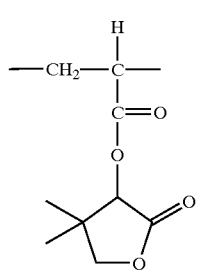
(IV'-16) 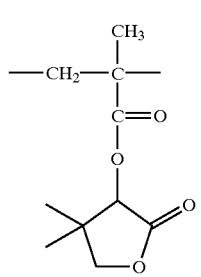
(IV'-17) 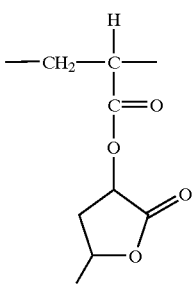
(IV'-18) 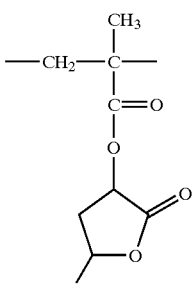
(IV'-19) 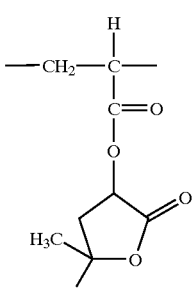
(IV'-20) 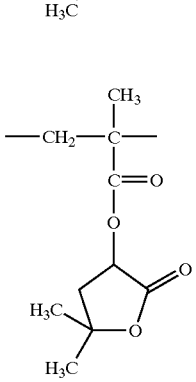
(IV'-21) 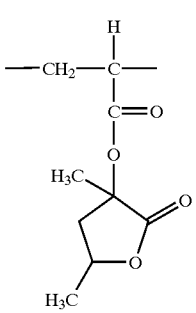

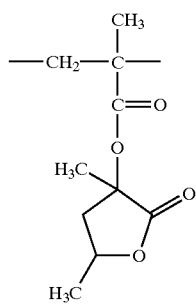 (IV'-22)
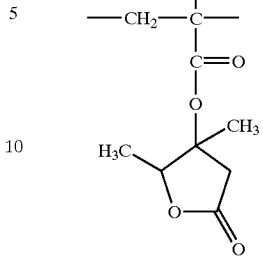 (IV'-27)
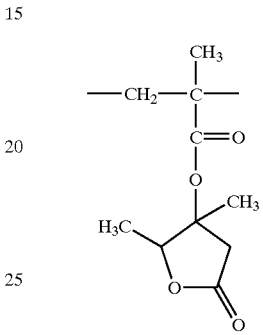 (IV'-23)
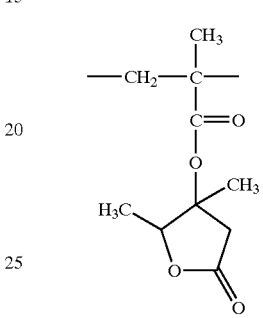 (IV'-28)
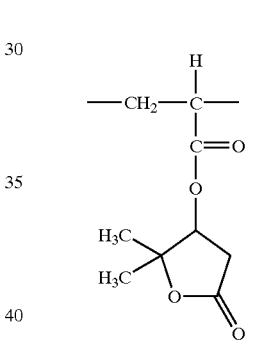 (IV'-24)
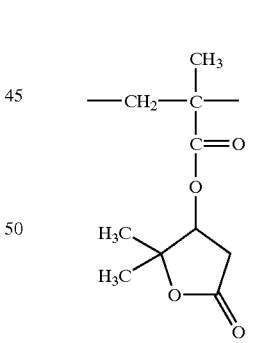 (IV'-29)
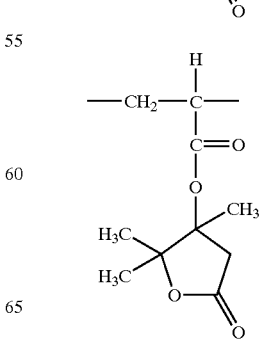 (IV'-25)
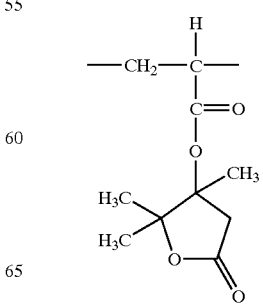 (IV'-30)
(IV'-26)
(IV'-31)

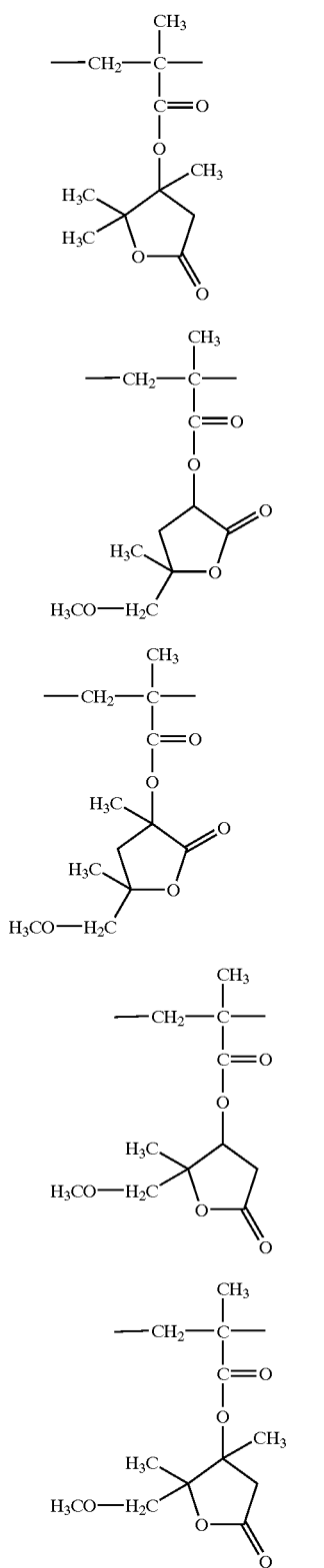

(IV'-32)
(IV'-33)
(IV'-34)
(IV'-35)
(IV'-36)

Of the above-mentioned specific examples of formula (IV'), (IV'-17) to (IV'-36) are preferred in view of the point that the exposure margin is more improved.

Further, the structure of formula (IV') is preferably an acrylate structure in that edge roughness is improved.

Still further, repeating units having a group represented by any one of the following formulas (V'-1) to (V'-4) may be contained:

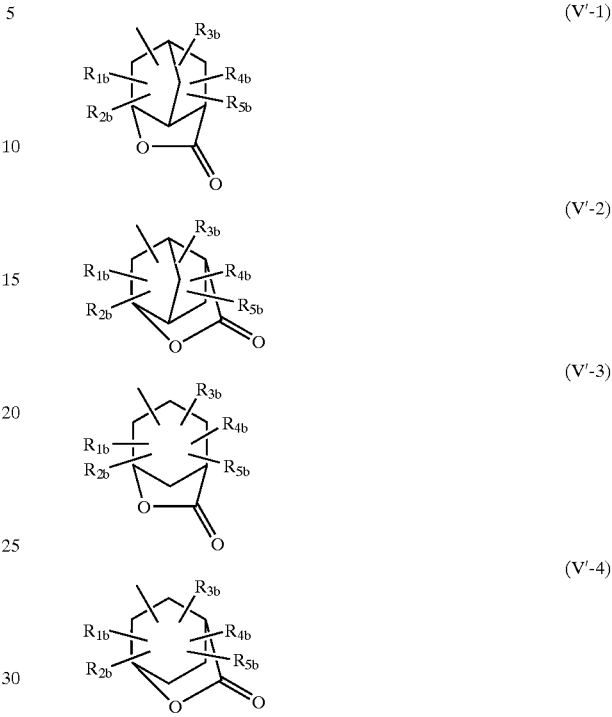

(V'-1)
(V'-2)
(V'-3)
(V'-4)

In formulas (V'-1) to (V'-4), $R_{1b}$ to $R_{5b}$ each independently represents a hydrogen atom, an alkyl group which may have a substituent group, a cycloalkyl group or an alkenyl group. Two of $R_{1b}$ to $R_{5b}$ may combine with each other to form a ring.

In formulas (V'-1) to (V'-4), the alkyl groups represented by $R_{1b}$ to $R_{5b}$ include a straight-chain or branched alkyl group, which may have a substituent group. The straight-chain or branched alkyl group is preferably a straight-chain or branched alkyl group having from 1 to 12 carbon atoms, more preferably a straight-chain or branched alkyl group having from 1 to 10 carbon atoms, and still more preferably methyl, ethyl, propyl, isopropyl, n-butyl, isobutyl, sec-butyl, t-butyl, pentyl, hexyl, heptyl, octyl, nonyl or decyl.

The cycloalkyl groups represented by $R_{1b}$ to $R_{5b}$ are preferably a cycloalkyl group having from 3 to 8 carbon atoms such as cyclopropyl, cyclopentyl, cyclohexyl, cycloheptyl or cyclooctyl.

The alkenyl groups represented by $R_{1b}$ to $R_{5b}$ are preferably an alkenyl group having from 2 to 6 carbon atoms such as vinyl, propenyl, butenyl or hexenyl.

Further, the rings formed by combining two of $R_{1b}$ to $R_{5b}$ with each other include 3- to 8-membered rings such as a cyclopropane ring, a cyclobutane ring, a cyclopentane ring, a cyclohexane ring, and cyclooctane ring.

$R_{1b}$ to $R_{5b}$ in formulas (V'-1) to (V'-4) may each combine with any carbon atom constituting a cyclic skeleton.

Preferred examples of the substituent groups which may be contained in the above-mentioned alkyl, cycloalkyl and alkenyl groups include an alkoxyl group having from 1 to 4 carbon atoms, a halogen atom (fluorine, chlorine, bromine or iodine), an acyl group having from 2 to 5 carbon atoms, an acyloxy group having from 2 to 5 carbon atoms, a cyano group, a hydroxyl group, a carboxyl group, an alkoxycarbonyl group having from 2 to 5 carbon atoms and a nitro group.

The repeating units having the groups represented by formulas (V'-1) to (V'-4) include repeating units represented by the following formula (AI'):

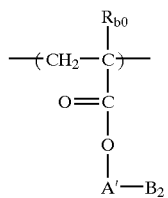
(AI')

In formula (AI'), $R_{b0}$ represents a hydrogen atom, a halogen atom or an unsubstituted or substituted alkyl group having from 1 to 4 carbon atoms. Preferred examples of the substituent groups which may be contained in the alkyl groups represented by $R_{b0}$ include the substituent groups exemplified above as the preferred ones which may be contained in the alkyl groups represented by $R_{1b}$ in the above-mentioned formulas (V'-1) to (V'-4).

The halogen atoms represented by $R_{b0}$ include fluorine, chlorine, bromine and iodine. $R_{b0}$ is preferably hydrogen.

A' represents a single bond, an ether group, an ester group, a carbonyl group, an alkylene group or a divalent group which is a combination thereof.

$B_2$ represents a group indicated by any one of formulas (V'-1) to (V'-4)

In A', the combined divalent groups include, for example, groups represented by the following formulas:

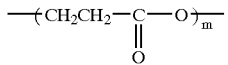

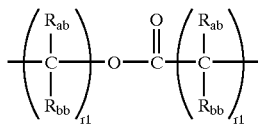

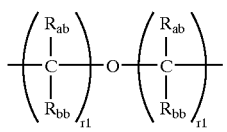

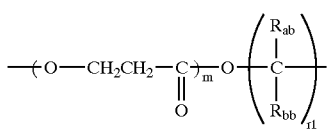

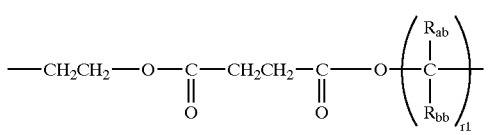

In the above-mentioned formulas, $R_{ab}$ and $R_{bb}$, which may be the same or different, each represents a hydrogen atom, an alkyl group, a substituted alkyl group, a halogen atom, a hydroxyl group or an alkoxyl group.

The alkyl group is preferably a lower alkyl group such as methyl, ethyl, propyl, isopropyl or butyl, and more preferably selected from methyl, ethyl, propyl and isopropyl. Substituent groups of the substituted alkyl groups include a hydroxyl group, a halogen atom and an alkoxyl group having from 1 to 4 carbon atoms.

The alkoxyl groups include an alkoxyl group having from 1 to 4 carbon atoms such as methoxy, ethoxy, propoxy or butoxy. The halogen atoms include chlorine, bromine, fluorine and iodine. r1 represents an integer of from 1 to 10, and preferably an integer of from 1 to 4. m represents an integer of from 1 to 3, and preferably 1 or 2.

Specific examples of the repeating units represented by formula (AI') are exemplified below, but the scope of the invention is not limited thereto:

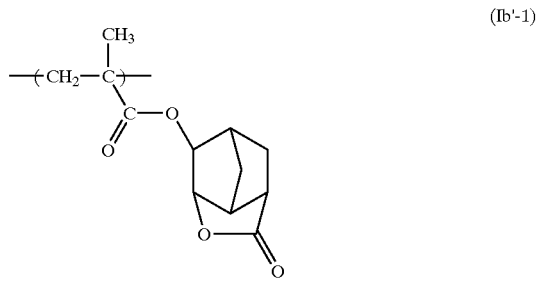
(Ib'-1)

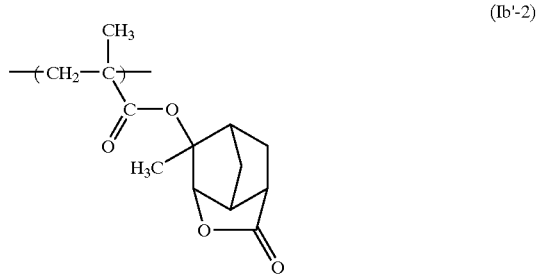
(Ib'-2)

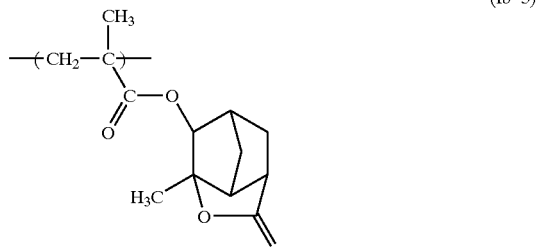
(Ib'-3)

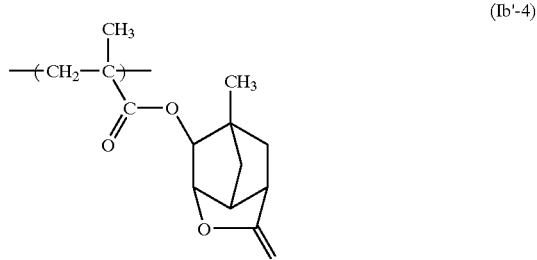
(Ib'-4)

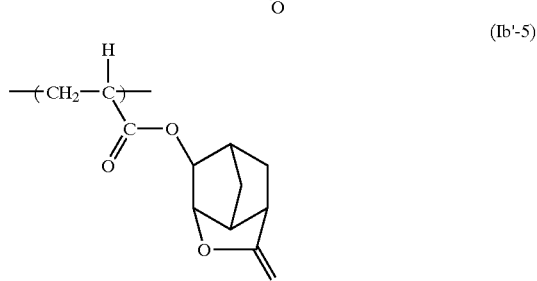
(Ib'-5)

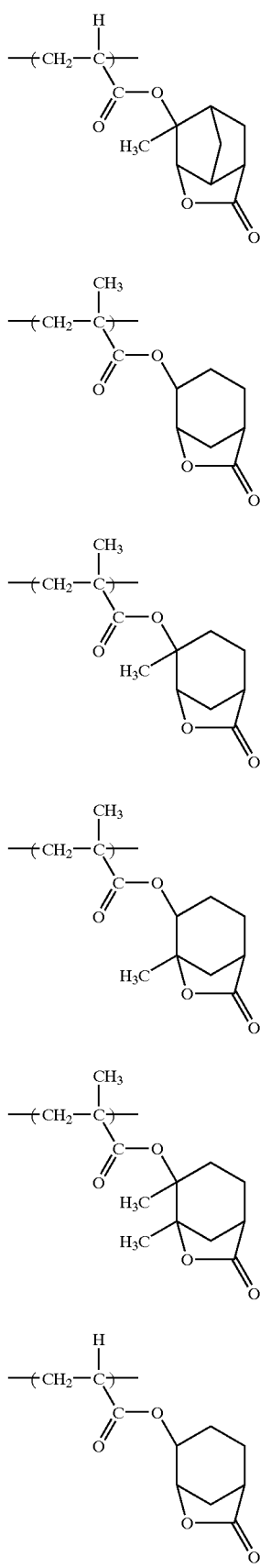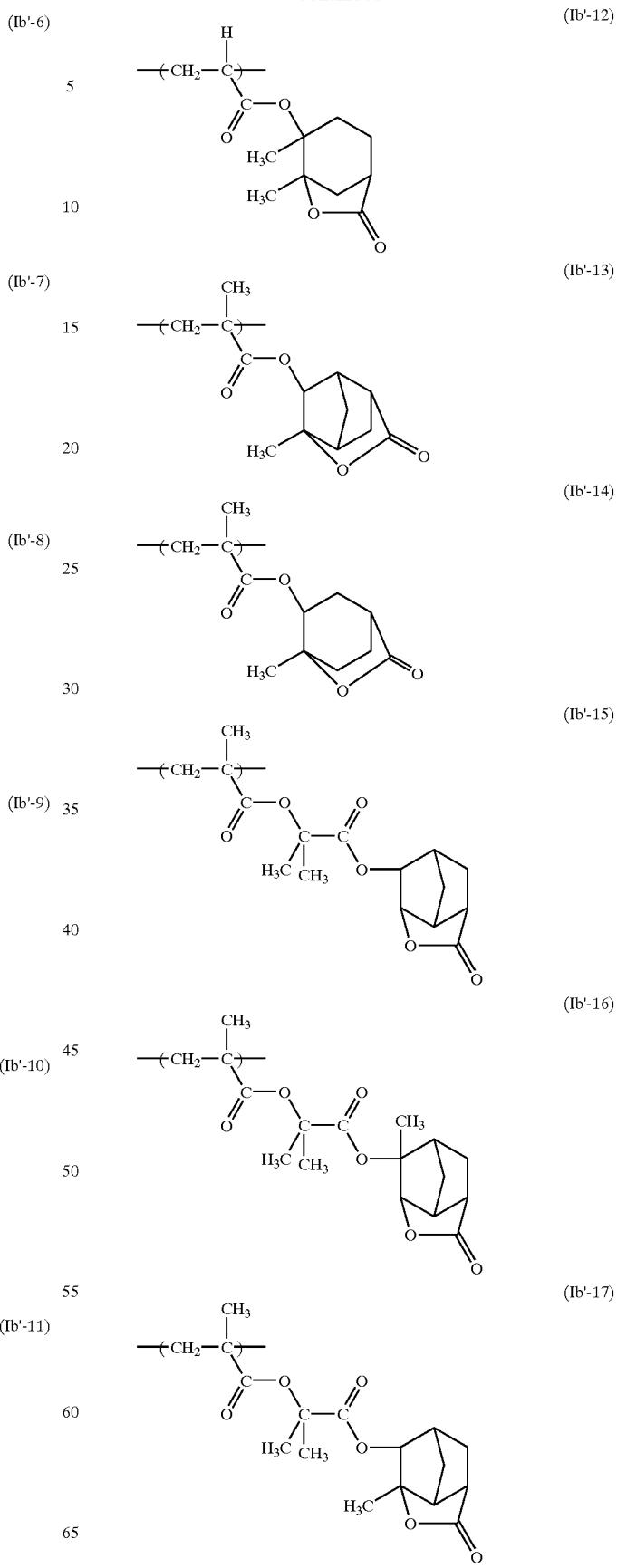

(Ib'-18) 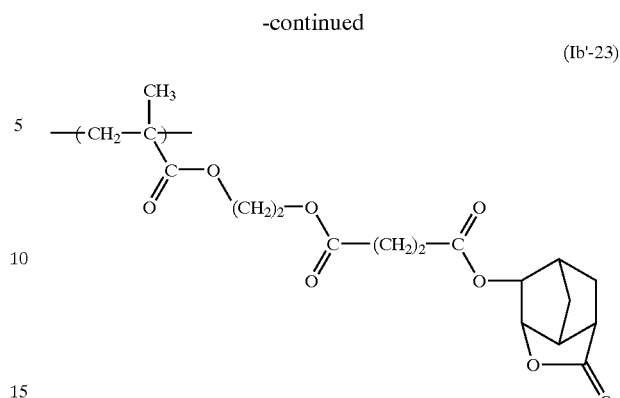
(Ib'-19) 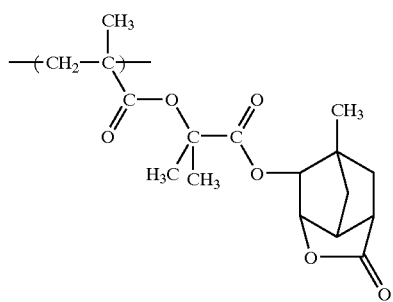
(Ib'-20) 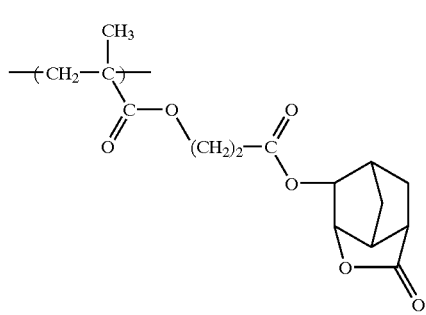
(Ib'-21) 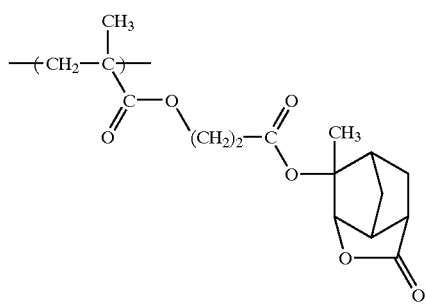
(Ib'-22) 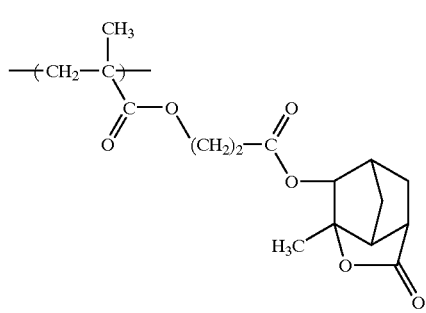
(Ib'-23) 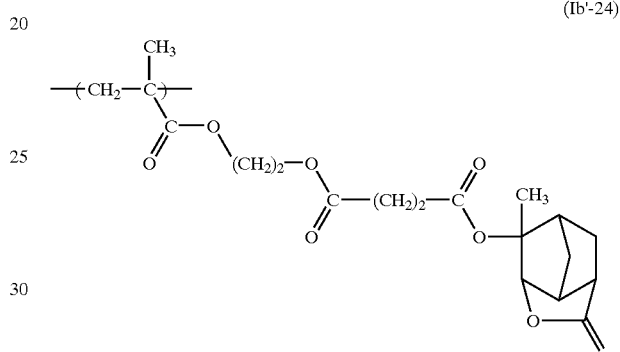
(Ib'-24)
(Ib'-25)
(Ib'-26) 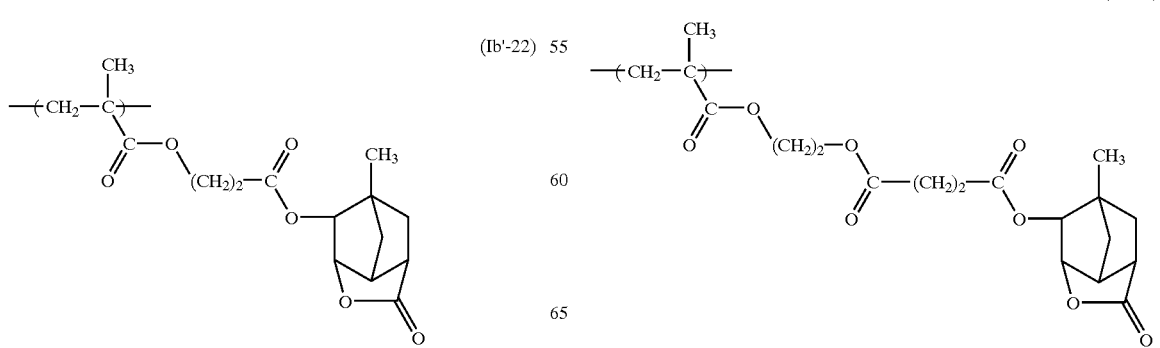
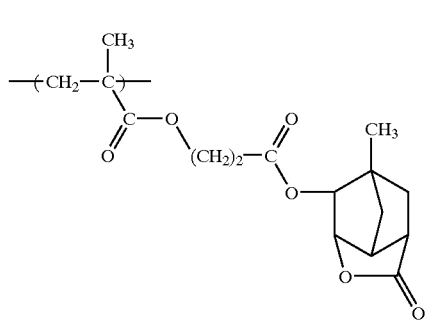

(Ib'-27)
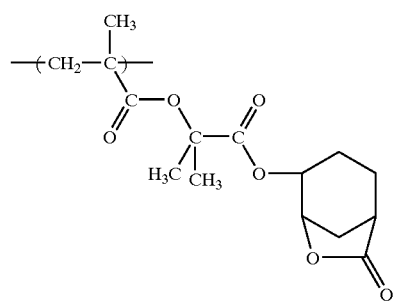
(Ib'-28)
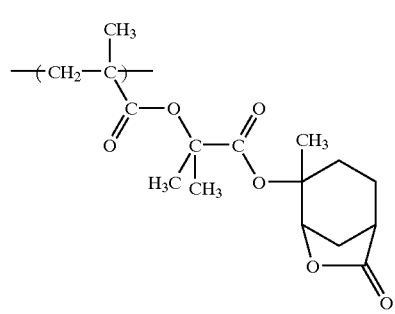
(Ib'-29)
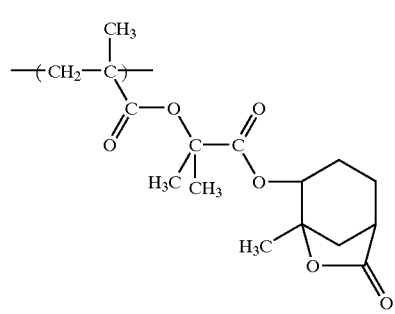
(Ib'-30)
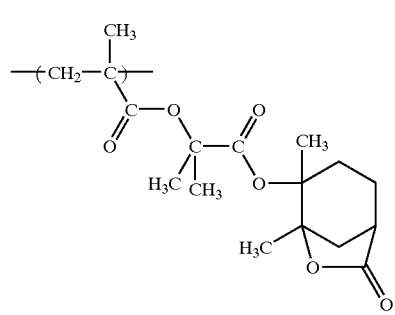
(Ib'-31)
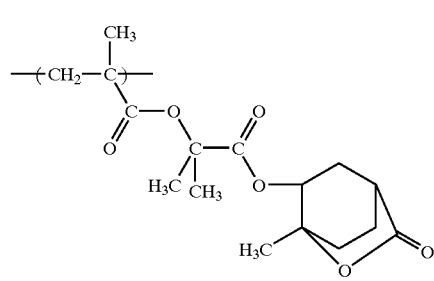
(Ib'-32)
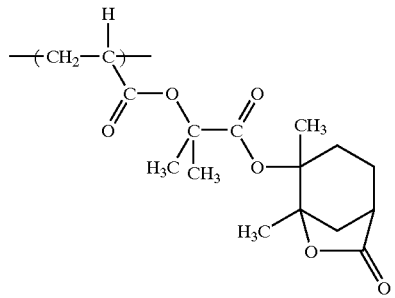
(Ib'-33)
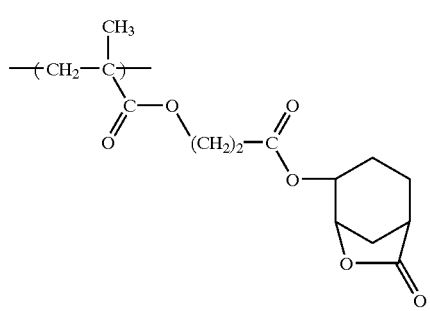
(Ib'-34)
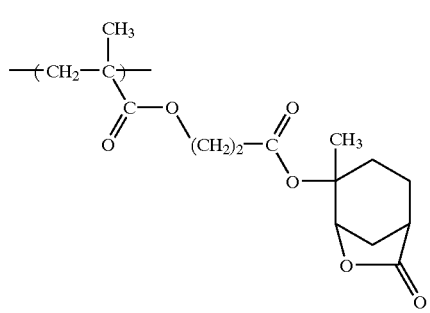
(Ib'-35)
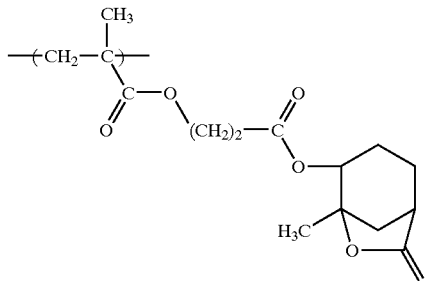
(Ib'-36)
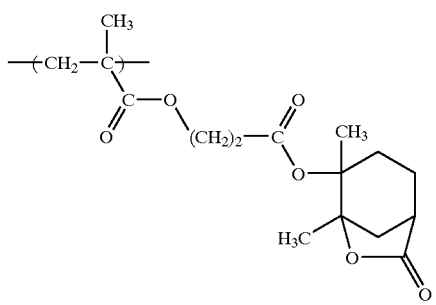

(Ib'-37)
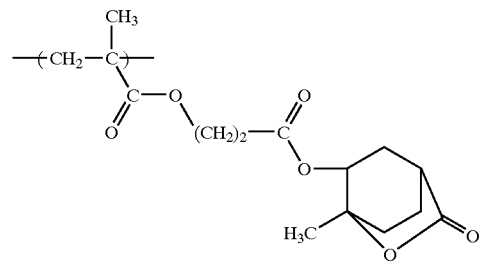

(Ib'-38)
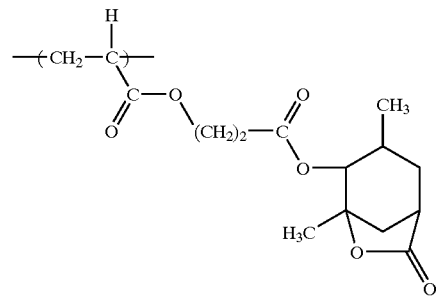

(Ib'-39)
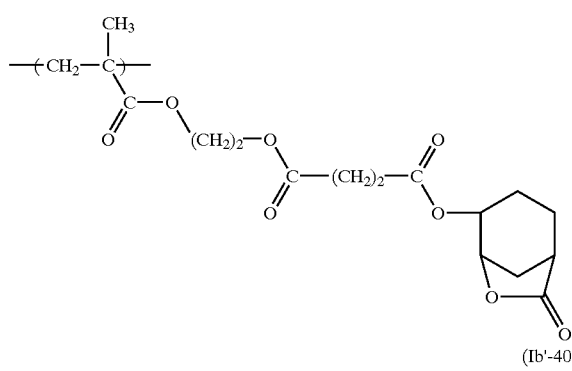

(Ib'-40)
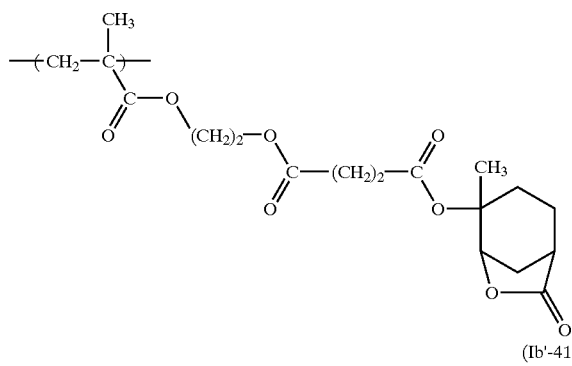

(Ib'-41)
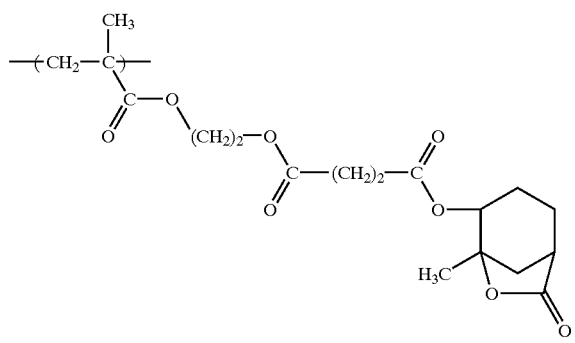

(Ib'-42)
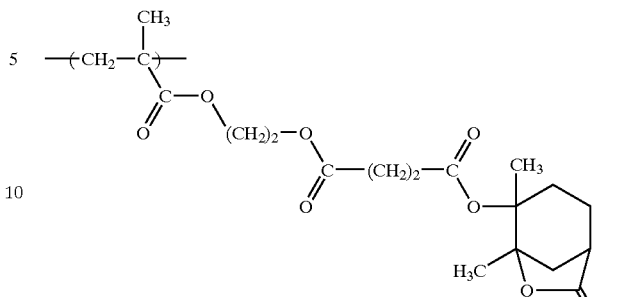

(Ib'-43)
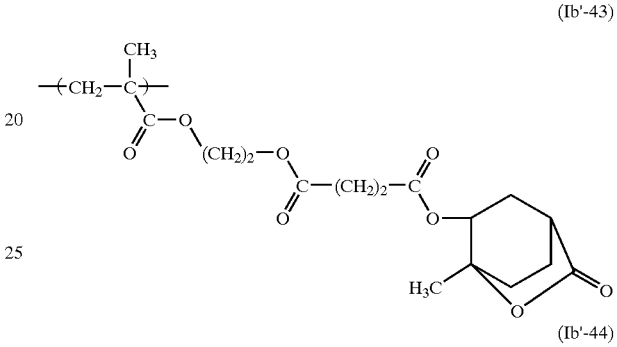

(Ib'-44)
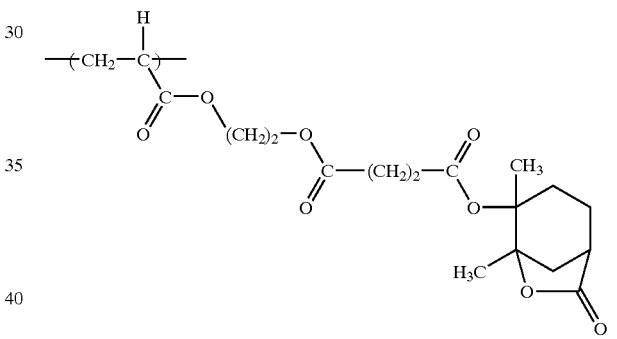

The acid-decomposable resins used in the invention can further contain repeating units represented by the following formula (VI'):

(VI')
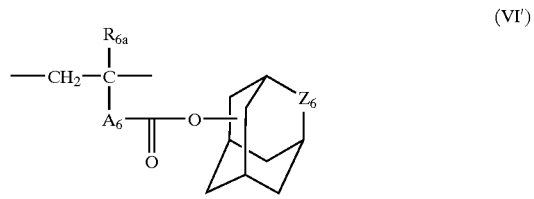

$Z_6$: 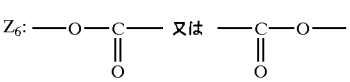

In formula (VI') $A_6$ represents a single group or a combination of two or more groups selected from the group consisting of a single bond, an alkylene group, a cycloalkylene group, an ether group, a thioether group, a carbonyl group and an ester group.

$R_{6a}$ represents a hydrogen atom, an alkyl group having from 1 to 4 carbon atoms, a cyano group or a halogen atom.

In formula (VI'), the alkylene groups represented by $A_6$ include a group represented by the following formula:

—[C(Rnf)(Rng)]r— wherein Rnf and Rng, which may be the same or different, each represents a hydrogen atom, an alkyl group, a substituted alkyl group, a halogen atom, a hydroxyl group or an alkoxyl group. The alkyl group is preferably a lower alkyl group such as methyl, ethyl, propyl, isopropyl or butyl, and more preferably selected from methyl, ethyl, propyl and isopropyl. Substituent groups of the substituted alkyl groups include a hydroxyl group, a halogen atom and an alkoxyl group. The alkoxyl groups include an alkoxyl group having from 1 to 4 carbon atoms such as methoxy, ethoxy, propoxy or butoxy. The halogen atoms include chlorine, bromine, fluorine and iodine. r is an integer of from 1 to 10.

In formula (VI'), the cycloalkylene groups represented by $A_6$ include a cycloalkylene group having from 3 to 10 carbon atoms such as cyclopentylene, cyclohexylene or cyclooctylene.

The bridge-containing alicyclic ring containing $Z_6$ may have a substituent group. The substituent groups include, for example, a halogen atom, an alkoxyl group (preferably having from 1 to 4 carbon atoms), an alkoxycarbonyl group (preferably from 1 to 5 carbon atoms), an acyl group (for example, formyl or benzoyl), an acyloxy group (for example, propylcarbonyloxy or benzoyloxy), an alkyl group (preferably having from 1 to 4 carbon atoms), a carboxyl group, a hydroxyl group and an alkylsulfonylsulfamoyl group (such as —CONHSO$_2$CH$_3$). The alkyl group as the substituent group may further be substituted by a hydroxyl group, a halogen atom or an alkoxyl group (preferably having from 1 to 4 carbon atoms).

In formula (VI'), the oxygen atom of the ester group bound to $A_6$ may combine with a carbon atom constituting the bridge-containing alicyclic ring structure containing $Z_6$ at any position.

Specific examples of the repeating units represented by formula (VI') are exemplified below, but are not limited thereto:

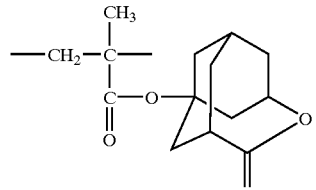

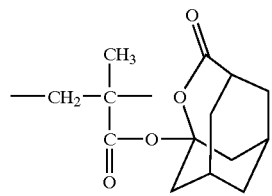

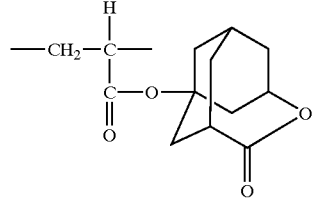

-continued

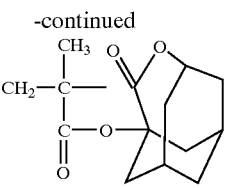

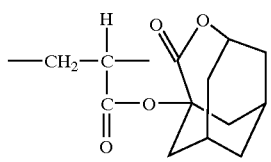

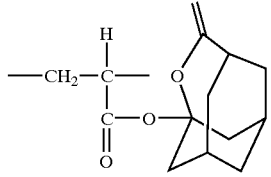

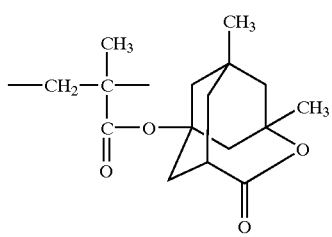

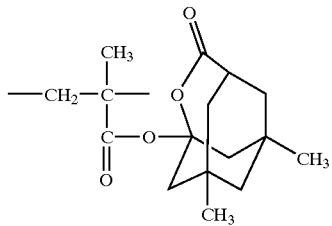

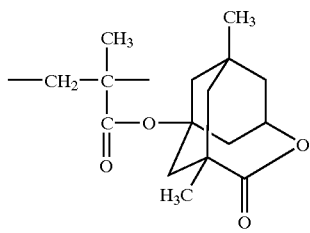

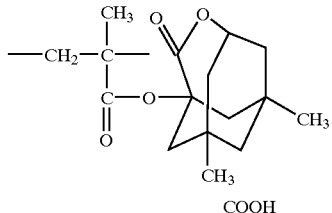

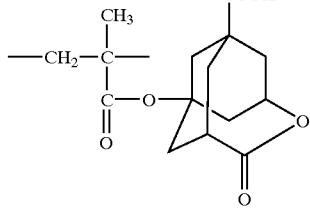

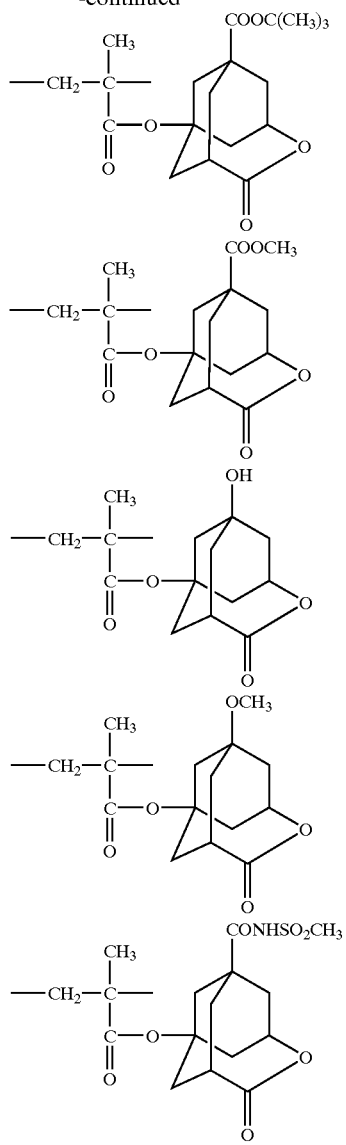

Further, repeating units having a group represented by the following formula (VII') may be contained.

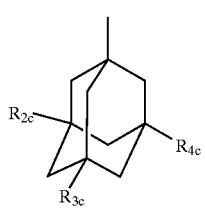
(VII')

In formula (VII'), $R_2c$ to $R_4c$ each independently represents a hydrogen atom or a hydroxyl group, with the proviso that at least one of $R_2c$ to $R_4c$ represents a hydroxyl group.

The structure represented by formula (VII') is preferably a dihydroxyl form or a monohydroxyl form, and more preferably a dihydroxyl form.

The repeating units having the group represented by formula (VII') include repeating units represented by the following formula (AII'):

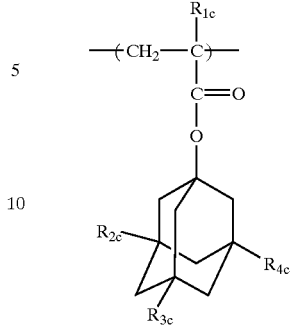
(AII')

In formula (AII'), $R_1c$ represents a hydrogen atom or a methyl group.

$R_2c$ to $R_4c$ each independently represents a hydrogen atom or a hydroxyl group, with the proviso that at least one of $R_2c$ to $R_4c$ represents a hydroxyl group.

Specific examples of the repeating units having the structure represented by formula (AII') are exemplified below, but are not limited thereto:

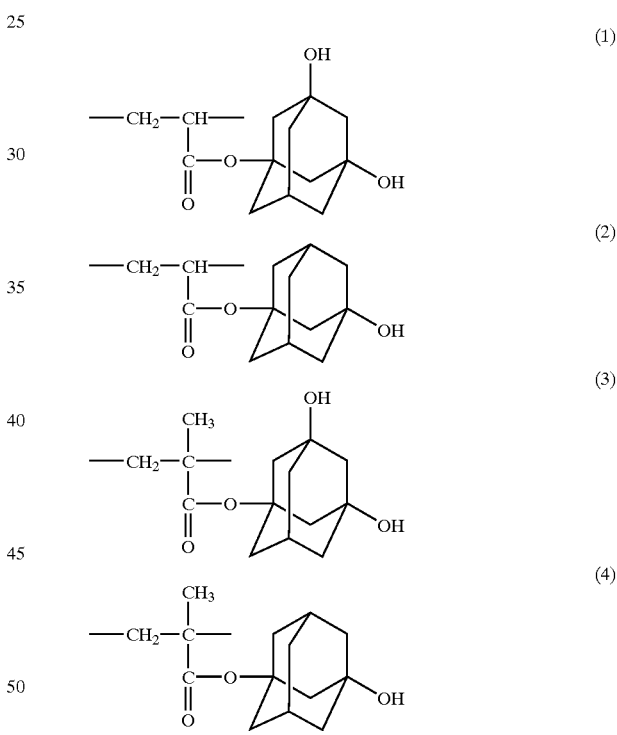

The acid-decomposable resin, component (A), can contain various repeating structural units, in addition to the above-mentioned repeating structural units, for controlling dry etching resistance, standard developing solution suitability, substrate adhesion, resist profiles, and further resolving power, heat resistance and sensitivity which are characteristics generally necessary for resists.

Such repeating structural units include but are not limited to repeating structural units corresponding to the following monomers. This makes it possible to perform fine adjustments of performances required for the acid-decomposable reins, particularly, (1) Solubility in coating solvents;
(2) Film forming properties (glass transition point);

(3) Alkali developing properties;
(4) Film decrease (hydrophilicity and hydrophobicity, selection of alkali-soluble groups);
(5) Adhesion of unexposed areas to substrates; and
(6) Dry etching resistance.

Such monomers include, for example, a compound having one addition-polymerizable unsaturated bond selected from an acrylic acid ester, a methacrylic acid ester, an acrylamide, a methacrylamide, an allyl compound, a vinyl ether and a vinyl ester.

Specific examples thereof include the following monomers:

Acrylic acid esters (preferably alkyl acrylates wherein the alkyl groups each has from 1 to 10 carbon atoms):

Methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate.

Methacrylic acid esters (preferably alkyl methacrylates wherein the alkyl groups each has from 1 to 10 carbon atoms):

Methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Acrylamides

Acrylamide, N-alkylacrylamides (the alkyl groups each has from 1 to 10 carbon atoms, for example, methyl, ethyl, propyl, butyl, t-butyl, heptyl, octyl, cyclohexyl and hydroxyethyl), N,N-dialkylacrylamides (the alkyl groups each has from 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Methacrylamides

Methacrylamide, N-alkylmethacrylamides (the alkyl groups each has from 1 to 10 carbon atoms, for example, methyl, ethyl, t-butyl, ethylhexyl, hydroxyethyl and cyclohexyl), N,N-dialkylmethacrylamides (the alkyl groups include ethyl, propyl and butyl) and N-hydroxyethyl-N-methylacrylamide.

Allyl Compounds

Allyl esters (for example, allyl acetate, allyl caproate, allyl caprylate, allyl laurate, allyl palmitate, allyl stearate, allyl benzoate, allyl acetoacetate and allyl lactate) and allyloxyethanol.

Vinyl Ethers

Alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether).

Vinyl Eaters

Vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate and vinyl cyclohexylcarboxylate.

Dialkyl Itaconate

Dimethyl itaconate, diethyl itaconate and dibutyl itaconate.

Dialkyl or Monoalkyl Esters of Fumaric Acid:

Dibutyl fumarate.

Others

Crotonic acid, itaconic acid, maleic anhydride, maleimide, acrylonitrile, methacrylonitrile and maleylonitrile.

Besides, addition-polymerizable unsaturated compounds may be copolymerized, as long as they are copolymerizable with monomers corresponding to the above-mentioned various repeating structural units.

In the acid-decomposable resin, the molar ratio of the respective repeating structural units contained is appropriately established for controlling dry etching resistance, standard developing solution suitability, substrate adhesion, resist profiles, and further resolving power, heat resistance and sensitivity which are characteristics generally necessary for resists.

In the acid-decomposable resin, the content of the repeating units having the partial structures containing the alicyclic hydrocarbons represented by formulas (pI) to (pVI) is preferably from 30 mol % to 70 mol %, more preferably from 35 mol % to 65 mol %, and still more preferably from 40 mol % to 60 mol %, based on the total repeating structural units.

The total content of the repeating units represented by formulas (IV') to (VII') is preferably from 5 mol % to 70 mol %, more preferably from 10 mol % to 65 mol %, and still more preferably from 15 mol % to 60 mol %, based on the total repeating structural units.

The content of the repeating units having the acid-decomposable groups containing the repeating units having the partial structures containing the alicyclic hydrocarbons represented by formulas (pI) to (pVI) is preferably from 30 mol % to 70 mol %, more preferably from 35 mol % to 65 mol %, and still more preferably from 40 mol % to 60 mol %, based on the total repeating structural units.

The acid-decomposable resins used in the invention can be synthesized by usual methods (for example, radical polymerization). For example, according to a general synthesis method, monomer species are placed in a reaction vessel collectively or during the reaction, and dissolved in a reaction solvent, for example, an ether such as tetrahydrofuran, 1,4-dioxane or diisopropyl ether, a ketone such as methyl ethyl ketone or methyl isobutyl ketone, an ester solvent such as ethyl acetate, or a solvent dissolving the composition of the invention such as propylene glycol monomethyl ether acetate described later, as needed, to homogenize them. Then, polymerization is initiated in an atmosphere of an inert gas such as nitrogen or argon by heating as needed and by using a commercially available radical initiator (such as an azo initiator or a peroxide). The initiator may be added additionally or in parts as desired. After the reaction is completed, the reaction product is poured into a solvent to recover a desired polymer by powder or solid recovery. The reaction concentration is 20% by weight or more, preferably 30% by weight or more, and more preferably 40% by weight or more. The reaction temperature is from 10° C. to 150° C., preferably from 30° C. to 120° C., and more preferably from 50° C. to 100° C.

The weight average molecular weight of the resin used in the invention is preferably from 1,000 to 200,000, as a value measured by the GPC method and converted to that of polystyrene. When the weight average molecular weight is less than 1,000, deterioration of heat resistance or dry etching resistance is unfavorably observed. On the other hand, exceeding 200,000 unfavorably results in deterioration of developing properties or deterioration of film forming properties because of its extremely increased viscosity.

When the composition of the invention is used for ArF exposure, it is preferred that the resin has no aromatic ring from the viewpoint of transparency to ArF light.

It is preferred that the resin has no alicyclic group on its main chain, because the resin is excellent in resolution of contact holes and significantly improved in defocusing latitude (the allowable range of defocusing).

In the positive-working photoresist composition for far ultraviolet exposure of the invention, the amount of all resins used in the invention compounded in the whole composition is preferably from 40% to 99.99% by weight, and more preferably from 50% to 99.97% by weight, based on the total resist solidcontent.

[2] (B) Compound Generating Acid by Irradiation of Actinic ray or Radiation (Photoacid Generating Agent)

The photoacid generating agent used in the invention is a compound represented by the above-mentioned formula (Ia), (IIb), (I') or (II').

In formulas (Ia), (IIb), (I') or (II'), $R_1$ to $R_5$ each independently represents an aliphatic or aromatic hydrocarbon group which may have a substituent group, with the proviso that two of $R_1$ to $R_3$ may combine with each other to form a ring, and that $R_4$ and $R_5$ may combine with each other to form a ring. X represents any one of the above-mentioned anions.

In the above-mentioned anions, $R_6$ to $R_{10}$ each independently represents an aliphatic hydrocarbon group, with the proviso that $R_6$ and $R_7$ may combine with each other to form a ring, and that two of $R_8$ to $R_{10}$ may combine with each other to form a ring.

The aliphatic hydrocarbon groups represented by $R_1$ to $R_5$ include, for example, a saturated, unsaturated or alicyclic aliphatic hydrocarbon group having from 1 to 15 carbon atoms which may have a substituent group.

The saturated aliphatic hydrocarbon groups include, for example, methyl, ethyl, propyl, isopropyl, butyl, isobutyl, sec-butyl, tert-butyl, pentyl, isopentyl, neopentyl, hexyl, heptyl, octyl, nonyl, decyl, undecyl and dodecyl. The unsaturated aliphatic hydrocarbon groups include, for example, vinyl, propenyl, allyl, isopropenyl and butenyl. The alicyclic aliphatic hydrocarbon groups include, for example, cyclopropyl, cyclobutyl, cyclopentyl, cyclohexyl and cyclooctyl.

The above-mentioned saturated aliphatic hydrocarbon group, unsaturated aliphatic hydrocarbon group and alicyclic aliphatic hydrocarbon group may have a substituent group. Examples of the substituent groups include a carboxyl group, a cyano group, an alkyl group (preferably having from 1 to 12 carbon atoms), a substituted alkyl group (preferably having from 1 to 12 carbon atoms), a halogen atom, a hydroxyl group, an alkoxyl group (preferably having from 1 to 12 carbon atoms), an acetylamido group, an alkoxycarbonyl group (preferably having from 1 to 12 carbon atoms), an acyl group (preferably having from 1 to 12 carbon atoms), a phenylthio group, a nitro group and an acyloxy group (preferably having from 1 to 12 carbon atoms). The alkyl groups include, for example, methyl, ethyl, propyl, isopropyl, butyl, cyclopropyl, cyclobutyl and cyclopentyl. Substituent groups of the substituted alkyl groups include a hydroxyl group, a halogen atom and an alkoxyl group. The alkoxyl groups include, for example, methoxy, ethoxy, propoxy and butoxy. The acyloxy groups include, for example, acetoxy. The halogen atoms include, for example, chlorine, bromine, fluorine and iodine.

The aliphatic hydrocarbon groups represented by $R_6$ to $R_{10}$ include, for example, a saturated, unsaturated or alicyclic aliphatic hydrocarbon group having from 1 to 15 carbon atoms which may have a substituent group.

The saturated aliphatic hydrocarbon groups include, for example, methyl, ethyl, propyl, isopropyl, butyl, isobutyl, sec-butyl, tert-butyl, pentyl, isopentyl, neopentyl, hexyl, heptyl, octyl, nonyl, decyl, undecyl and dodecyl. The unsaturated aliphatic hydrocarbon groups include, for example, vinyl, propenyl, allyl, isopropenyl and butenyl. The alicyclic aliphatic hydrocarbon groups include, for example, cyclopropyl, cyclobutyl and cyclopentyl.

As $R_6$ to $R_{10}$, particularly preferred is a saturated aliphatic hydrocarbon group having from 1 to 5 carbon atoms.

The above-mentioned saturated aliphatic hydrocarbon group, unsaturated aliphatic hydrocarbon group and alicyclic aliphatic hydrocarbon group may have a substituent group. Examples of the substituent groups include a carboxyl group, a cyano group, an alkyl group (preferably having from 1 to 5 carbon atoms, a substituted alkyl group (preferably having from 1 to 5 carbon atoms, a halogen atom, a hydroxyl group, an alkoxyl group (preferably having from 1 to 5 carbon atoms), an acetylamido group, an alkoxycarbonyl group (preferably having from 1 to 5 carbon atoms), an acyl group (preferably having from 1 to 5 carbon atoms), a nitro group and an acyloxy group (preferably having from 1 to 5 carbon atoms). The alkyl groups include, for example, methyl, ethyl, propyl, isopropyl, butyl, cyclopropyl, cyclobutyl and cyclopentyl. Substituent groups of the substituted alkyl groups include a hydroxyl group, a halogen atom and an alkoxyl group. The alkoxyl groups include, for example, methoxy, ethoxy, propoxy and butoxy. The acyloxy groups include, for example, acetoxy. The halogen atoms include, for example, chlorine, bromine, fluorine and iodine.

The substituent group which may be contained in the saturated, unsaturated and alicyclic aliphatic hydrocarbon groups represented by $R_6$ to $R_{10}$ is preferably an electron attractive group such as fluorine, chlorine, nitro, cyano, alkoxycarbonyl, acyloxy or acyl, and particularly preferably fluorine.

The rings formed by combining two of $R_1$ to $R_3$ with each other include, for example, a ring of 3 to 6 carbon atoms containing one sulfur atom.

The rings formed by combining $R_4$ and $R_5$ with each other include, for example, a ring of 3 to 6 carbon atoms containing one iodine atom.

The rings formed by combining $R_6$ and $R_7$ with each other include, for example, a ring of 3 to 6 carbon atoms containing one nitrogen atom and two sulfur atoms.

The rings formed by combining two of $R_8$ and RIO with each other include, for example, a ring of 3 to 6 carbon atoms containing two sulfur atoms.

The compound represented by formula (Ia) or (I') may be a structure in which two cations are combined with each other through a sulfur atom.

The compound represented by formula (Ia), (IIb), (I') or (II') is added usually in an amount of 0.001% to 30%by weight, preferably in an amount of 0.3% to 20% by weight, and more preferably in an amount of 0.5% to 10% by weight, based on the solid content contained in the composition. When the compound is added in an amount of less than 0.001% by weight, the effect of the invention is not sufficiently achieved in some cases. On the other hand, exceeding 30% by weight results in a tendency of profiles to deteriorate, which causes the resolution performance to deteriorate.

The compound represented by formula (Ia), (IIb), (I') or (II') can be synthesized, for example, by the salt exchange of a salt having a corresponding anion and a salt having a corresponding cation (for example, a sulfonium bromide salt).

Specific examples of the compounds represented by formula (Ia) or (IIb) are exemplified below, but the invention is not limited thereto.

[Ia-1]
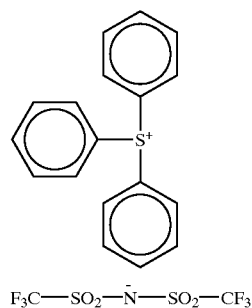
$F_3C-SO_2-\bar{N}-SO_2-CF_3$

[Ia-2]
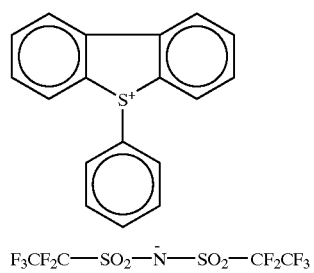
$F_3CF_2C-SO_2-\bar{N}-SO_2-CF_2CF_3$

[Ia-3]
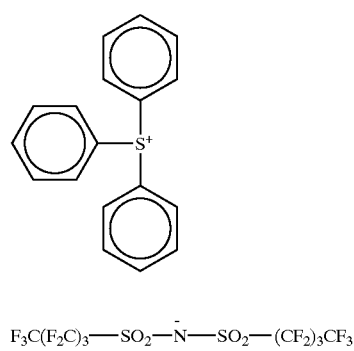
$F_3C(F_2C)_3-SO_2-\bar{N}-SO_2-(CF_2)_3CF_3$

[Ia-4]
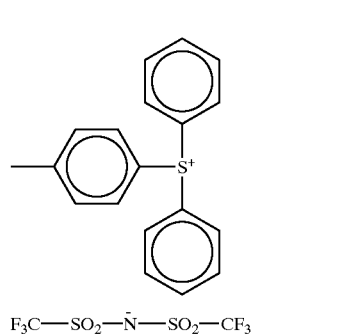
$F_3C-SO_2-\bar{N}-SO_2-CF_3$

[Ia-5]
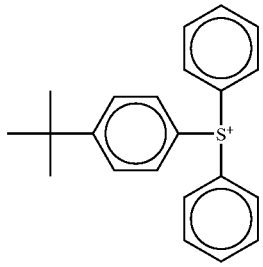
$F_3C(F_2C)_3-SO_2-\bar{N}-SO_2-(CF_2)_3CF_3$

[Ia-6]
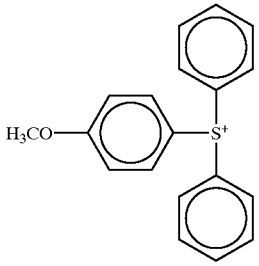
$F_3C-SO_2-\bar{N}-SO_2-(CF_2)_3CF_3$

[Ia-7]
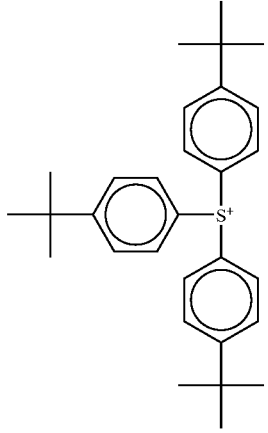
$H_3CH_2C-SO_2-\bar{N}-SO_2-(CF_2)_3CF_3$

[Ia-8]
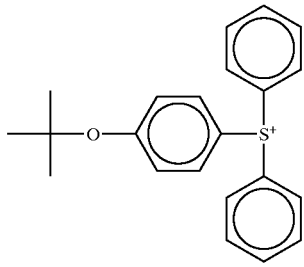

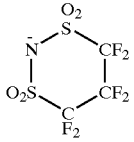

-continued
[Ia-9]
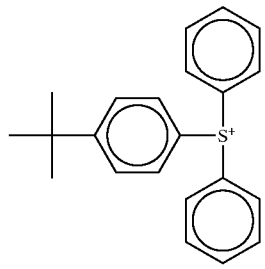
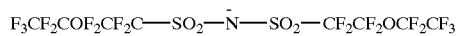
[Ia-10]
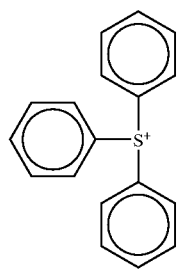
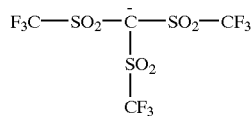
[Ia-11]
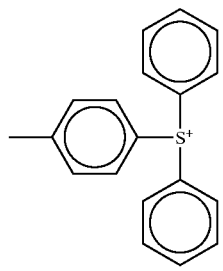
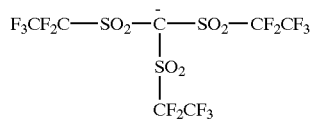
[Ia-12]
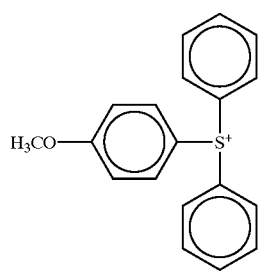
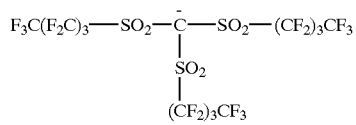
-continued
[Ia-13]
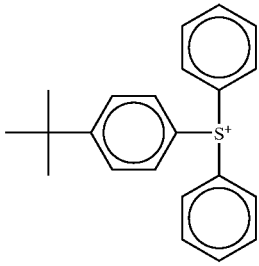
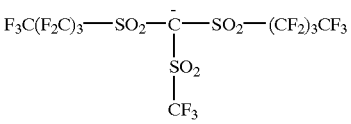
[Ia-14]
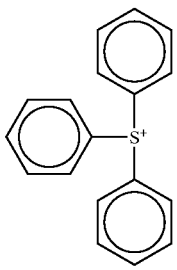
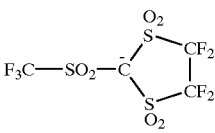
[Ia-15]
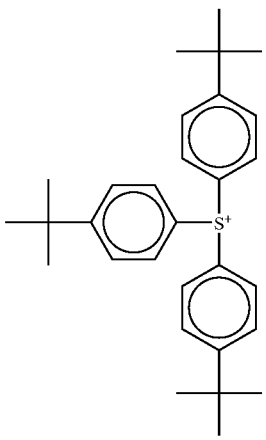
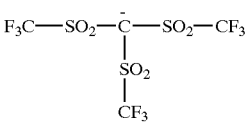

[Ia-16]
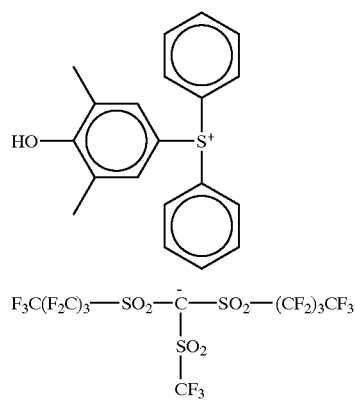
[Ia-17]
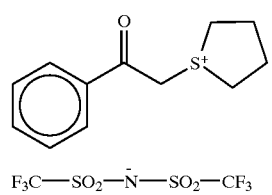
[Ia-18]
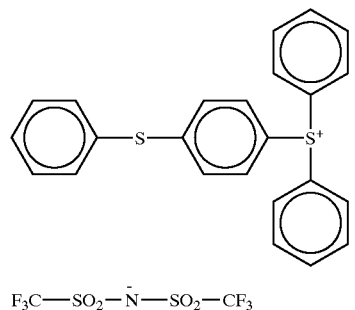
[Ia-19]
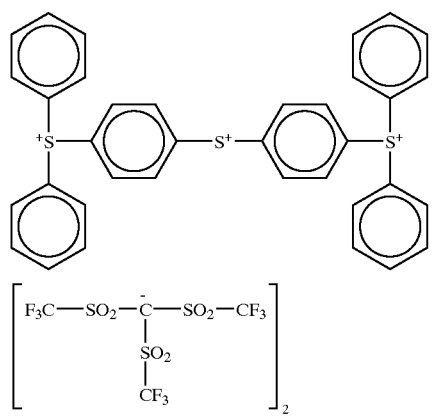
[Ia-20]
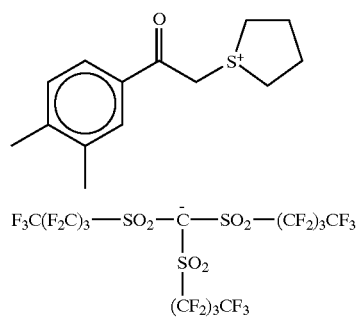
[Ia-21]
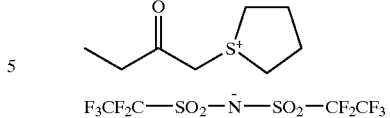
[Ia-22]
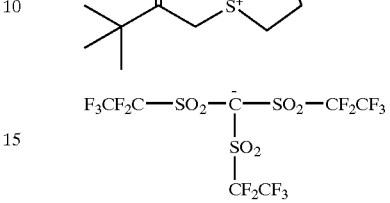
[Ia-23]
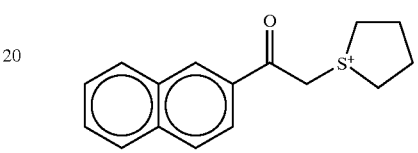
[IIb-1]
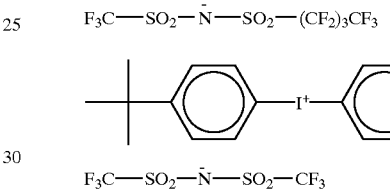
[IIb-2]
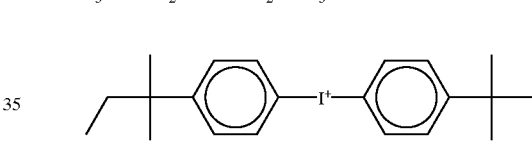
[IIb-3]
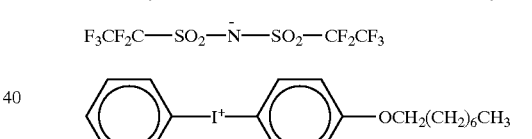
[IIb-4]
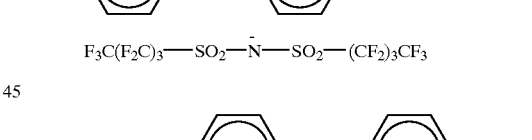
[IIb-5]
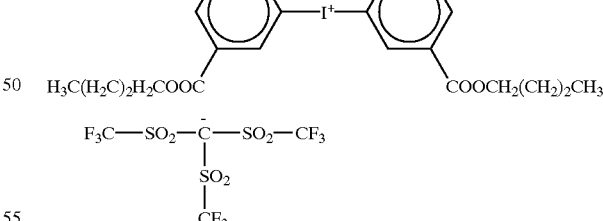
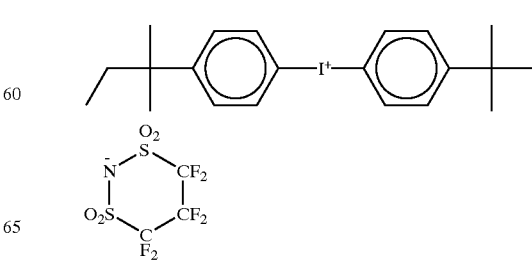

[IIb-6]
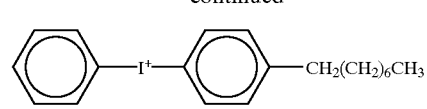

[IIb-7]
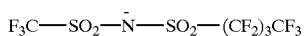
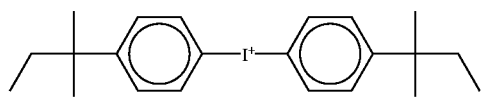

[IIb-8]
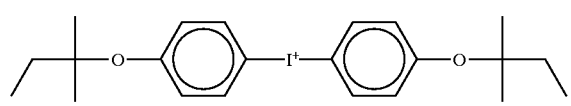

[IIb-9]
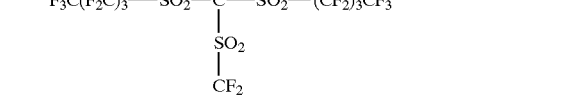
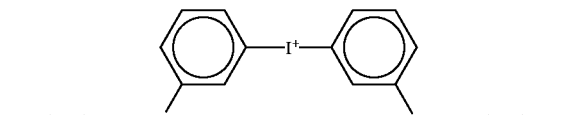

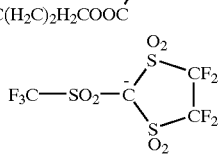

In the invention, another photoacid generating agent may be used together with the compound represented by formula (Ia), (IIb), (I') or (II').

The photoacid generating agent which may be used together is added usually in an amount of 2000% by weight or less, preferably in an amount of 1500% by weight or less, and particularly preferably in an amount of 1000% by weight or less, based on the total amount of the compound represented by formula (Ia), (IIb), (I') or (II').

As the photoacid generating agents which may be used together in the invention, there can be appropriately selected for use photoinitiators for cationic photo-polymerization, photoinitiators for radical photo-polymerization, photodecolorizing agents and photodiscoloring agents for dyes, or compounds generating acids with known light used in microresists (ultraviolet rays of 400 nm to 200 nm, far ultraviolet rays, particularly preferably g-rays, h-rays, i-rays and KrF eximer laser beams), ArF eximer laser beams, electron beams, X-rays, molecular beams or ion beams, and mixtures thereof.

The other photoacid generating agents which may be used together in the invention include, for example, an onium ion such as a diazonium salt, an ammonium salt, a phosphonium salt, an iodonium salt, a sulfonium salt, a selenonium or an arsonium salt, an organic halogen compound, an organic metal/organic halide, an o-nitrobenzyl protective group-containing photoacid generating agent, a compound generating a sulfonic acid by photolysis represented by an iminosulfonate, a disulfone compound, a diazoketosulfone compound and a diazodisulfone compound.

Further, compounds can be used in which these groups or compounds generating acids with light are introduced into main chains or side chains of the polymers.

Furthermore, compounds generating acids with light can also be used which are described in V. N. R. Pillai, *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

Of the above-mentioned compounds which are decomposable by irradiation of actinic ray or radiation to generate acids, compounds particularly effectively used are described below.

(1) Oxazole derivatives substituted by trihalomethyl groups, which are represented by the following formula (PAG1), or S-triazine derivatives represented by the following formula (PGA2):

(PAG1)
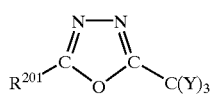

(PAG2)
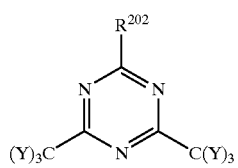

wherein $R^{201}$ represents an unsubstituted or substituted aryl or alkenyl group; $R^{202}$ represents an unsubstituted or substituted aryl, alkenyl or alkyl group, or $—C(Y)_3$; and Y represents a chlorine atom or a bromine atom.

Specific examples thereof include but are not limited to the following compounds:

(PAG1-1)
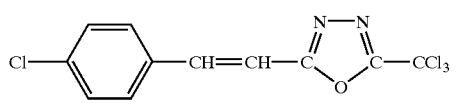

(PAG1-2)
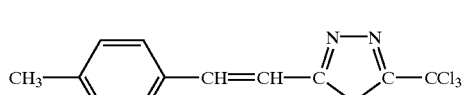

(PAG1-3)
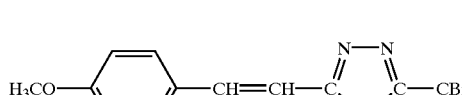

(PAG1-4)
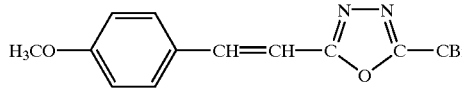

(PAG1-5)
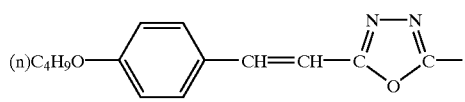

-continued
(PAG1-6)
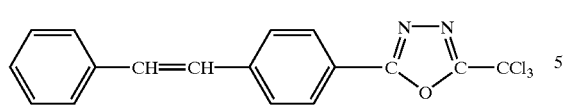
(PAG1-7)
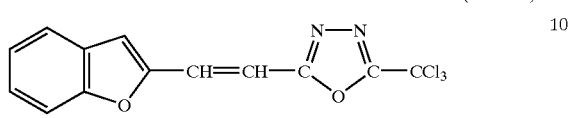
(PAG1-8)
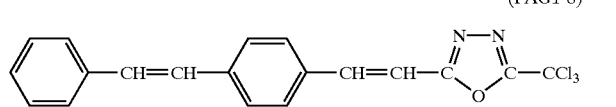
(PAG2-1)
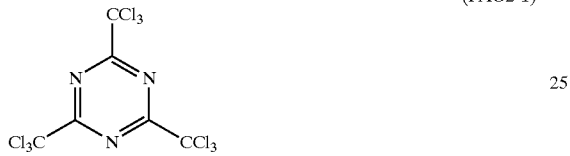
(PAG2-2)
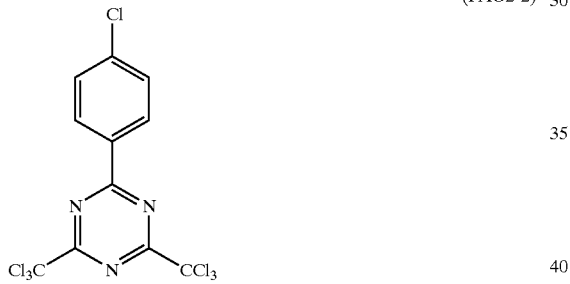
(PAG2-3)
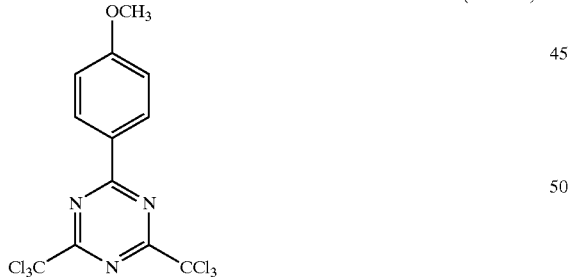
(PAG2-4)
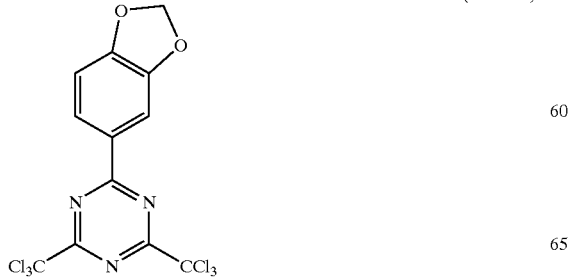
-continued
(PAG2-5)
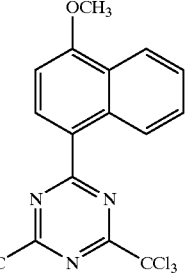
(PAG2-6)
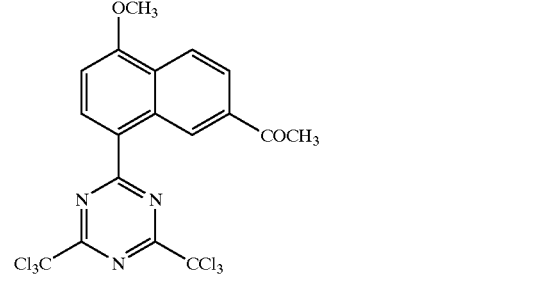
(PAG2-7)
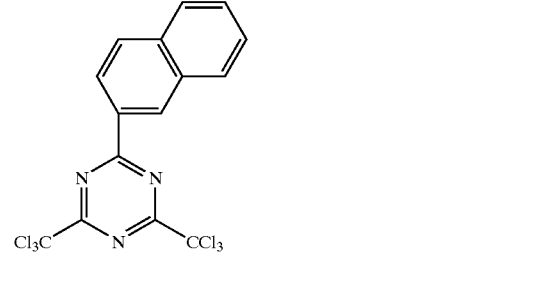
(PAG2-8)
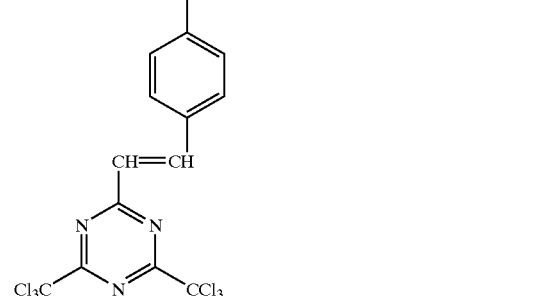
(PAG2-9)
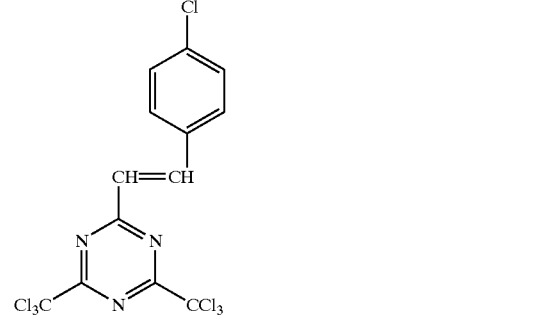

-continued (PAG2-10)

(2) Iodonium salts represented by the following formula (PAG3) or sulfonium salts represented by the following formula (PAG4):

$$\begin{array}{c} Ar^1 \\ \phantom{Ar^1}\diagdown \\ \phantom{Ar^1}\phantom{\diagdown}I^{\oplus} \quad Z^{\ominus} \\ \phantom{Ar^1}\diagup \\ Ar^2 \end{array} \quad (PAG3)$$

$$\begin{array}{c} R^{203} \\ \phantom{R^{203}}\diagdown \\ R^{204}\!-\!S^{\oplus} \quad Z^{\ominus} \\ \phantom{R^{204}\!-\!}\diagup \\ R^{205} \end{array} \quad (PAG4)$$

wherein $Ar^1$ and $Ar^2$ each independently represents an unsubstituted or substituted aryl group.

$R^{203}$, $R^{204}$ and $R^{205}$ each independently represents an unsubstituted or substituted alkyl or aryl group.

$Z^-$ represents a counter ion, and examples thereof include but are not limited to, $BF_4^-$, $AsF_6^-$, $PF_6^-$, $SbF_6^-$, $SiF6^{2-}$, $ClO_4^-$, a perfluoroalkanesulfonic acid anion such as $CF_3SO_3^-$, a pentafluorobenzenesulfonic acid anion, a condensed polynuclear aromatic sulfonic acid anion such as a naphthalene-1-sulfonic acid anion, an anthraquinone-sulfonic acid anion and a sulfonic acid group-containing dye.

Two of $R^{203}$, $R^{204}$ and $R^{205}$, and $Ar_1$ and $Ar_2$ may combine with each other through a single bond or a substituent group.

Specific examples thereof include but are not limited to the following compounds:

(PAG3-1)

(PAG3-2)

(PAG3-3)

(PAG3-4)

(PAG3-5)

(PAG3-6)

(PAG3-7)

(PAG3-8)

(PAG3-9)

(PAG3-10)

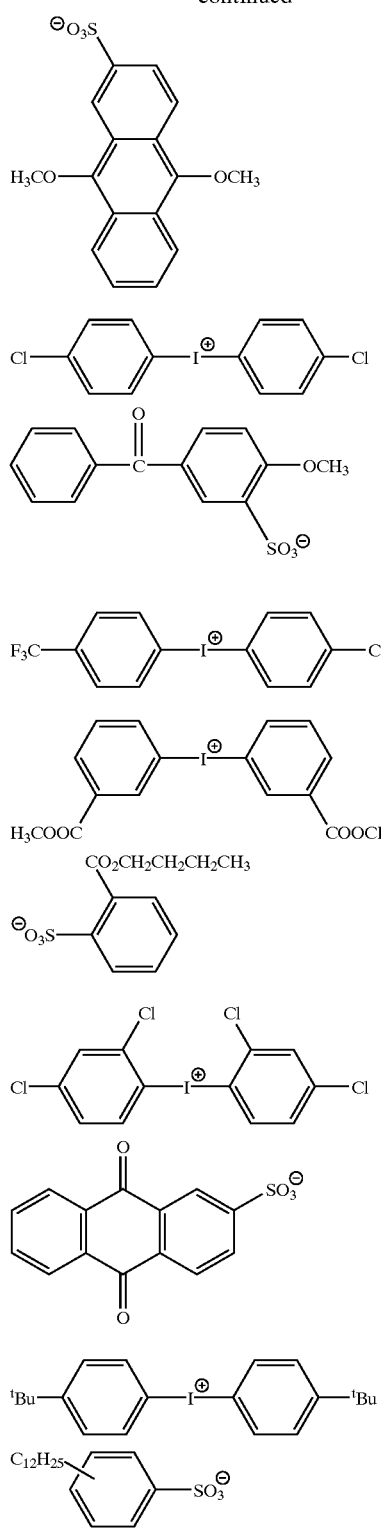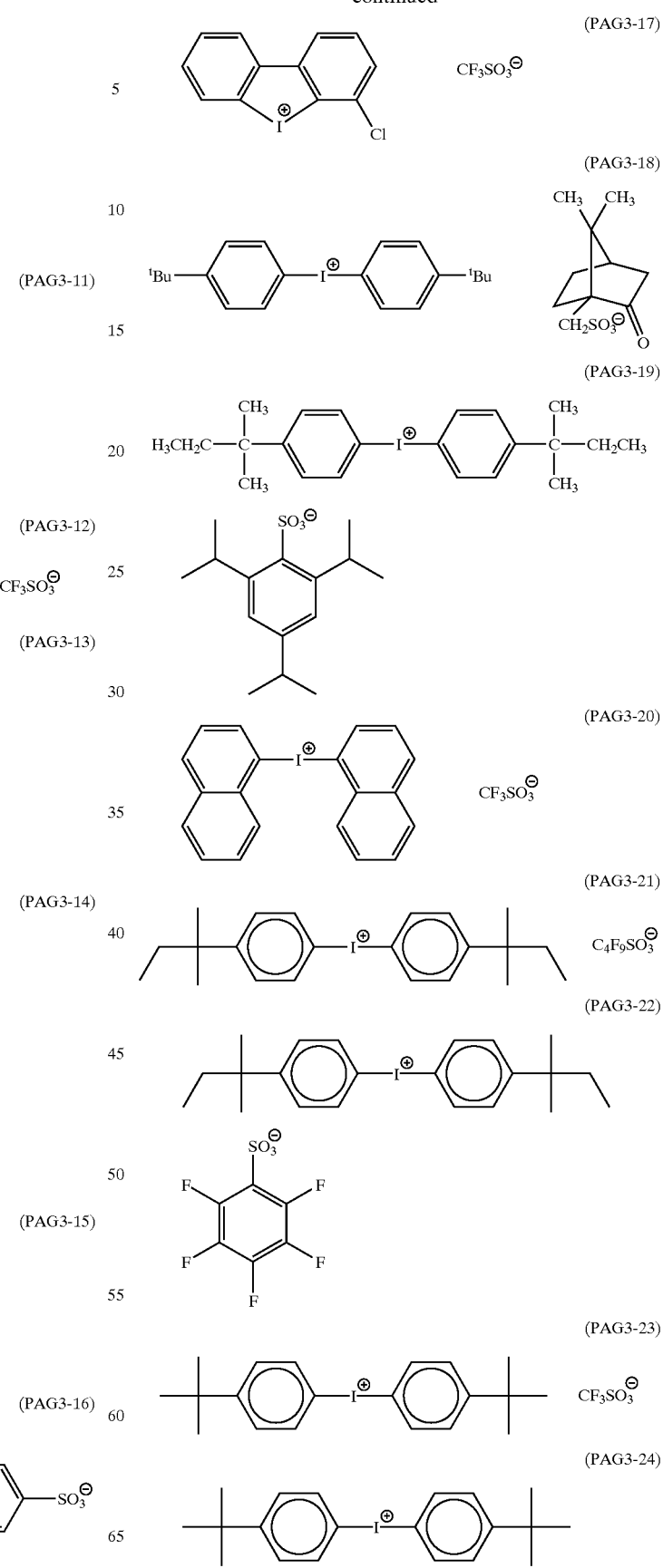

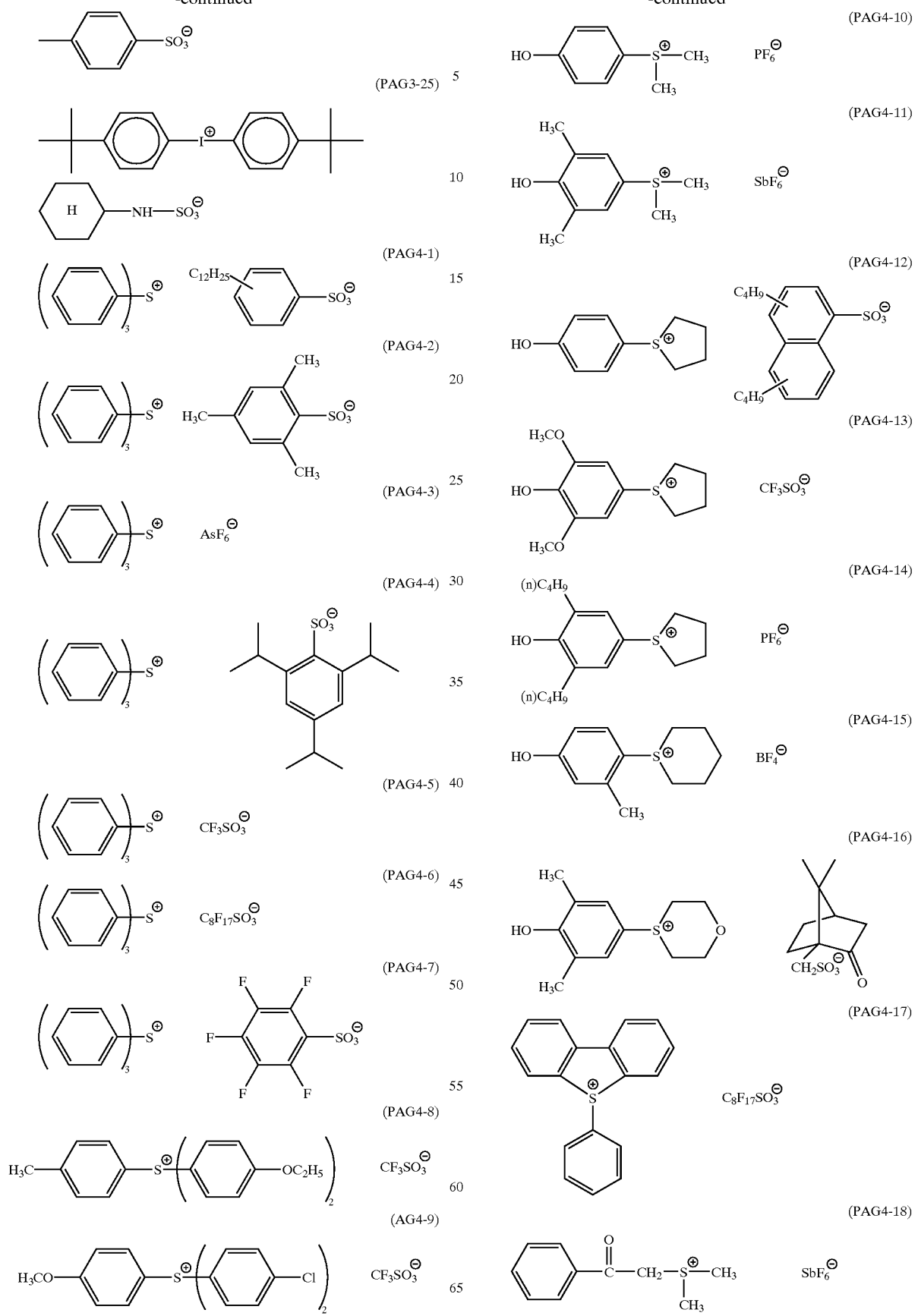

-continued
(PAG4-19)
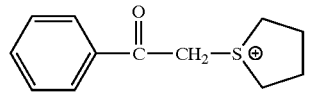
(PAG4-20)
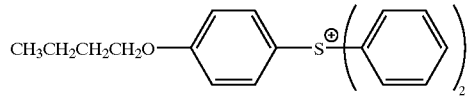
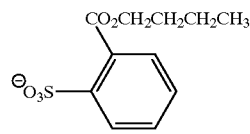
(PAG4-21)
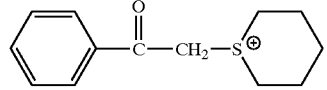
(PAG4-22)
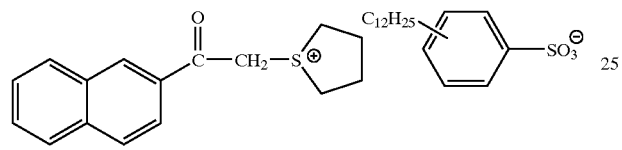
(PAG4-23)
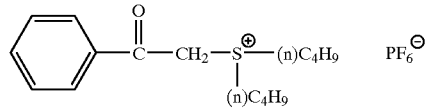
(PAG4-24)
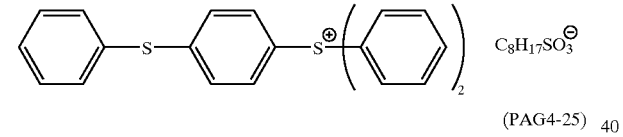
(PAG4-25)
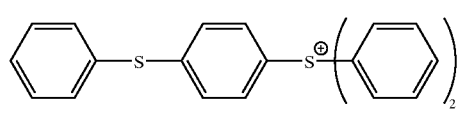
(PAG4-26)
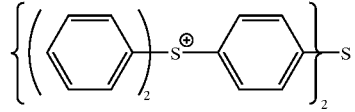
(PAG4-27)
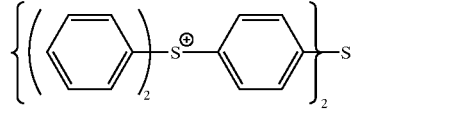
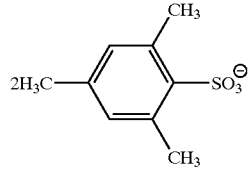
-continued
(PAG4-28)
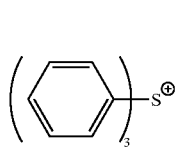 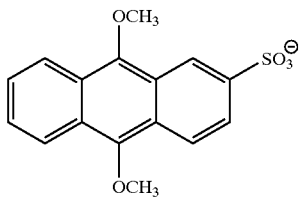
(PAG4-29)
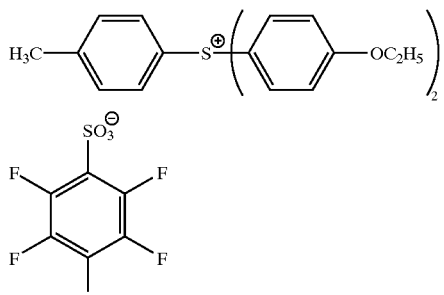
(PAG4-30)
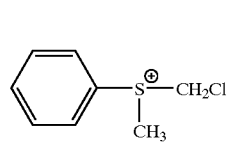 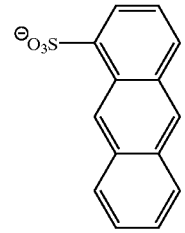
(PAG4-31)
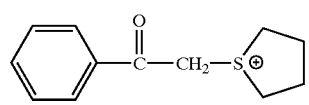 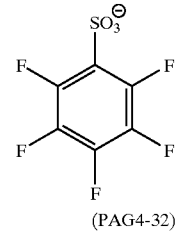
(PAG4-32)
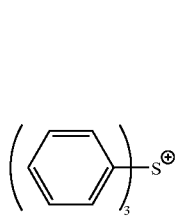 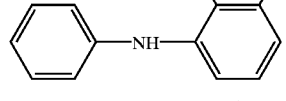
(PAG4-33)
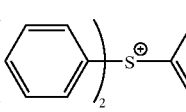 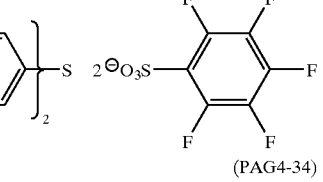
(PAG4-34)
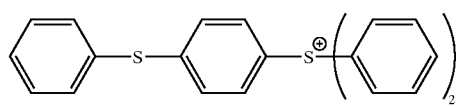

-continued

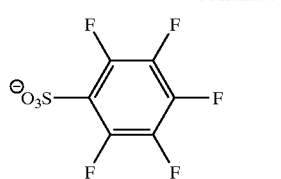
(PAG4-35)

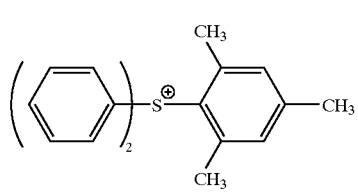
(PAG4-36)

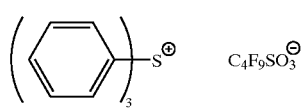
PAG4-37

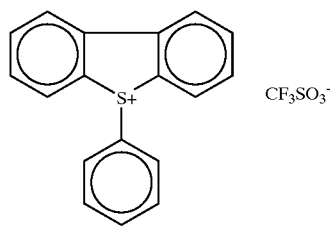
(PAG4-38)

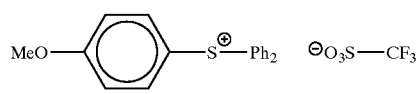
(PAG4-39)

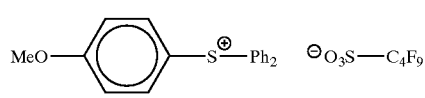
(PAG4-40)

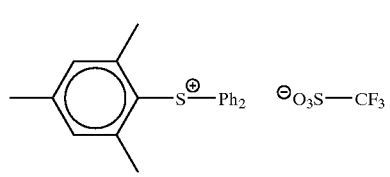
(PAG4-41)

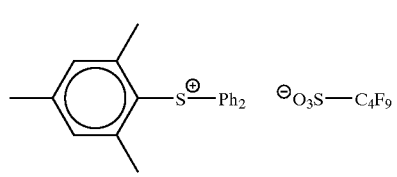
(PAG4-42)

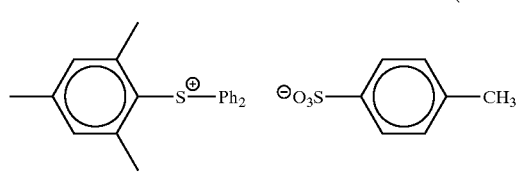
(PAG4-43)

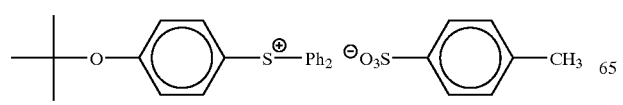

-continued

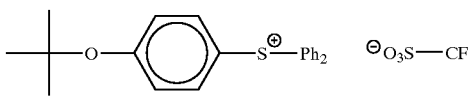
(PAG4-44)

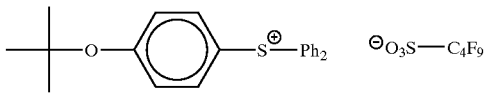
(PAG4-45)

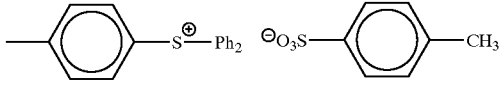
(PAG4-46)

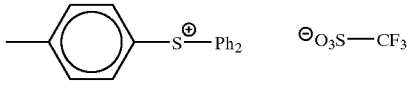
(PAG4-47)

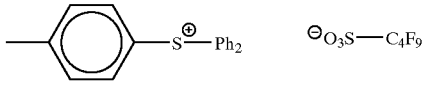
(PAG4-48)

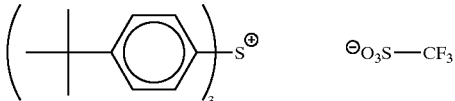
(PAG4-49)

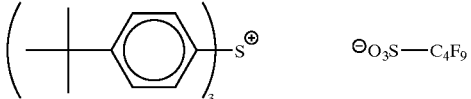
(PAG4-50)

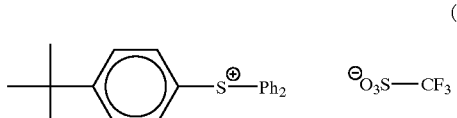
(PAG4-51)

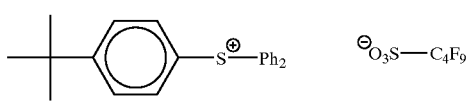
(PAG4-52)

In the above, Ph represents a phenyl group. The above-mentioned onium salts represented by formulas (PAG3) and (PAG4) are known, and can be synthesized, for example, by methods described in U.S. Pat. Nos. 2,807,648 and 4,247,473, and Japanese Patent (Application) Laid Open No. 101331/1978.

(3) Disulfone derivatives represented by the following formula (PAG5) or iminosulfonate derivatives represented by the following formula (PAG6):

$$Ar^3-SO_2-SO_2-Ar^4 \quad \text{(PAG5)}$$

(PAG6)

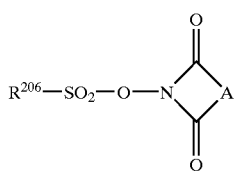

wherein Ar³ and Ar⁴ each independently represents an unsubstituted or substituted aryl group; $R^{206}$ represents an unsubstituted or substituted alkyl or aryl group; and A represents an unsubstituted or substituted alkylene, alkenylene or arylene group.

Specific examples thereof include but are not limited to the following compounds:

(PAG5-1)
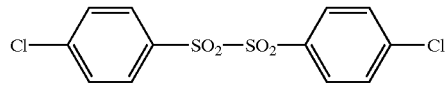

(PAG5-2)
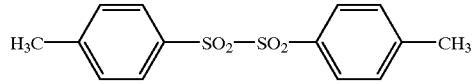

(PAG5-3)
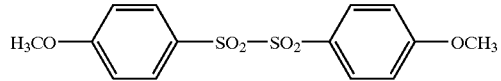

(PAG5-4)
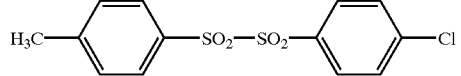

(PAG5-5)
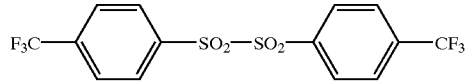

(PAG5-6)
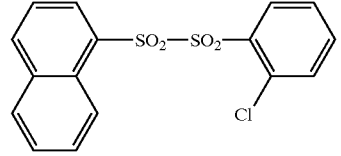

(PAG5-7)
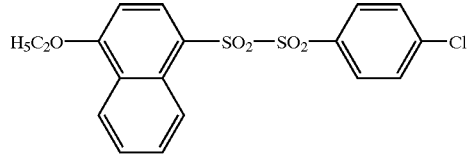

(PAG5-8)
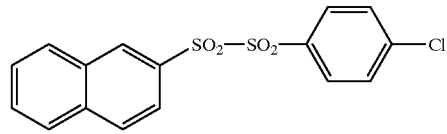

(PAG5-9)
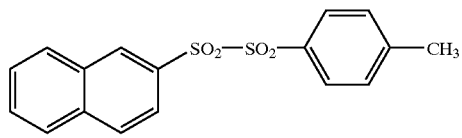

(PAG5-10)
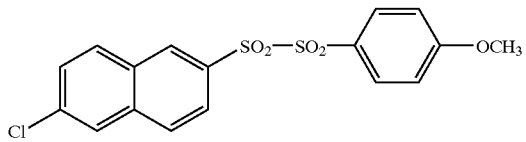

(PAG5-11)
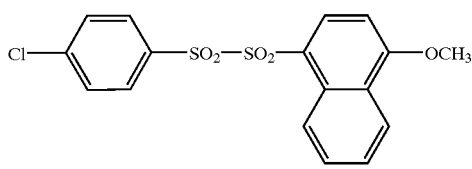

(PAG5-12)
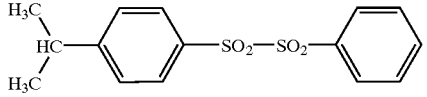

(PAG5-13)
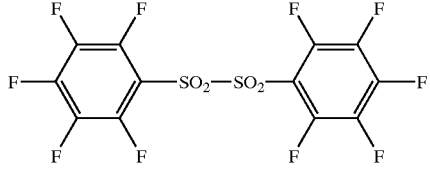

(PAG5-14)
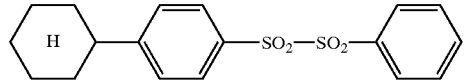

(PAG5-15)
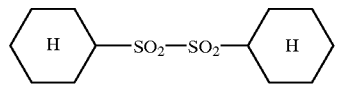

(PAG6-1)
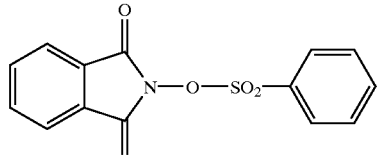

(PAG6-2)
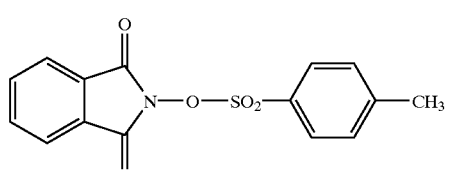

(PAG6-3)
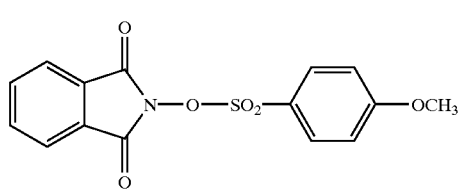

-continued
(PAG6-4)
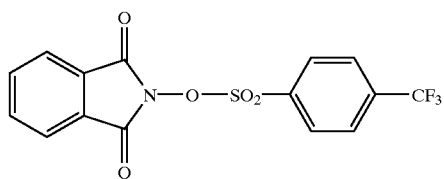
(PAG6-5)
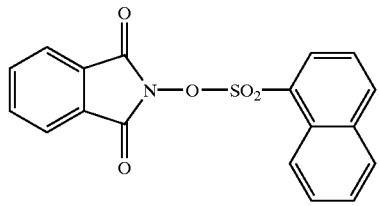
(PAG6-6)
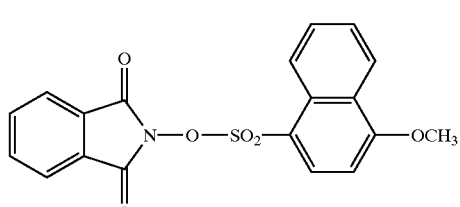
(PAG6-7)
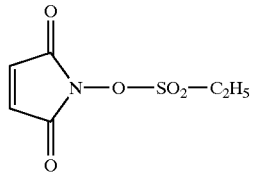
(PAG6-8)
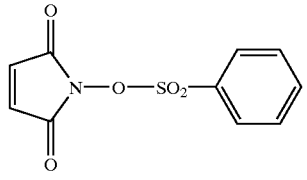
(PAG6-9)
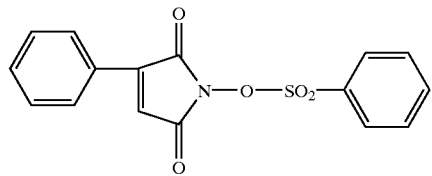
(PAG6-10)
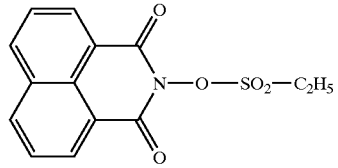
(PAG6-11)
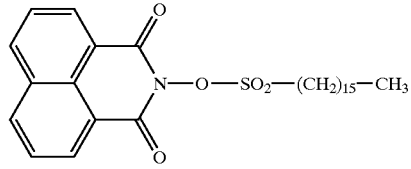
-continued
(PAG6-12)
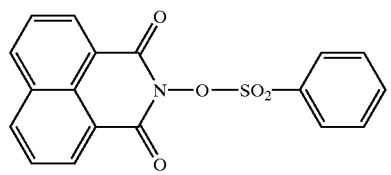
(PAG6-13)
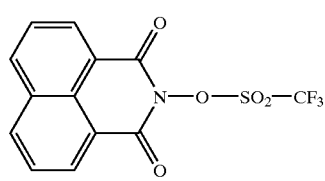
(PAG6-14)
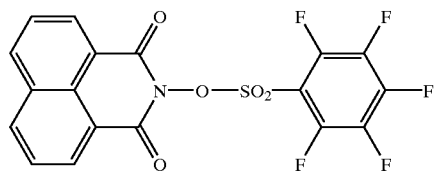
(PAG6-15)
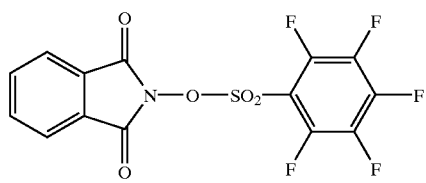
(PAG6-16)
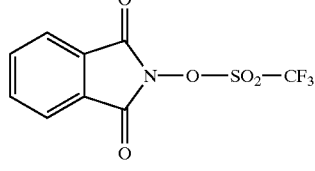
(PAG6-17)
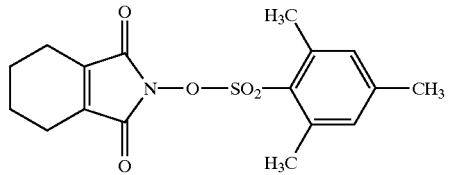
(PAG6-18)
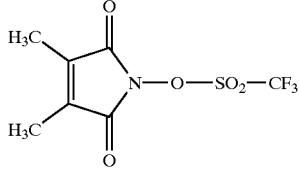
(PAG6-19)
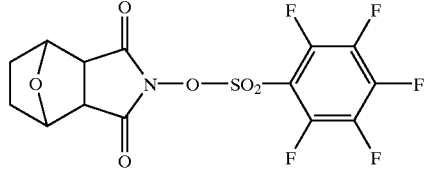

-continued
(PAG6-20) 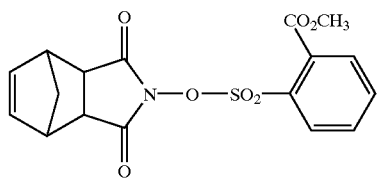
(PAG6-21) 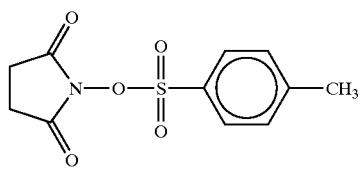
(PAG6-22) 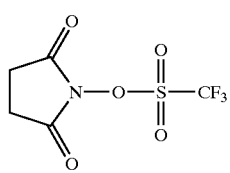
(PAG6-23) 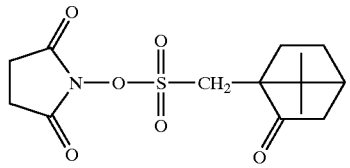
(PAG6-24) 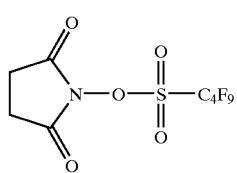
(PAG6-25) 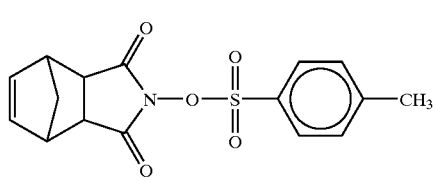
(PAG6-26) 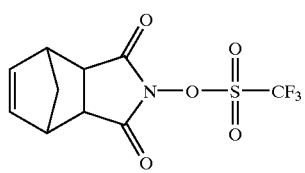
(PAG6-27) 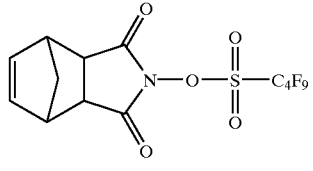
(PAG6-28) 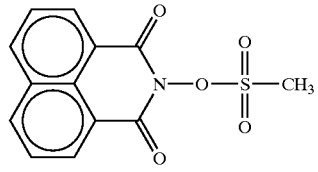
-continued
(PAG6-29) 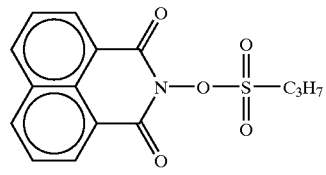
(PAG6-30) 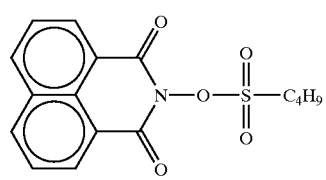
(PAG6-31) 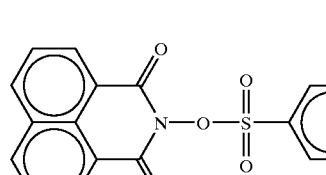
(PAG6-32) 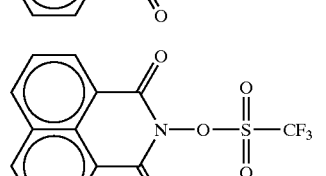
(PAG6-33) 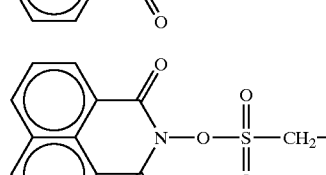
(PAG6-34) 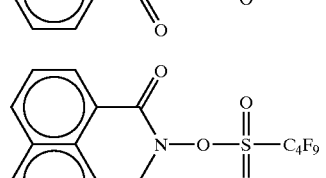
(4) Diazodisulfone derivatives represented by the following formula (PAG7):
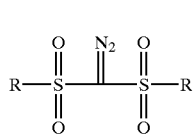 (PAG7)
wherein R represents a straight-chain, branched or cyclic alkyl group, or an aryl group which may be substituted.
Specific examples thereof include but are not limited to the following compounds:
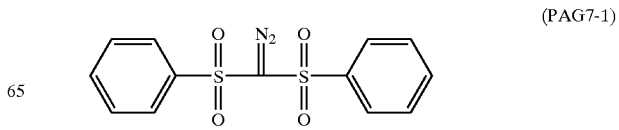 (PAG7-1)

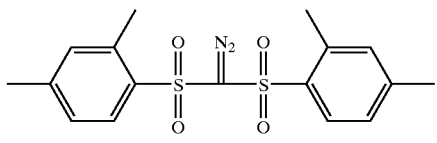 (PAG7-2)

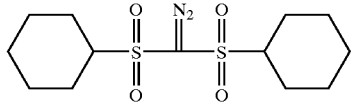 (PAG7-3)

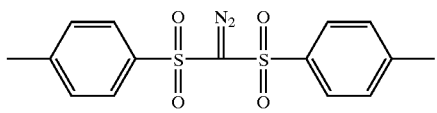 (PAG7-4)

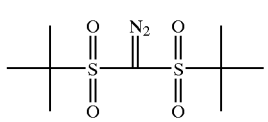 (PAG7-5)

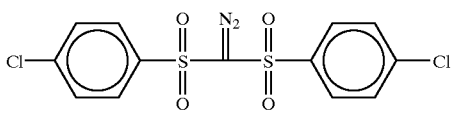 (PAG7-6)

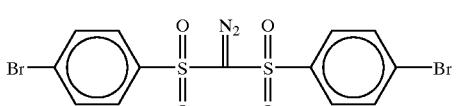 (PAG7-7)

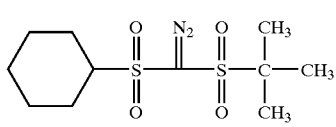 (PAG7-8)

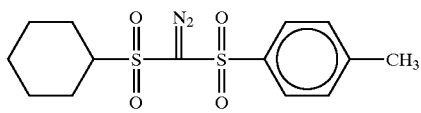 (PAG7-9)

[3] Other Additives

The positive-working resist composition of the invention may further contain a compound for preventing acid-decomposable dissolution, a dye, a plasticizer, a surf actant, a photosensitizer, an organic basic compound and a compounds for enhancing the solubility in a developing solution, as needed.

The positive-working resist composition of the invention preferably contains (C) a fluorine and/or silicone surf actant.

It is preferred that the positive-working resist composition of the invention contains any one of a fluorine surfactant, a silicone surfactant and a surf actant containing both one or more fluorine atoms and one or more silicon atoms, or two or more of them.

The positive-working resist composition of the invention contains the above-mentioned acid-decomposable resin and the above-mentioned surfactant, thereby further improving the development defects. This is particularly effective when the line width of patterns is thinner.

These surfactants include, for example, surfactants described in Japanese Patent (Application) Laid Open Nos. 36663/1987, 226746/1986, 226745/1986, 170950/1987, 34540/1988, 230165/1995, 62834/1996, 54432/1997 and 5988/1997, and U.S. Pat. Nos. 5,405,720, 5,360,692, 5,529, 881, 5,296,330, 5,436,098, 5,576,143, 5,294,511 and 5,824,451. The following commercially available surfactants can also be used as such. The commercially available surfactants which can be used include, for example, fluorine surfactants or silicone surfactants such as Eftop EF301 and EF303 (manufactured by Shin Akita Kasei Co., Ltd.), Florard FC430 and FC431 (manufactured by Sumitom 3M Ltd.), Megafac F171, F173, F176, F189 and R08 (manufactured by Dainippon Ink & Chemicals Inc.), Surflon S-382, SC101, SC102, SC103, SC104, SC105 and SC106 (manufactured by Asahi Glass Co., Ltd.) and Torysol S-366 (manufactured by Troy Chemical Co., Ltd.). Further, Polysiloxane Polymer KP-341 (manufactured by Shin-Etsu Chemical Co., Ltd.) can also be used as a silicone surfactant.

The amount of the surfactant added is usually from 0.001% to 2% by weight, and preferably from 0.01% to 1% by weight, based on the solid content in the composition of the invention.

These surfactants may be added either alone or as a combination of some of them.

In addition to the above, specific examples of the surfactants which can be used include nonionic surfactants such as polyoxyethylene alkyl ethers such as polyoxyethylene lauryl ether, polyoxyethylene stearyl ether, polyoxyethylene cetyl ether and polyoxyethylene oleyl ether; polyoxyethylene alkyl allyl ethers such as polyoxyethylene octyl phenol ether and polyoxyethylene nonyl phenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of these surfactants added is usually 2 parts by weight or less, and preferably 1 part by weight or less, per 100 parts by weight of the solid content in the composition of the invention.

The organic basic compound which can be preferably used in the invention is a compound stronger in basicity than phenol. Above all, a nitrogen-containing basic compound is preferred.

 (A)

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or an unsubstituted or substituted aryl group, wherein $R^{251}$ and $R^{252}$ may combine with each other to form a ring.

(B)

(C)

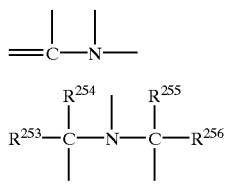

wherein $R^{253}$, $R^{254}$, $R^{255}$, and $R^{256}$, which may be the same or different, each represents an alkyl group having 1 to 6 carbon atoms.

The nitrogen-containing basic compound is more preferably a compound having two or more nitrogen atoms different in chemical environment, and particularly preferred is a compound having both an unsubstituted or substituted amino group and a nitrogen atom-containing ring structure, or a compound having an alkylamino group. Preferred examples thereof include unsubstituted or substituted guanidine, unsubstituted or substituted aminopyridine, an unsubstituted or substituted aminoalkylpyridine, unsubstituted or substituted aminopyrrolidine, unsubstituted or substituted indazole, unsubstituted or substituted pyrazole, unsubstituted or substituted pyrazine, unsubstituted or substituted pyrimidine, unsubstituted or substituted purine, unsubstituted or substituted imidazoline, unsubstituted or substituted pyrazoline, unsubstituted or substituted piperazine, unsubstituted or substituted aminomorpholine and an unsubstituted or substituted aminoalkylmorpholine. Preferred substituent groups are an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

Preferred specific examples of the nitrogen-containing basic compounds include but are not limited to, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0] undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, a tertiary morpholine derivative such as cyclohexylmorpholinoethylthiourea (CHMETU) and hindered amines described in Japanese Patent (Application) Laid Open No. 52575/1999 (for example, ones described in paragraph number [0005]).

Particularly preferred specific examples thereof include 1,5-diazabicyclo[4.3.0]nona-5-ene, 1,8-diazabicyclo[5.4.0] undeca-7-ene, 1,4-diazabicyclo[2.2.2]octane, 4-dimethylaminopyridine, hexamethylenetetramine, 4,4-dimethylimidazoline, pyrrole and derivatives thereof, pyrazole and derivatives thereof, imidazole and a derivative thereof, pyridazine and a derivative thereof, pyrimidine and a derivative thereof, a tertiary morpholine derivative such as CHMETU, and a hindered amine such as bis(1,2,2,6,6-pentamethyl-4-piperidyl) sebacate.

Above all, preferred are 1,5-diazabicyclo[4.3.0]-nona-5-ene, 1,8-diazabicyclo[5.4.0]undeca-7-ene, 1,4-diazabicyclo [2.2.2]octane, 4-dimethylaminopyridine, hexamethylenetetramine, CHMETU and bis(1,2,2,6,6-pentamethyl-4-piperidyl) sebacate.

These nitrogen-containing basic compounds are used alone or as a combination of two or more of them. The amount of the nitrogen-containing basic compound used is usually from 0.001% to 10% by weight, and preferably form 0.01% to 5% by weight, based on the solid content of the whole photosensitive resin composition. Less than 0.001% by weight does not give the effects of the invention, whereas exceeding 10% by weight results in a tendency of the sensitivity to decrease and a tendency of the development properties of non-exposed areas to deteriorate.

The composition of the invention is dissolved in a solvent dissolving each component described above, and applied onto a support. As the solvents used herein, preferred are ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidinone and tetrahydrofuran. These solvents are used either alone or as a mixture thereof.

Of the above, preferred examples of the solvents include propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidinone and tetrahydrofuran.

Such a positive-working photoresist composition of the invention is applied onto a substrate to form a thin film. The thickness of the coating film is preferably from 0.2 μm to 1.2 μm.

Inorganic substrates which can be used in the invention include an ordinary bare Si substrate, an SOG substrate and a substrate having an inorganic antireflection film described below.

In the invention, a commercially available inorganic or organic antireflection film can be used as needed. As the antireflection film, there can be used an inorganic film composed of titanium, titanium oxide, titanium nitride, chromium oxide, carbon or α-silicon, and an organic film composed of a light absorbing agent and a polymer material. The former requires equipment such as a vacuum deposition apparatus, a CVD apparatus or a sputtering apparatus. The organic antireflection films include, for example, a film comprising a condensate of a diphenylamine derivative and a formaldehyde-modified melamine resin, an alkali-soluble resin and a light absorbing agent, which is described in Japanese Patent Publication No. 69611/1995, a reaction product of a maleic anhydride copolymer and diamine type light absorbing agent, which is described in U.S. Pat. No. 5,294,680, a film containing a resin binder and a methylolmelamine heat crosslinking agent, which is described in Japanese Patent (Application) Laid Open No. 118631/1994, an acrylic resin type antireflection film having a carboxyl group, an epoxy group and a light absorbing group in the same molecule, which is described in Japanese Patent (Application) Laid Open No. 118656/1994, a film comprising methylolmelamine and a benzophenone light absorbing agent, which is described in Japanese Patent (Application) Laid Open No. 87115/1996, and a film comprising a polyvinyl alcohol resin and a low molecular weight light absorbing agent added thereto, which is described in Japanese Patent (Application) Laid Open No. 179509/1996.

Further, as the organic antireflection films, there can also be used a DUV-30 series, a DUV-40 series and ARC25 manufactured by Brewer Science Co., and AC-2, AC-3, AR19 and AR20 manufactured by Shipley Co.

The above-mentioned resist solution is applied onto a substrate (for example, a silicon/silicon dioxide covering) as used for the production of a precision integrated circuit element (onto a substrate provided with the above-mentioned antireflection film as needed) by an appropriate coating method such as a method using a spinner or a coater, followed by exposure through a specified mask, baking and development. Thus, a good resist pattern can be obtained. Exposure light used herein is light having a wavelength of 150 nm to 250 nm or less. Specific examples thereof include a KrF eximer laser beam (248 nm), an ArF eximer laser beam (193 nm), an $F_2$ eximer laser beam (157 nm), X-rays and electron beams.

Developing solutions include an alkaline aqueous solution of an inorganic alkali such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcohol amine such as dimethylethanolamine or triethanolamine; a quaternary ammonium salt such as tetramethylammonium hydroxide or tetraethylammonium hydroxide; or a cyclic amine such as pyrrole or piperidine.

Further, an alcohol and/or a surfactant can also be added in appropriate amounts to the above-mentioned alkaline aqueous solution.

EXAMPLES

The invention will hereinafter be described with reference to examples in more detail below, but the following examples are not intended to limit the scope of the invention.

Example I

Synthesis Example (1)
Synthesis of Resin (1)

Norbornene, maleic anhydride, t-butyl acrylate and 2-methylcyclohexyl-2-propyl acrylate were placed in a reaction vessel at a molar ratio of 35/35/20/10, and dissolved in tetrahydrofuran to prepare a solution having a solid content of 60%. This solution was heated in a stream of nitrogen at 65° C. At the time when the reaction temperature was stabilized, 1 mol % of a radical initiator (V-601, manufactured by Wako Pure Chemical Industries Ltd.) was added to initiate the reaction. After heating for 8 hours, the reaction mixture was diluted twice with tetrahydrofuran, and then, poured into a 5-fold amount of hexane in relation to the volume of the reaction mixture solution to precipitate a white powder. The precipitated powder was collected by filtration, and dissolved in methyl ethyl ketone, followed by reprecipitation with a 5-fold amount of a 1/1 mixed solvent of hexane/t-butyl methyl ether in relation to the volume of the resulting solution. The white powder reprecipitated was collected by filtration and dried to obtain resin (1), a desired product.

The molecular weight analysis of the resulting resin (1) by the GPC method was tried. As a result, the molecular weight of resin (1) was 12100 (weight average) in terms of that of polystyrene. Further, the composition of resin (1) was determined from the NMR spectrum. As a result, the molar ratio of norbornene/maleic anhydride/t-butyl acrylate/2-methylcyclohexyl-2-propyl acrylate of the invention was 32/39/19/10.

Resins (2) to (14) were synthesized in the same manner as with Synthesis Example (1) with the exception that the composition ratio was changed as shown in Table I-1.

The composition ratio and the molecular weight of the above-mentioned resins (2) to (14) are indicated in Table I-1 shown below.

TABLE I-1

| Resin | Monomer of Formula (I) | Monomer of Formula (II) | Monomer of Formula (III) | Mw |
|---|---|---|---|---|
| 2 | 20/15 | 40 | 15/10 | 11900 |
| 3 | 32 | 37 | 20/8/3 | 10500 |
| 4 | 16 | 21 | 36/27 | 13900 |
| 5 | 15 | 22 | 34/29 | 12300 |
| 6 | 17 | 20 | 33/30 | 12400 |
| 7 | 18 | 24 | 32/26 | 13000 |
| 8 | 15 | 19 | 36/30 | 12700 |
| 9 | 15 | 20 | 29/10/26 | 13100 |
| 10 | 17 | 21 | 31/31 | 12800 |
| 11 | 18 | 17/3 | 30/32 | 13300 |
| 12 | 16 | 19 | 31/12/11/11 | 12600 |
| 13 | 20 | 22 | 58 | 14700 |
| 14 | 23 | 28 | 35/14 | 13300 |

Structures of the above-mentioned resins (1) to (14) are shown below:

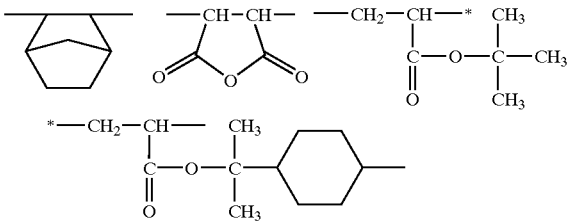

(1)

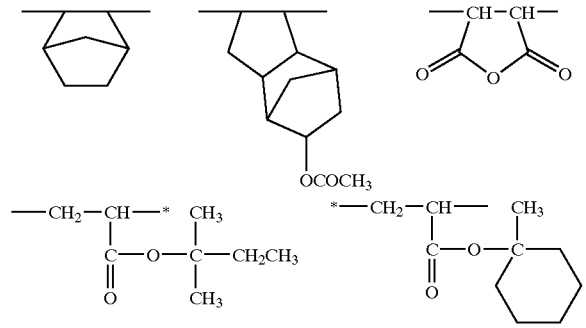

(2)

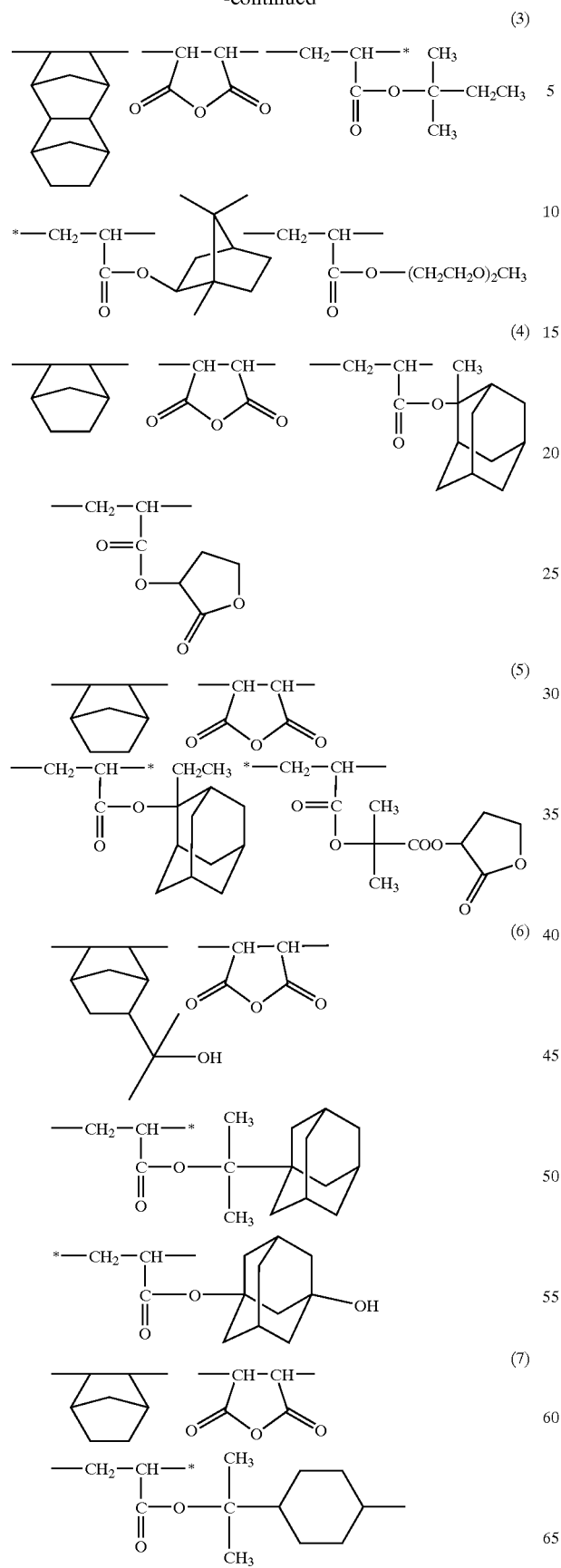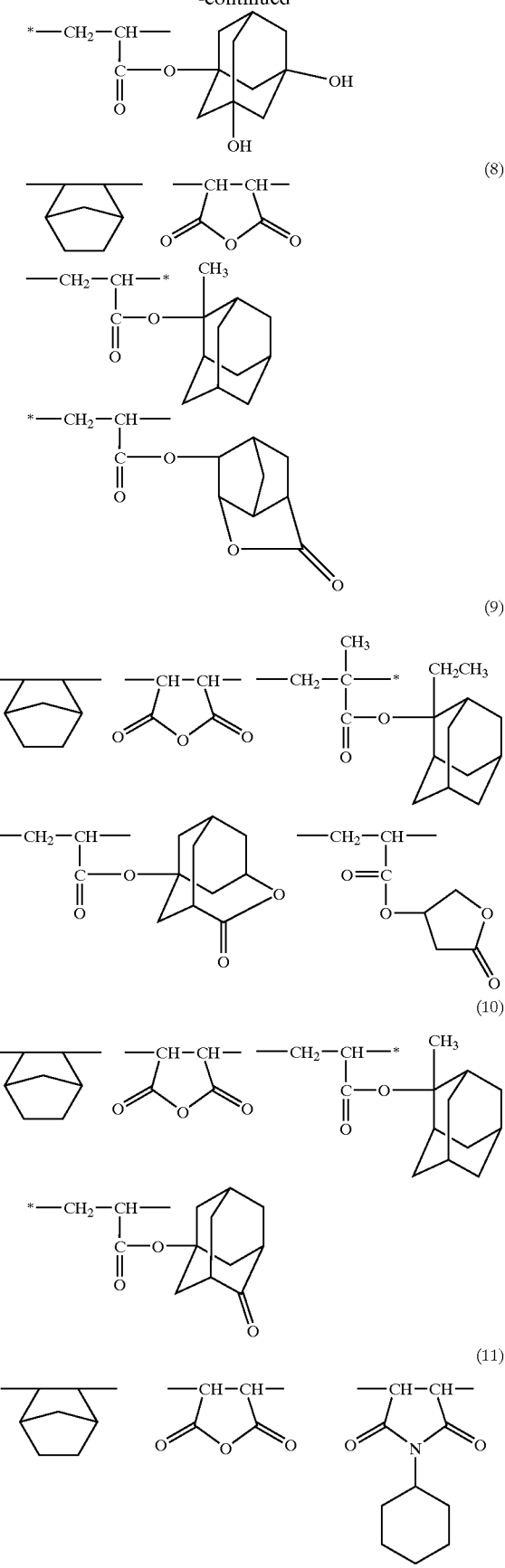

-continued

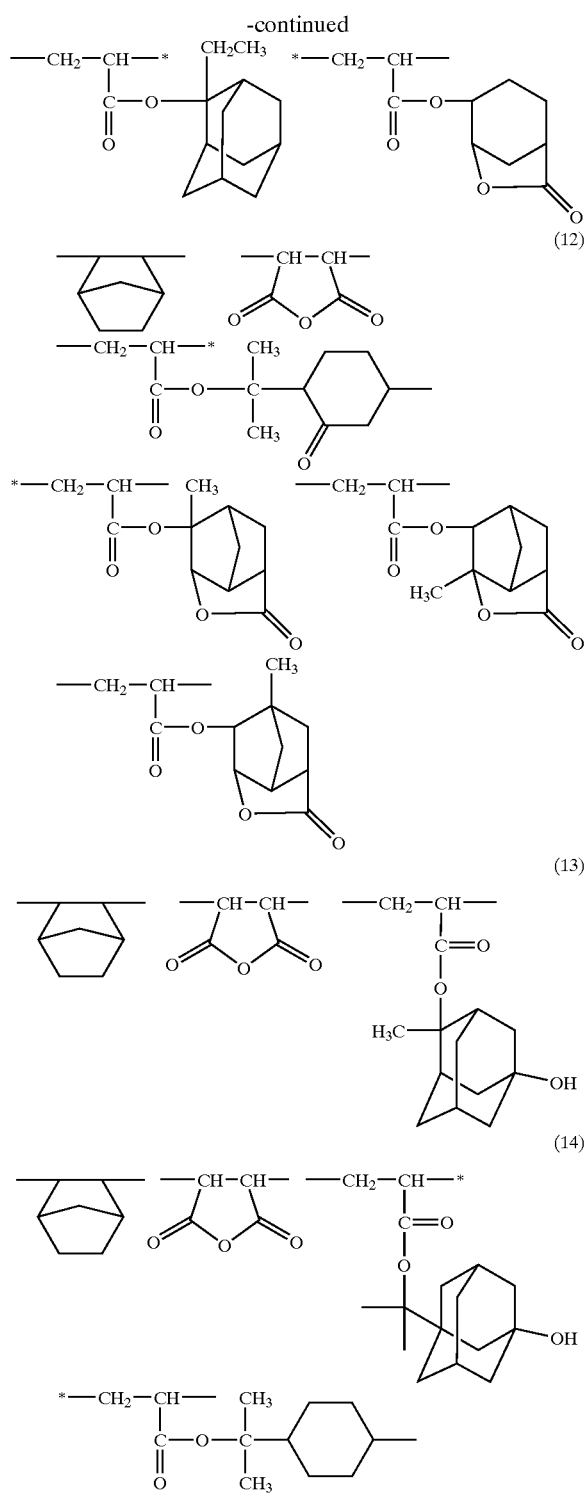

Synthesis Example (2)
Synthesis of Resin (15)

t-Butyl norbornenecarboxylate, maleic anhydride, 2-ethyl-2-adamantyl acrylate and norbornenelactone acrylate were placed in a reaction vessel at a molar ratio of 20/20/35/25, and dissolved in a 1/1 mixed solvent of methyl ethyl ketone/tetrahydrofuran to prepare a solution having a solid content of 60%. This solution was heated in a stream of nitrogen at 65° C. At the time when the reaction temperature was stabilized, 3 mol % of a radical initiator (V-601, manufactured by Wako Pure Chemical Industries Ltd.) was added to initiate the reaction. After heating for 12 hours, the reaction mixture was poured into a 5-fold amount of hexane in relation to the volume of the reaction mixture solution to precipitate a white powder. The precipitated powder was dissolved again in a 1/1 mixed solvent of methyl ethyl ketone/tetrahydrofuran, and poured into a 5-fold amount of hexane/methyl t-butyl ether to precipitate a white powder, which was collected by filtration. This operation was repeated again, followed by drying to obtain resin (15), a desired product.

The molecular weight analysis (RI analysis) of the resulting resin (15) by the GPC method was tried. As a result, the molecular weight of resin (15) was 11600 (weight average) in terms of that of polystyrene, and the amount of residual monomers was 0.4%. Further, the composition of resin (15) was determined from the NMR spectrum. As a result, the molar ratio of norbornene/maleic anhydride/2-methyl-2-adamatyl acrylate/norbornenelactone acrylate of the invention was 18/23/34/25.

Resins (16) to (39) were synthesized in the same manner as with Synthesis Example (2) with the exception that the composition ratio was changed as shown in Table I-2.

The composition ratio and the molecular weight of the above-mentioned resins (16) to (39) are indicated in Table I-1 shown below.

TABLE I-2

| Resin | Monomer of Formula (I) | Monomer of Formula (II) | Monomer of Formula (III) | Mw |
|---|---|---|---|---|
| 16 | 24 | 29 | 31/16 | 12300 |
| 17 | 21 | 28 | 32/29 | 11100 |
| 18 | 22 | 27 | 28/23 | 11300 |
| 19 | 27 | 31 | 24/18 | 10700 |
| 20 | 32 | 38 | 20/10 | 9700 |
| 21 | 31 | 35 | 21/13 | 9200 |
| 22 | 29 | 35 | 20/16 | 8900 |
| 23 | 35 | 39 | 23/3 | 8700 |
| 24 | 28 | 36 | 22/14 | 10600 |
| 25 | 28/8 | 44 | 20 | 9100 |
| 26 | 30/6 | 42 | 22 | 7700 |
| 27 | 46 | 47/3 | 4 | 6300 |
| 28 | 37/6 | 48 | 9 | 6800 |
| 29 | 34/10 | 51 | 5 | 7400 |
| 30 | 41 | 43 | 10/6 | 6700 |
| 31 | 39 | 42 | 11/8 | 8800 |
| 32 | 36 | 42 | 10/12 | 9300 |
| 33 | 39 | 43 | 14/4 | 9800 |
| 34 | 38 | 42 | 15/5 | 9300 |
| 35 | 24 | 27 | 25/24 | 12600 |
| 36 | 19 | 24 | 40/17 | 9500 |
| 37 | 29 | 32 | 34/5 | 10400 |
| 38 | 20 | 25 | 26/5/24 | 13400 |
| 39 | 16 | 24 | 32/24/4 | 12700 |

Structures of the above-mentioned resins (15) to (39) are shown below:

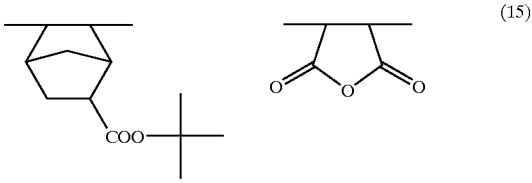

(15)

-continued
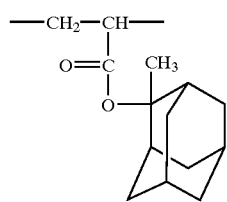 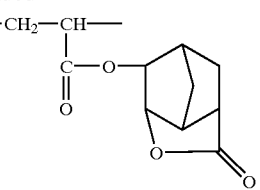
(16)
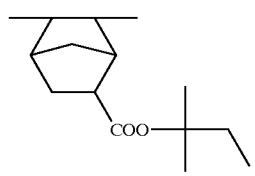 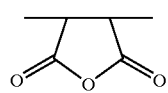
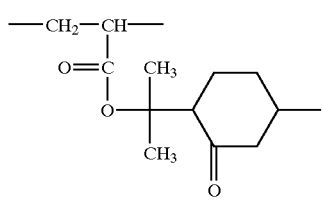 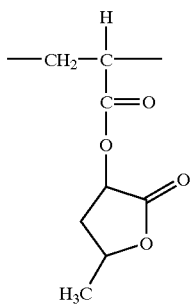
(17)
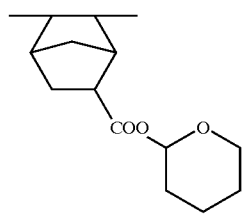 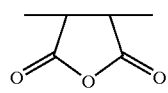
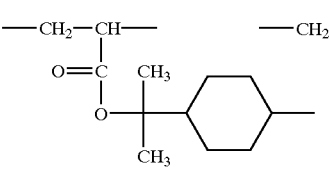 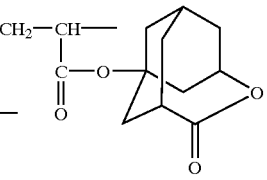
(18)
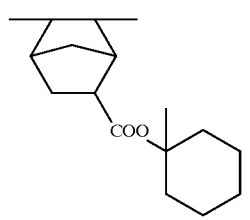 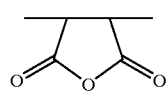
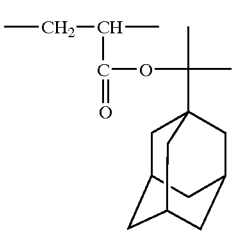 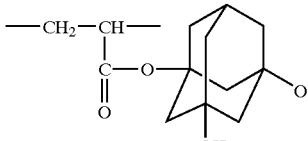
-continued
(19)
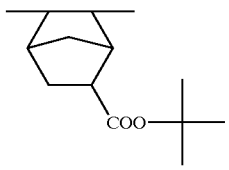 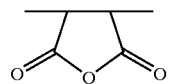
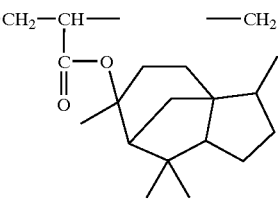 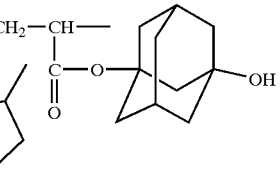
(20)
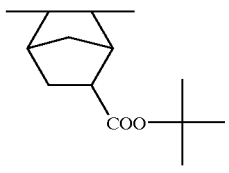 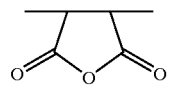
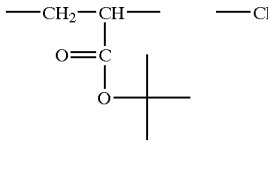 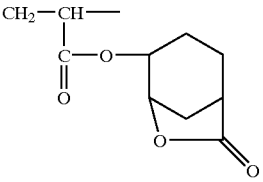
(21)
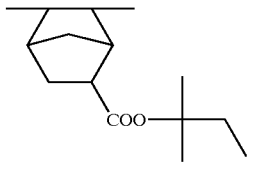 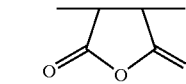
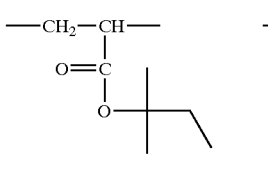 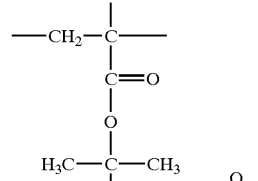
(22)
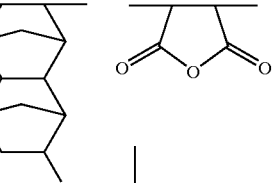 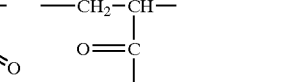

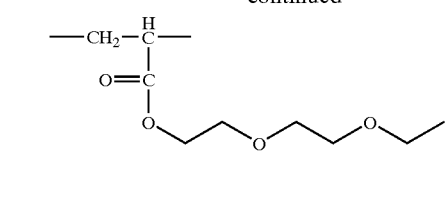
(23)
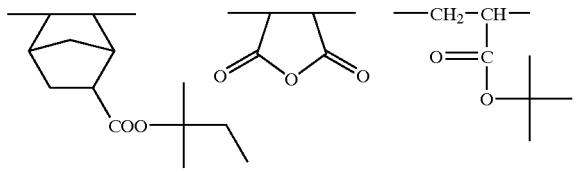
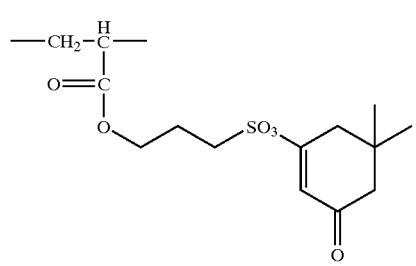
(24)
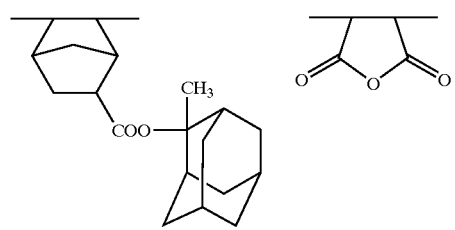
(25)
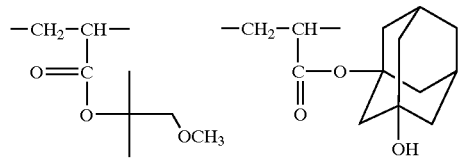
(26)
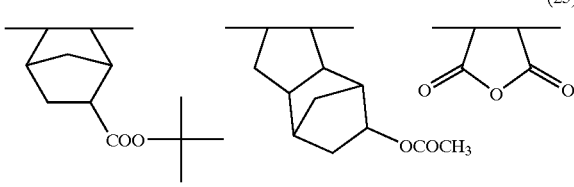
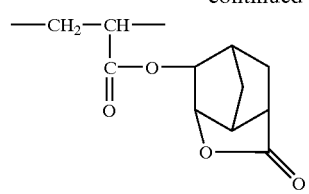
(27)
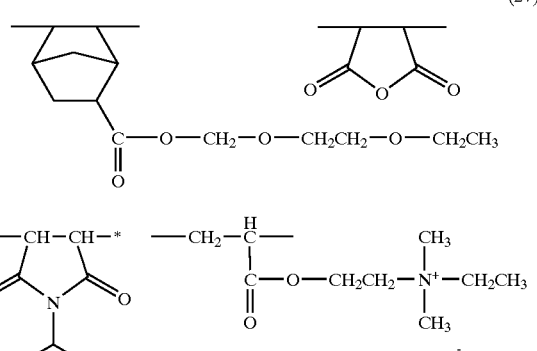
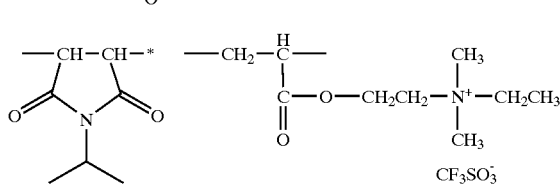
(28)
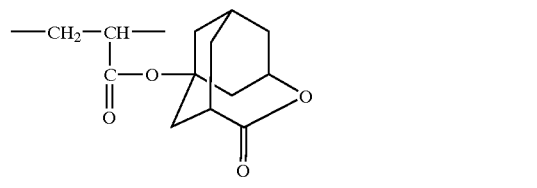
(29)
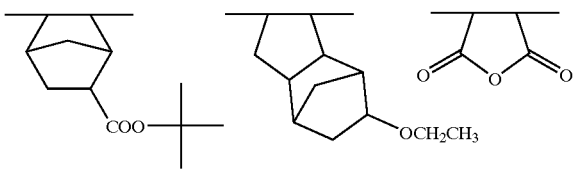
(30)
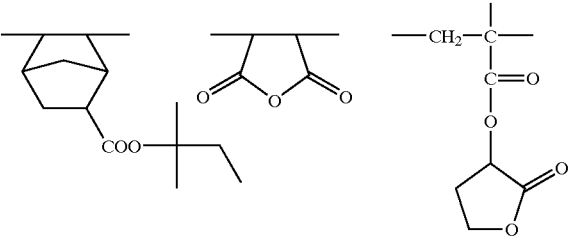

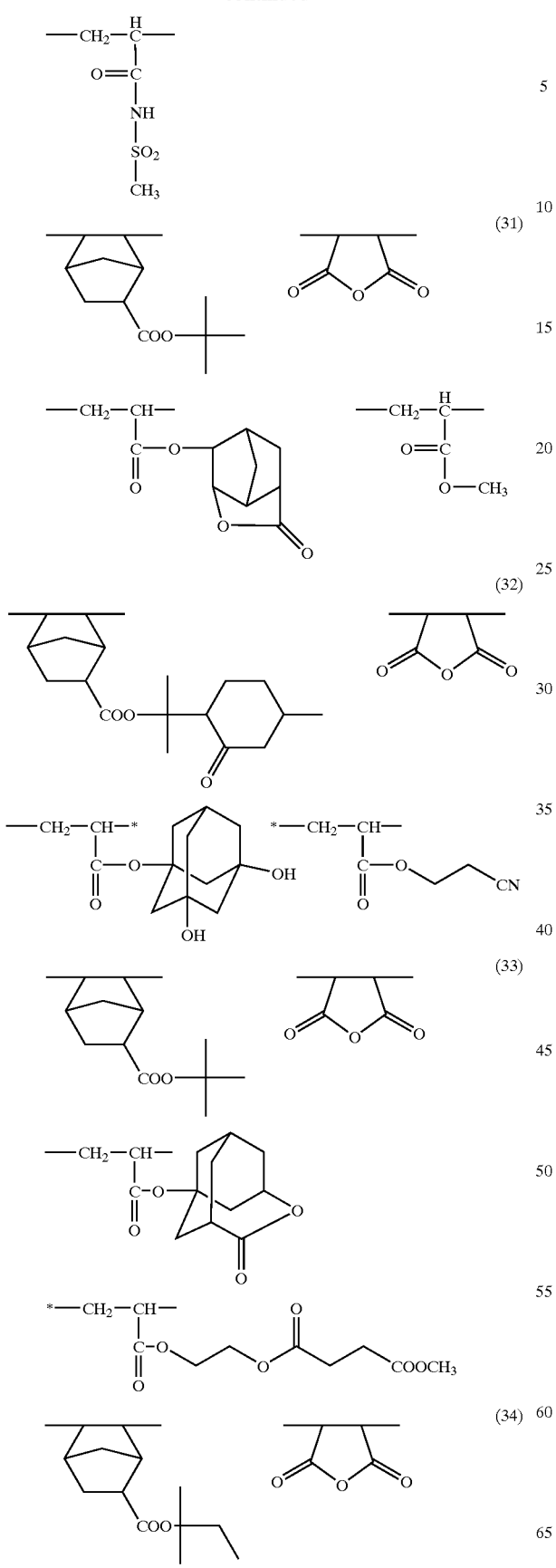
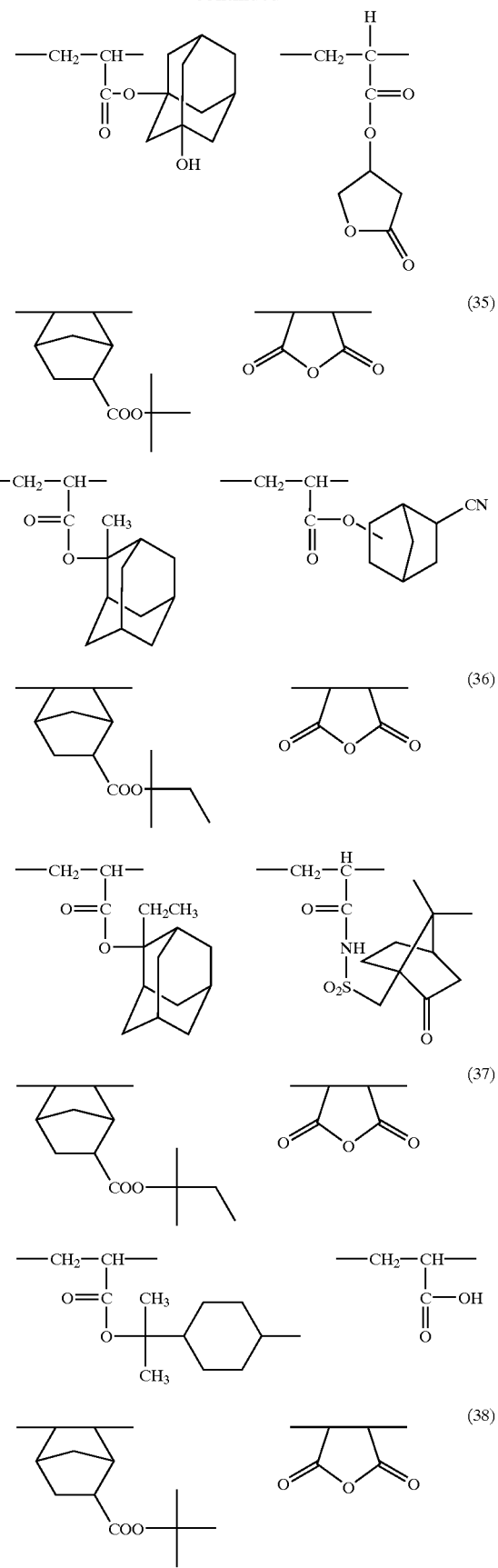

-continued

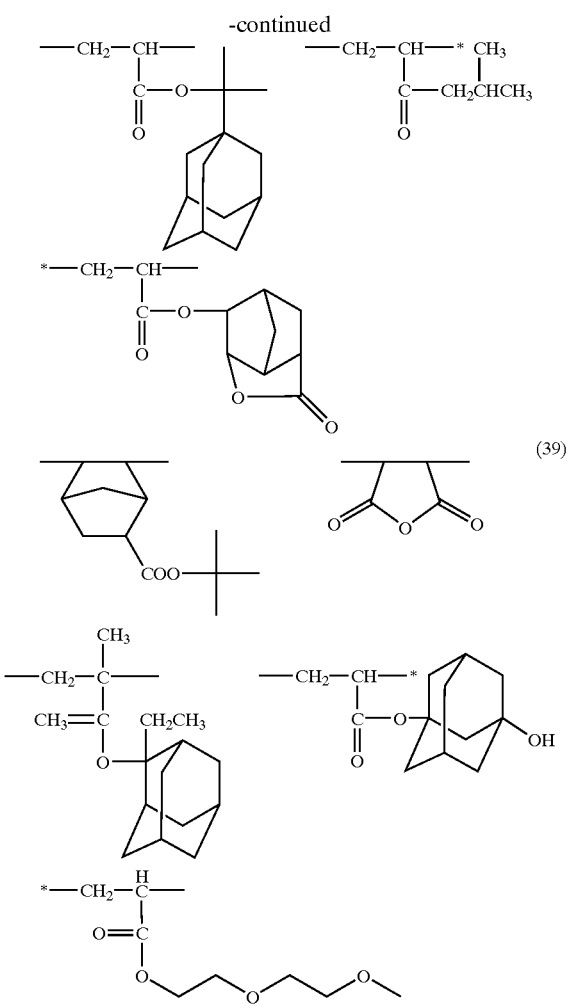

(39)

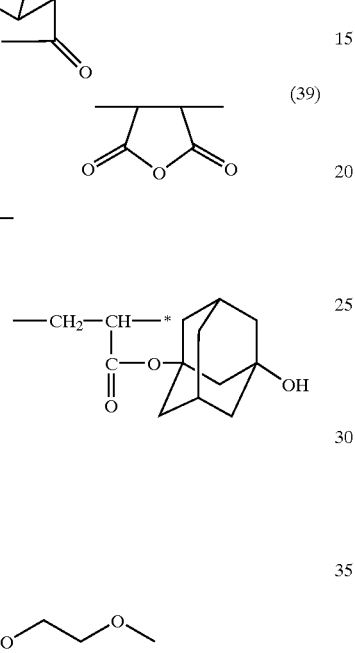

Synthesis Example (3)
Synthesis of Photoacid Generating Agent [Ia-1]

Diphenyl sulfoxide (50 g) was dissolved in 800 ml of benzene, and 200 g of aluminum chloride was added thereto, followed by stirring at 80° C. for 24 hours. After the reaction was completed, the reaction solution was slowly poured onto 2 liters of ice. Then, 400 ml of concentrated hydrochloric acid was added thereto, followed by heating at 70° C. for 10 minutes. After cooled to room temperature, the reaction solution was washed with ethyl acetate, and filtered. A solution in which 200 g of ammonium iodide was dissolved in 400 ml of distilled water was added to the filtrate. A powder precipitated was collected by filtration, washed with water, washed with ethyl acetate, and dried to obtain 62 g of sulfonium iodide.

The resulting sulfonium iodide (48 g) was dissolved in 300 ml of methanol, and 32 g of silver oxide was added thereto, followed by stirring for 4 hours. After filtered through a filter, the reaction solution was reacted with bis(trifluoromethylsulfonyl) imide to recover 32 g of acid generating agent [Ia-1], a desired product.

Synthesis Example (4)
Synthesis of Photoacid Generating Agent [IIb-1]

t-Amylbenzene (60 g), 40 g of potassium iodate, 81 g of acetic anhydride and 170 ml of dichloromethane were mixed, and 66.8 g of concentrated sulfuric acid was added dropwise to the resulting mixture for 2 hours while cooling it on an ice bath. The reaction solution was stirred as such for 2 hours, followed by stirring overnight at room temperature. Then, the reaction was completed.

After the reaction was completed, 50 ml of distilled water was added dropwise to the reaction solution while cooling it on an ice bath, followed by extraction. An organic phase was washed with water, an aqueous solution of sodium bicarbonate and water, and the resulting organic phase was concentrated to obtain 40 g of di(t-amylphenyl)iodonium sulfate.

Photoacid generating agent [IIb-1], a desired product, was obtained by the salt exchange of the resulting sulfate and bis(trifluoromethylsulfonyl)imide potassium salt.

The other photoacid generation agents were synthesized by similar methods.

Examples I-1 to I-39 and Comparative Examples I-1 and I-2

(Preparation and Evaluation of Positive-Working Resist Composition)

The respective components prepared in the above-mentioned Synthesis Examples were compounded as shown in Tables I-3 and I-4, and each composition was dissolved in propylene glycol monomethyl ether acetate in a solid content of 14% by weight. Then, each solution thus obtained was filtered through a 0.1-$\mu$m micro filter. Thus, positive-working resist compositions of Examples I-1 to I-39 and Comparative Examples I-1 and I-2 were prepared.

TABLE I-3

|  | Resin (1.5 g) | Photoacid Generating Agent | Basic Compound (5 mg) | Surfactant (5 mg) |
| --- | --- | --- | --- | --- |
| Example I-1 | (1) | Ia-1 = 40 mg | 1 | W1 |
| Example I-2 | (2) | Ia-2 = 42 mg | 2 | W1 |
| Example I-3 | (3) | Ia-3 = 45 mg | 3 | W5 |
| Example I-4 | (4) | Ia-4 = 43 mg | 4 | W5 |
| Example I-5 | (5) | Ia-5 = 40 mg | 5 | W3 |
| Example I-6 | (6) | Ia-1/PAG 4-6 = 30/15 mg | 6 | W5 |
| Example I-7 | (7) | Ia-6 = 42 mg | 6 | W4 |
| Example I-8 | (8) | Ia-7 = 45 mg | 6 | W5 |
| Example I-9 | (9) | Ia-8 = 43 mg | 5 | W3 |
| Example I-10 | (10) | Ia-9 = 40 mg | 1 | W2 |
| Example I-11 | (11) | Ia-10 = 46 mg | 2 | Not added |
| Example I-12 | (12) | Ia-11 = 43 mg | 3 | W1 |
| Example I-13 | (13) | Ia-12 = 43 mg | 2 | W2 |
| Example I-14 | (14) | Ia-13/PAG 4-52 = 30/10 mg | 1 | W3 |
| Example I-15 | (15) | Ia-15 = 45 mg | 5 | W2 |
| Example I-16 | (16) | Ia-17 = 60 mg | 5 | W1 |
| Example I-17 | (17) | Ia-22/PAG 4-39 = 30/30 mg | 4 | W2 |
| Example I-18 | (18) | IIb-2 = 40 mg | 4 | W5 |
| Example I-19 | (19) | IIb-7 = 40 mg | 4/5 = 1/1 | W5 |
| Example I-20 | (20) | IIb-6/Ia-2 = 10/30 mg | 4 | W5 |

TABLE I-4

|  | Resin (1.5 g) | Photoacid Generating Agent | Basic Compound (5 mg) | Surfactant (5 mg) |
| --- | --- | --- | --- | --- |
| Example I-21 | (21) | Ia-3/PAG 4-50 = 30/10 mg | 5 | W5 |
| Example I-22 | (22) | Ia-4/PAG 6-27 = 30/10 mg | 4 | W5 |
| Example I-23 | (23) | Ia-5/PAG 7-5 = 40/10 mg | 5 | W5 |
| Example I-24 | (24) | Ia-6 = 45 mg | 4 | W3 |

TABLE I-4-continued

| | Resin (1.5 g) | Photoacid Generating Agent | Basic Compound (5 mg) | Surfactant (5 mg) |
|---|---|---|---|---|
| Example I-25 | (25) | Ia-10/PAG 4-35 = 20/20 mg | 5 | W3 |
| Example I-26 | (26) | Ia-17/PAG 4-17 = 45/30 mg | 5 | W1 |
| Example I-27 | (27) | Ia-23/PAG 4-52 = 45/29 mg | 3 | W1 |
| Example I-28 | (28) | Ia-21/PAG 4-50 = 60/32 mg | 2 | W1 |
| Example I-29 | (29) | Ia-17/PAG 4-48 = 50/40 mg | 1 | W2 |
| Example I-30 | (30) | Ia-22/PAG 4-52 = 20/30 mg | 2 | W2 |
| Example I-31 | (31) | Ia-19 = 50 mg | Not added | W5 |
| Example I-32 | (32) | Ia-4/PAG 4-6/PAG 4-5 = 30/10/10 mg | 5 | W5 |
| Example I-33 | (33) | Ia-3 = 46 mg | 4 | W5 |
| Example I-34 | (34) | Ia-2 = 44 mg | 4 | W5 |
| Example I-35 | (35) | Ia-1 = 42 mg | 3 | W5 |
| Example I-36 | (36) | Ia-10 = 45 mg | 2 | W5 |
| Example I-37 | (37) | Ia-14 = 46 mg | 1 | W3 |
| Example I-38 | (38) | Ia-11 = 50 mg | 3 | W1 |
| Example I-39 | (39) | Ia-2 = 43 mg | 5 | W5 |
| Comparative Example I-1 | (2) | PAG 4-5 = 40 mg | 1 | W1 |
| Comparative Example I-2 | (3) | PAG 3-5 = 40 mg | 1 | W1 |

As the surfactants,

W1 represents Megafac F176 (manufactured by Dainippon Ink & Chemicals Inc.) (fluorine surfactant);

W2 represents Megafac R08 (manufactured by Dainippon Ink & Chemicals Inc.) (fluorine and silicone surfactant);

W3 represents Polysiloxane Polymer KP-341 (manufactured by Shin-Etsu Chemical Co., Ltd.);

W4 represents polyoxyethylene nonyl phenyl ether; and

W5 represents Torysol S-366 (manufactured by Troy Chemical Co., Ltd.).

As the amines, 1 represents 1,5-diazabicyclo[4.3.0]-5-nonene (DBN);

2 represents bis(1,2,2,6,6-pentamethyl-4-piperidyl) sebacate;

3 represents tri-n-butylamine;

4 represents triphenylimidazole;

5 represents antipyrine; and 6 represents 2,6-diisopropylaniline.

Evaluation Tests

First, ARC-25 manufactured by Brewer Science Co. was applied onto a silicon wafer with a spin coater to a thickness of 78 nm, and dried. Then, the positive-working photoresist composition solution obtained was applied thereon with a spin coater, and dried at 150° C. for 90 seconds to prepare a positive-working photoresist film having a thickness of about 0.4 μm, which was exposed through a mask with an ArF eximer laser stepper (manufactured by ISI Co., NA=0.6). After exposure, heat treatment was carried out at 130° C. for 90 seconds. Then, the photoresist film was developed with a 2.38-wt % aqueous solution of tetramethylammonium hydroxide, and rinsed with distilled water to obtain a resist pattern profile.

For this profile, the resolving power and the exposure margin were evaluated as described below. Results of these evaluations are show in Tables 1-5 and I-6.

Resolving Power: The limit resolving power at an exposure at which a 0.14-μm mask pattern was reproduced was taken as the resolving power.

Exposure Margin: Taking as an optimum exposure an exposure reproducing a mask pattern having a line and space (1/1) of 0.14 μm, a value obtained by dividing a width of an exposure amount reproducing a line width of 0.14-μm±10% by the optimum exposure was expressed in percentage (%). The larger numerals show the smaller changes in the line width to changes in the exposure.

TABLE I-5

| | Resolution Power (μm) | Exposure Margin (%) |
|---|---|---|
| Example I-1 | 0.125 | 13 |
| Example I-2 | 0.125 | 9 |
| Example I-3 | 0.125 | 9 |
| Example I-4 | 0.125 | 10 |
| Example I-5 | 0.125 | 9 |
| Example I-6 | 0.125 | 14 |
| Example I-7 | 0.13 | 12 |
| Example I-8 | 0.125 | 9 |
| Example I-9 | 0.125 | 10 |
| Example I-10 | 0.125 | 9 |
| Example I-11 | 0.13 | 8 |
| Example I-12 | 0.125 | 13 |
| Example I-13 | 0.125 | 10 |
| Example I-14 | 0.125 | 14 |
| Example I-15 | 0.125 | 11 |
| Example I-16 | 0.125 | 14 |
| Example I-17 | 0.125 | 14 |
| Example I-18 | 0.1275 | 13 |
| Example I-19 | 0.1275 | 13 |
| Example I-20 | 0.125 | 11 |

TABLE I-6

| | Resolution Power (μm) | Exposure Margin (%) |
|---|---|---|
| Example I-21 | 0.125 | 11 |
| Example I-22 | 0.125 | 10 |
| Example I-23 | 0.125 | 10 |
| Example I-24 | 0.125 | 10 |
| Example I-25 | 0.125 | 11 |
| Example I-26 | 0.125 | 11 |
| Example I-27 | 0.125 | 10 |
| Example I-28 | 0.125 | 11 |
| Example I-29 | 0.125 | 10 |
| Example I-30 | 0.125 | 11 |
| Example I-31 | 0.1325 | 8 |
| Example I-32 | 0.125 | 13 |
| Example I-33 | 0.125 | 10 |
| Example I-34 | 0.125 | 9 |
| Example I-35 | 0.125 | 11 |
| Example I-36 | 0.125 | 11 |
| Example I-37 | 0.125 | 14 |
| Example I-38 | 0.125 | 14 |
| Example I-39 | 0.125 | 10 |
| Comparative Example I-1 | 0.14 | 2 |
| Comparative Example I-2 | Not resolved | 0 |

The results shown in Tables I-5 and I-6 apparently reveal that the positive-working resist compositions of the invention are excellent in the resolving power and the exposure margin.

EXAMPLE II

Synthesis Example (1)

Synthesis of Resin (1)

2-Methyl-2-adamantyl methacrylate and butyrolactone methacrylate were placed in a reaction vessel at a ratio of 55/45, and dissolved in a 5/5 mixed solvent of methyl ethyl ketone/tetrahydrofuran to prepare 100 ml of a solution having a solid content of 20%. Then, 2 mol % of V-65 manufactured by Wako Pure Chemical Industries Ltd. was added thereto. The resulting solution was added dropwise to 10 ml of methyl ethyl ketone heated at 60° C., for 4 hours in a stream of nitrogen. After the dropping addition was completed, the reaction solution was heated for 4 hours, and 1 mol % of V-65 was added again, followed by stirring for 4 hours. After the reaction was completed, the reaction solution was cooled to room temperature, and crystallization was performed in 3 liters of a 1/1 mixed solvent of distilled water/isopropyl alcohol. A white powder precipitated was recovered as resin (1).

The polymer composition ratio determined from $^{13}$C-NMR was 46/54. The weight average molecular weight determined by the GPC measurement was 10700 in terms of that of standard polystyrene.

Resins (2) to (15) were synthesized in the same manner as with Synthesis Example (1) with the exception that the composition ratio was changed as shown in Table II-1.

The composition ratio and the molecular weight of the above-mentioned resins (2) to (15) are indicated in Table 11-1 shown below (repeating units 1, 2, 3 and 4 show the order from the left of the structural formula).

TABLE II-1

| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 2 | 53 | 40 | 7 | | 13400 |
| 3 | 46 | 34 | 20 | | 9400 |
| 4 | 42 | 31 | 27 | | 8300 |
| 5 | 49 | 42 | 9 | | 9900 |
| 6 | 42 | 30 | 28 | | 10300 |
| 7 | 39 | 35 | 26 | | 8900 |
| 8 | 46 | 22 | 30 | 2 | 12900 |
| 9 | 42 | 20 | 32 | 6 | 11600 |
| 10 | 46 | 42 | 12 | | 9200 |
| 11 | 38 | 32 | 30 | | 11300 |
| 12 | 42 | 18 | 38 | 2 | 13800 |
| 13 | 38 | 31 | 29 | 2 | 11100 |
| 14 | 50 | 31 | 19 | | 11700 |
| 15 | 35 | 6 | 16 | 43 | 13200 |

Further, structures of the above-mentioned resins (1) to (5) are shown below:

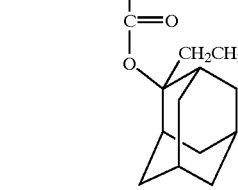

(1)

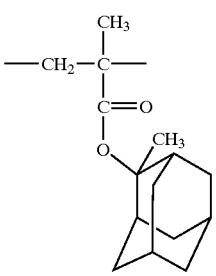

(2)

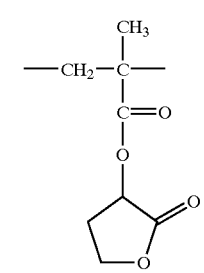

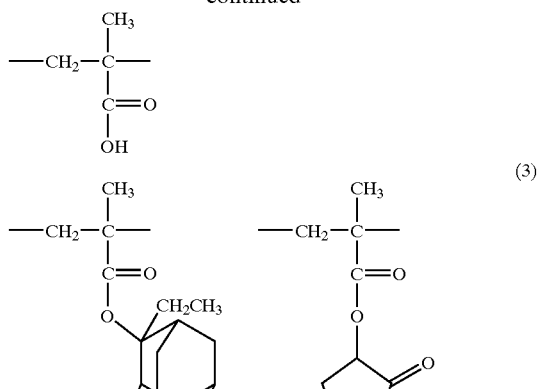

(3)

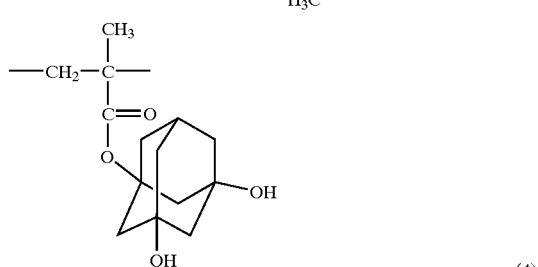

(4)

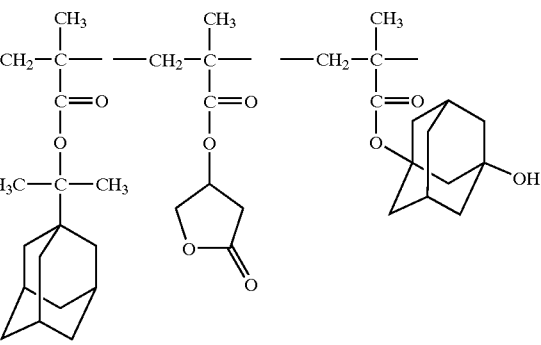

(5)

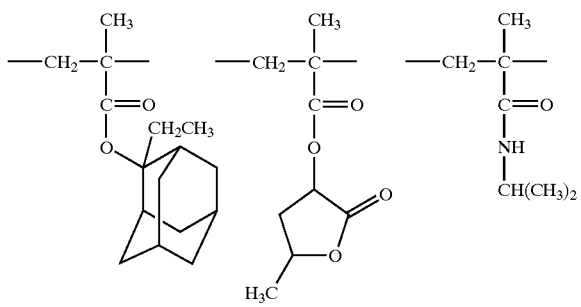

(6)

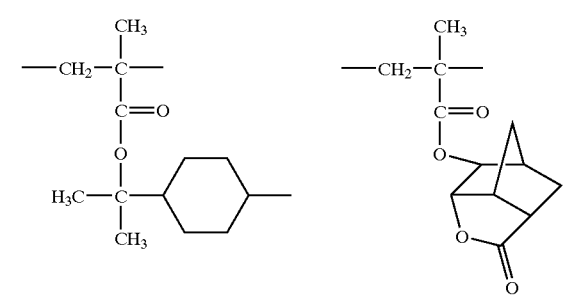

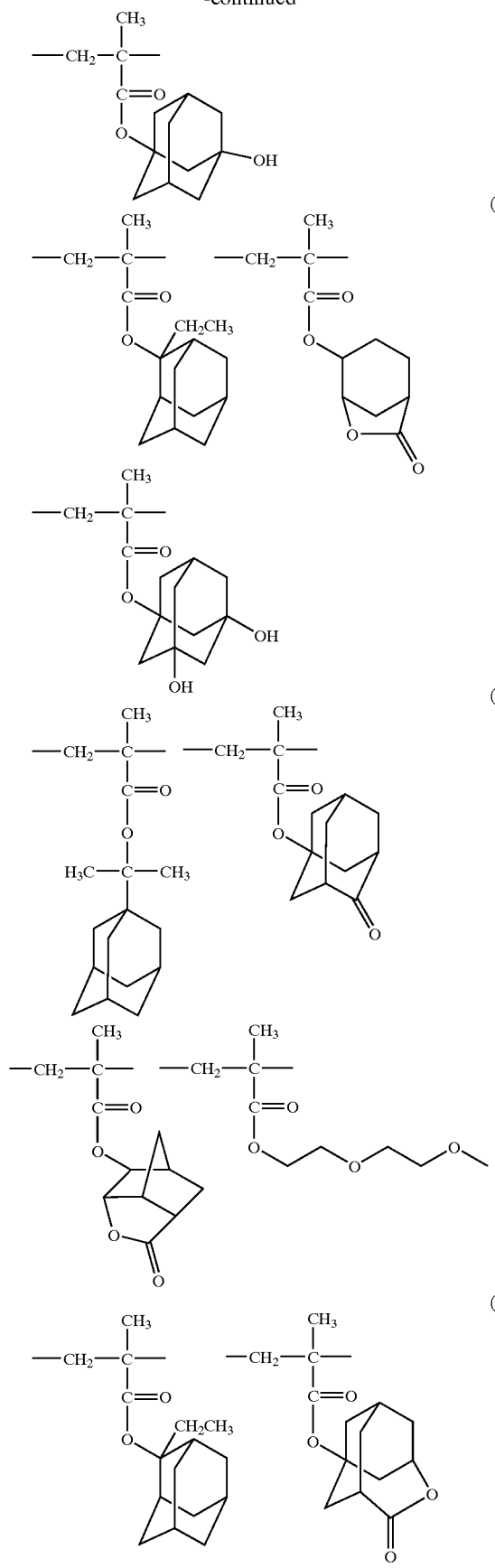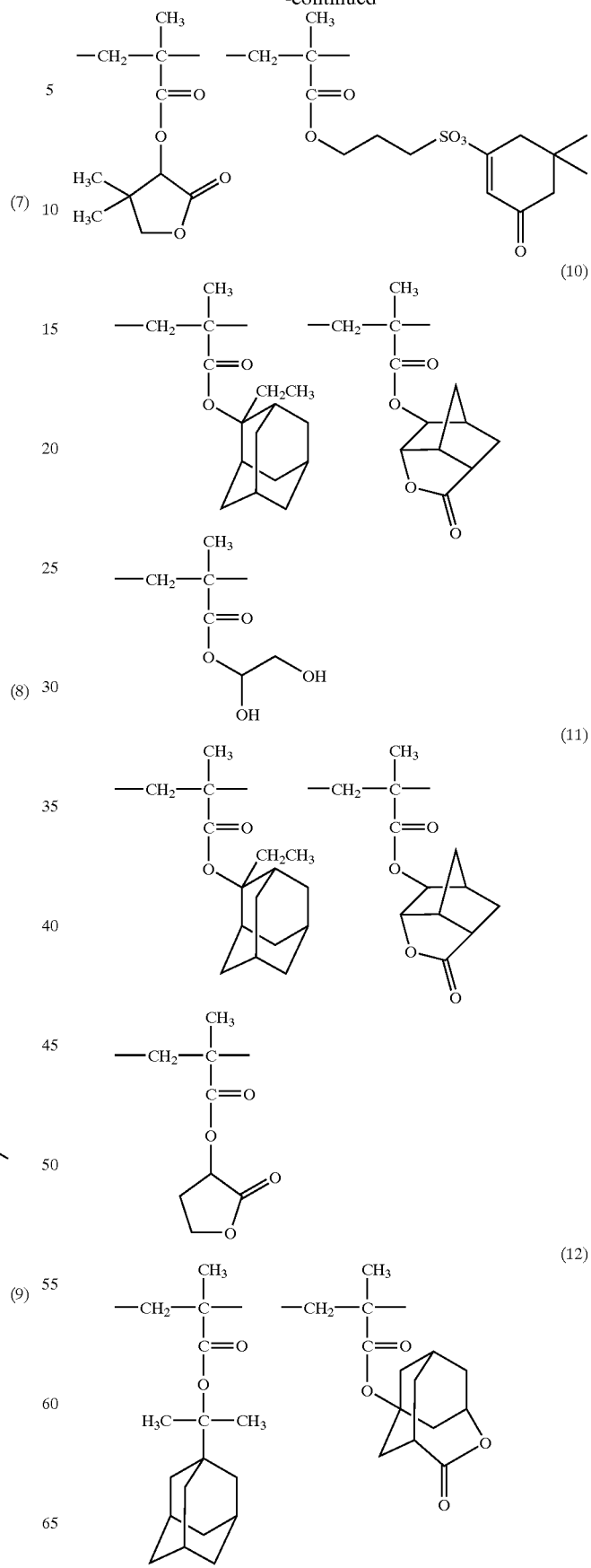

-continued

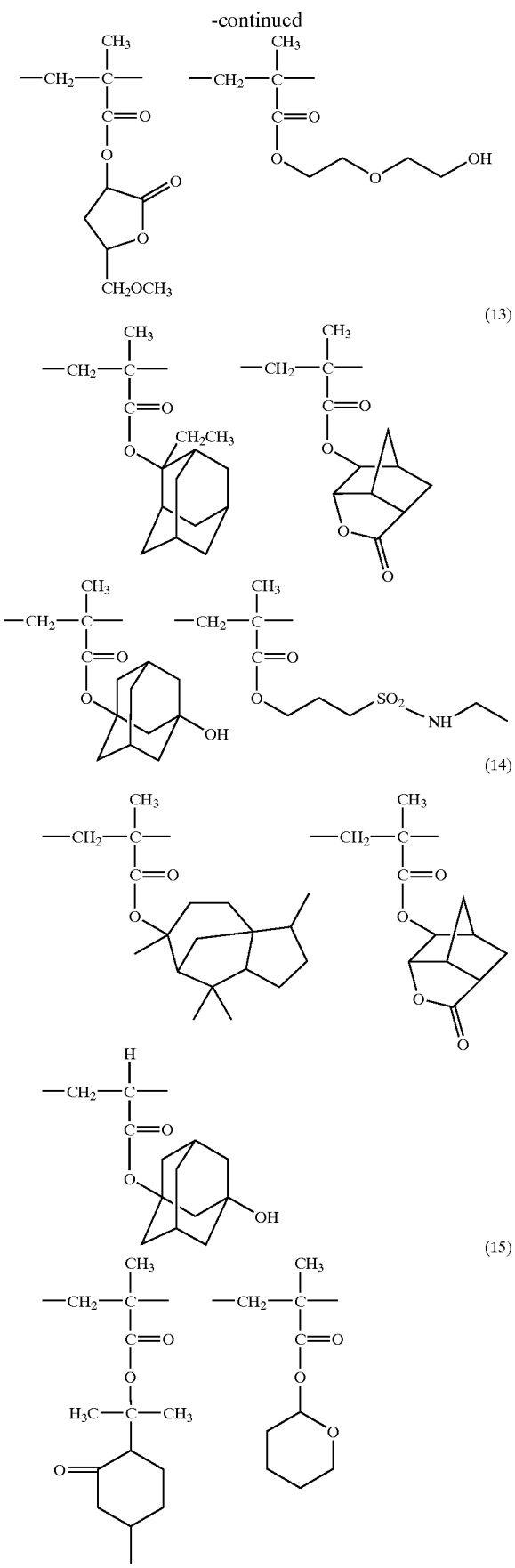

(13)

(14)

(15)

-continued

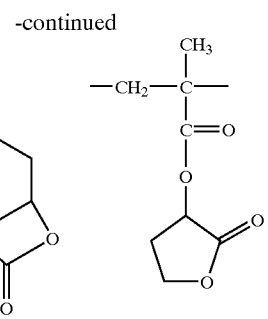

Synthesis Example (2)

Synthesis of Photoacid Generating Agent [I-1]

Diphenyl sulfoxide (50 g) was dissolved in 800 ml of benzene, and 200 g of aluminum chloride was added thereto, followed by stirring at 80° C. for 24 hours. After the reaction was completed, the reaction solution was slowly poured onto 2 liters of ice. Then, 400 ml of concentrated hydrochloric acid was added thereto, followed by heating at 70° C. for 10 minutes. After cooled to room temperature, the reaction solution was washed with ethyl acetate, and filtered. A solution in which 200 g of ammonium iodide was dissolved in 400 ml of distilled water was added to the filtrate. A powder precipitated was collected by filtration, washed with water, washed with ethyl acetate, and dried to obtain 62 g of sulfonium iodide.

The resulting sulfonium iodide (48 g) was dissolved in 300 ml of methanol, and 32 g of silver oxide was added thereto, followed by stirring for 4 hours. After filtered through a filter, the reaction solution was reacted with bis(trifluoromethylsulfonyl)imide to recover 32 g of photoacid generating agent [I-1], a desired product.

Synthesis Example (3)

Synthesis of Photoacid Generating Agent [II-1]

t-Amylbenzene (60 g), 40 g of potassium iodate, 81 g of acetic anhydride and 170 ml of dichloromethane were mixed, and 66.8 g of concentrated sulfuric acid was added dropwise to the resulting mixture for 2 hours while cooling it on an ice bath. The reaction solution was stirred as such for 2 hours, followed by stirring overnight at room temperature. Then, the reaction was completed.

After the reaction was completed, 50 ml of distilled water was added dropwise to the reaction solution while cooling it on an ice bath, followed by extraction. An organic phase was washed with water, an aqueous solution of sodium bicarbonate and water, and the resulting organic phase was concentrated to obtain 40 g of di(t-amylphenyl)iodonium sulfate.

Acid generating agent [II-1], a desired product, was obtained by the salt exchange of the resulting sulfate and bis(trifluoromethylsulfonyl)imide potassium salt.

The other photoacid generating agents were synthesized by similar methods.

Examples II-1 to II-15 and Comparative Example II-1

Preparation and Evaluation of Positive-Working Resist Composition

The respective components prepared in the above-mentioned Synthesis Examples were compounded as shown in Table II-2, and each composition was dissolved in propylene glycol monomethyl ether acetate in a solid content of 14% by weight. Then, each solution thus obtained was filtered through a 0.1-μm micro filter. Thus, positive-working resist compositions of Examples II-1 to I-15 and Comparative Example II-1 were prepared.

TABLE II-2

| | Resin (1.5 g) | Photoacid Generating Agent | Basic Compound (4 mg) | Surfactant (10 mg) |
|---|---|---|---|---|
| Example II-1 | (1) | I-1 = 40 mg | Not added | W4 |
| Example II-2 | (2) | I-3 = 45 mg | 1 | Not added |
| Example II-3 | (3) | I-11/PAG 4-38 = 40/10 mg | 2 | W5 |
| Example II-4 | (4) | I-4 = 48 mg | 4 | W5 |
| Example II-5 | (5) | I-21/PAG 4-6 = 50/30 mg | 5 | W3 |
| Example II-6 | (6) | I-5 = 50 mg | 6 | W2 |
| Example II-7 | (7) | I-10 = 43 mg | 3 | W1 |
| Example II-8 | (8) | I-12 = 48 mg | 4 | W5 |
| Example II-9 | (9) | I-22/PAG 4-36 = 60/30 mg | 5 | W5 |
| Example II-10 | (10) | II-1/PAG 4-52 = 20/30 mg | 6 | W5 |
| Example II-11 | (11) | I-23/PAG 4-45 = 30/30 mg | 4 | W3 |
| Example II-12 | (12) | I-17 = 80 mg | 3 | W2 |
| Example II-13 | (13) | II-17/PAG 4-50 = 25/30 mg | 1 | W1 |
| Example II-14 | (14) | I-18/PAG 4-48 = 32/30 mg | 2 | W2 |
| Example II-15 | (15) | I-14 = 42 mg | 3 | W3 |
| Comparative Example II-1 | (1) | PAG 4-5 = 40 mg | Not added | Not added |

As the surfactants,

W1 represents Megafac F176 (manufactured by Dainippon Ink & Chemicals Inc.) (fluorine surfactant);

W2 represents Megafac R08 (manufactured by Dainippon Ink & Chemicals Inc.) (fluorine and silicone surfactant);

W3 represents Polysiloxane Polymer KP-341 (manufactured by Shin-Etsu Chemical Co., Ltd.);

W4 represents polyoxyethylene nonyl phenyl ether; and

W5 represents Torysol S-366 (manufactured by Troy Chemical Co., Ltd.).

As the amines, 1 represents 1,5-diazabicyclo[4.3.0]-5-nonene (DBN);

2 represents bis(1,2,2,6,6-pentamethyl-4-piperidyl) sebacate;

3 represents tri-n-butylamine;

4 represents triphenylimidazole;

5 represents antipyrine; and 6 represents 2,6-diisopropylaniline.

First, ARC-25 manufactured by Brewer Science Co. was applied onto a silicon wafer with a spin coater to a thickness of 78 nm and dried. Then, the positive-working photoresist composition solution obtained was applied thereon with a spin coater, and dried at 140° C. for 90 seconds to prepare a positive-working photoresist film having a thickness of about 0.4 $\mu$m, which was exposed to an ArF eximer laser beam (wavelength: 193 nm, a stepper of NA=0.6 manufactured by ISI Co.) through a 1/2-pitch contact hole pattern (mask size: 0.15 micron) with changing the exposure. After exposure, heat treatment was carried out at 120° C. for 90 seconds. Then, the photoresist film was developed with a 2.38-wt % aqueous solution of tetramethylammonium hydroxide, and rinsed with distilled water to obtain a resist pattern profile.

The resist pattern of the silicon wafer thus obtained was observed under a scanning microscope to evaluate the resist as described below:

Resolving Power: The diameter (nm) of a contact hole resolvable at a minimum exposure amount reproducing a contact hole having a diameter of 0.15 $\mu$m was taken as the resolving power.

Exposure Margin: Fluctuating a minimum exposure amount reproducing a contact hole pattern having a diameter of 0.15 $\mu$m by ±5% for each resist, the coefficient of variation of a diameter of a contact hole pattern obtained at the time when the contact hole pattern having a diameter of 0.15 $\mu$m was exposed and developed [(variation width/0.15)×100(%)] was taken as an index of the exposure margin. It is preferred that this value is as small as possible.

TABLE II-3

| | Resolution Power (nm) | Exposure Margin (%) |
|---|---|---|
| Example II-1 | 135 | 8 |
| Example II-2 | 135 | 7 |
| Example II-3 | 130 | 6 |
| Example II-4 | 125 | 4 |
| Example II-5 | 130 | 6 |
| Example II-6 | 125 | 4 |
| Example II-7 | 130 | 6 |
| Example II-8 | 125 | 4 |
| Example II-9 | 130 | 6 |
| Example II-10 | 130 | 6 |
| Example II-11 | 130 | 6 |
| Example II-12 | 125 | 4 |
| Example II-13 | 130 | 6 |
| Example II-14 | 130 | 6 |
| Example II-15 | 127.5 | 5 |
| Comparative Example II-1 | 145 | 20 |

The results shown in Table II-3 apparently reveal that the positive-working resist compositions of the invention are excellent in the resolving power and the exposure margin.

EFFECT OF THE INVENTION

The invention can provide the positive-working resist compositions excellent in the resolving power and the exposure margin. Accordingly, the positive-working resist compositions of the invention can be suitably used for microphotofabrication using far ultraviolet rays, particularly ArF eximer laser beams.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive-working resist composition comprising (A) a resin which has an aliphatic cyclic hydrocarbon group and enhances in the dissolution rate in an alkaline developing solution by an action of an acid, and (B) a compound generating an acid by irradiation of actinic ray or radiation, wherein the resin of (A) is a resin having repeating structural units represented by formula (I), repeating structural units represented by formula (II) and repeating structural units represented by formula (III), and (B) is a compound represented by the following formula (Ia) or (IIb):

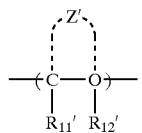
(I)

wherein $R_{11}'$ and $R_{12}'$ each independently represents a hydrogen atom, a cyano group, a halogen atom or an alkyl group; and Z' represents an atomic group for forming an alicyclic structure which contains two combined carbon atoms (C—C) and may have a substituent group;

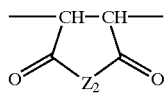
(II)

wherein $Z_2$ represents —O— or —N($R_{41}$)—, wherein $R_{41}$ represents a hydrogen atom, a hydroxyl group, an alkyl group, a haloalkyl group or —OSO$_2$—$R_{42}$, $R_{42}$ represents an alkyl group, a haloalkyl group, a cycloalkyl group or a camphor residue;

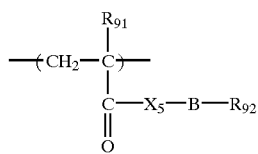
(III)

wherein $R_{91}$ represents a hydrogen atom, a lower alkyl group, a halogen atom or —CN; $X_5$ represents —O—, —S—, —NR$_{93}$— or NR$_{93}$SO$_2$—, wherein $R_{93}$ represents a hydrogen atom or a chain or cyclic alkyl group; B represents a single bond or a connecting group, and $R_{92}$ represents a hydrogen atom, a chain or cyclic alkyl group, an alkoxyl group, a hydroxyl group, a carboxyl group, a cyano group, —COOR$_{94}$ or a group represented by any one of formulas (IV) to (X), wherein $R_{94}$ represents a hydrogen atom or a chain or cyclic alkyl group:

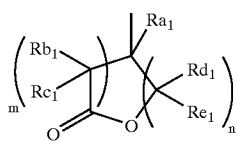
(IV)

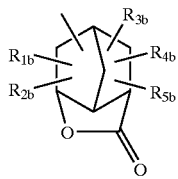
(V-1)

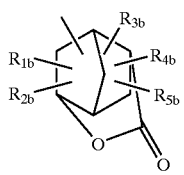
(V-2)

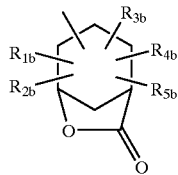
(V-3)

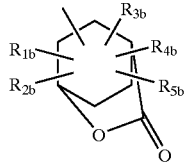
(V-4)

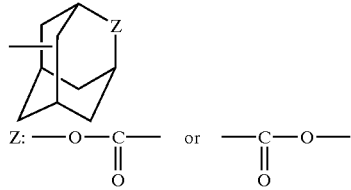
(VI)

Z:

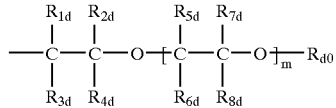
(VII)

—N$^+$(R$_{95}$)(R$_{96}$)(R$_{97}$)·X$^-$ (VII)

—R$_{98}$—A$_{50}$—R$_{99}$ (IX)

—SO$_3$R$_{100}$ (X)

in formula (IV), Ra$_1$, Rb$_1$, Rc$_1$, Rd$_1$ and Re$_1$ each independently represents a hydrogen atom or an alkyl group having from 1 to 4 carbon atoms; and m and n each independently represents an integer of from 0 to 3, and m+n is from 2 to 6; in formulas (V-1) to (V-4), $R_{1b}$ to $R_{5b}$ each independently represents a hydrogen atom, an alkyl group, a cycloalkyl group or an alkenyl group, and two of $R_{1b}$ to $R_{5b}$ may combine with each other to form a ring; in formula (VII), $R_{1d}$ to $R_{8d}$ each independently represents a hydrogen atom or an alkyl group; $R_{d0}$ represents a hydrogen atom, a chain or cyclic alkyl group, an aryl group or an aralkyl group; and m represents an integer of from 1 to 10; in formula (VIII), $R_{95}$ to $R_{97}$ each independently represents a hydrogen atom, a chain or cyclic alkyl group, an alkenyl group, an aryl group or an aralkyl group, with the proviso that $R_{95}$ to $R_{97}$ may combine with each other to form a non-aromatic or aromatic ring; and X$^-$ represents R—SO$_3^-$, wherein R represents an aliphatic hydrocarbon group or an aromatic hydrocarbon group; in formula (IX), $R_{98}$ represents a single bond, an alkylene group, an arylene group or a divalent group which is a combination thereof; $A_{50}$ represents any one of the following functional groups:

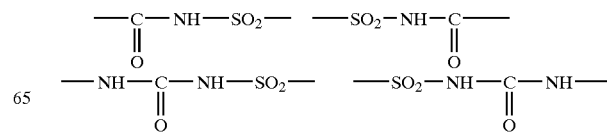

-continued

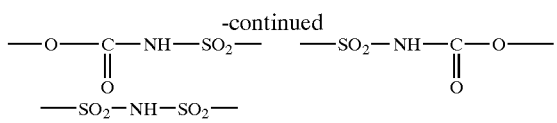

and $R_{99}$ represents a hydrogen atom or an alkyl group; in formula (X), $R_{100}$ represents a chain or cyclic alkyl group, an aryl group or an aralkyl group;

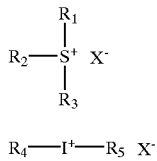

(Ia)

(IIb)

wherein $R_1$ to $R_5$ each independently represents an aliphatic or aromatic hydrocarbon group which may have a substituent group, with the proviso that two of $R_1$ to $R_3$ may combine with each other to form a ring, and that $R_4$ and $R_5$ may combine with each other to form a ring; and $X^-$ represents any one of the following anions:

$X^-$;

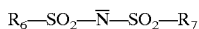

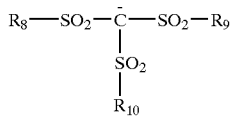

wherein $R_6$ to $R_{10}$ each independently represents an aliphatic hydrocarbon group which may have a substituent group, with the proviso that $R_6$ and $R_7$ may combine with each other to form a ring, and that two of $R_8$ to $R_{10}$ may combine with each other to form a ring.

2. The positive-working resist composition as in claim 1, wherein Z' in formula (I) represents an atomic group for forming a bridge-containing alicyclic structure which contains two combined carbon atoms (C—C) and may have a substituent group.

3. The positive-working resist composition as in claim 1, wherein the formula (I) is formula (II-A) or (II-B):

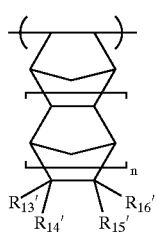

(II-A)

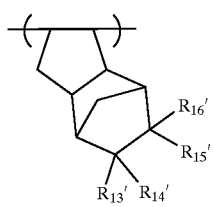

(II-B)

wherein $R_{13}'$ to $R_{16}'$ each independently represents a hydrogen atom, a halogen atom, a cyano group, —COOH, —COOR$_5$, a group decomposable by an action of an acid, —C(=O)—X—A'—R$_{17}$', or an alkyl group or a cyclic hydrocarbon group which may have a substituent group, and at least two of $R_{13}'$ to $R_{16}'$ may combine with each other to form a ring, wherein $R_5$ represents an alkyl group, a cyclic hydrocarbon group or a —Y group shown below, which may have a substituent group, X represents an oxygen atom, a sulfur atom, —NH—, —NHSO$_2$— or —NHSO$_2$NH—, A' represents a single bond or a divalent connecting group, $R_{17}'$ represents —COOH, —COOR$_5$, —CN, a hydroxyl group, an alkoxyl group which may have a substituent group, —CO—NH—R$_6$, —CO—NH—SO$_2$—R$_6$ or a —Y group shown below, and R$_6$ represents an alkyl group or a cyclic hydrocarbon group, which may have a substituent group:

—Y group:

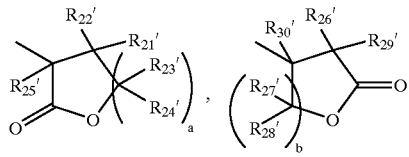

wherein $R_{21}'$ to $R_{30}'$ each independently represents a hydrogen atom or an alkyl group which may have a substituent group, and a and b each represents 1 or 2; and n represents 0 or 1.

4. The positive-working resist composition as in claim 1, which further contains a fluorine and/or silicone surfactant.

5. The positive-working resist composition as in claim 1, which further contains an organic basic compound.

6. A positive-working resist composition comprising (A) a resin which has an aliphatic cyclic hydrocarbon group on its side chain and enhances in the dissolution rate in an alkaline developing solution by an action of an acid, and (B) a compound generating an acid by irradiation of actinic ray or radiation, wherein the resin of (A) is a resin containing at least repeating units having a partial structure containing an aliphatic hydrocarbon represented by any one of formulas (pI) to (pVI), and (B) is a compound represented by formula (I') or (II'):

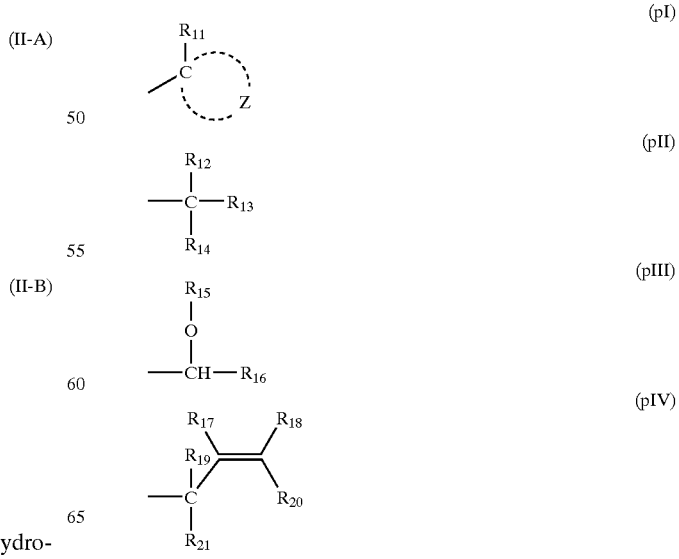

(pV)

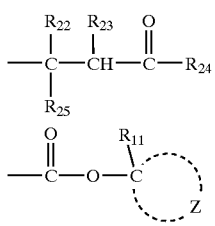

(pVI)

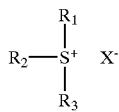

wherein $R_{11}$ represents a methyl group, an ethyl group, a n-propyl group, an isopropyl group, a n-butyl group, an isobutyl group or a sec-butyl group; Z represents an atomic group necessary for forming an alicyclic hydrocarbon group; $R_{12}$ to $R_{16}$ each independently represents a straight-chain or branched alkyl group having from 1 to 4 carbon atoms or an alicyclic hydrocarbon group, with the proviso that at least one of $R_{12}$ to $R_{14}$, or either of $R_{15}$ and $R_{16}$ represents an alicyclic hydrocarbon group; $R_{17}$ to $R_{21}$ each independently represents a hydrogen atom, a straight-chain or branched alkyl group having from 1 to 4 carbon atoms or an alicyclic hydrocarbon group, with the proviso that at least one of $R_{17}$ to $R_{21}$ represents an alicyclic hydrocarbon group, and either of $R_{19}$ and $R_{21}$ represents a straight-chain or branched alkyl group having from 1 to 4 carbon atoms or an alicyclic hydrocarbon group; and $R_{22}$ to $R_{25}$ each represents a straight-chain or branched alkyl group having from 1 to 4 carbon atoms or an alicyclic hydrocarbon group, with the proviso that at least one of $R_{22}$ to $R_{25}$ represents an alicyclic hydrocarbon group, and $R_{23}$ and $R_{24}$ may combine with each other to form a ring;

(I')

$$R_2-\underset{\underset{R_3}{|}}{\overset{\overset{R_1}{|}}{S^+}}\quad X^-$$

(II')

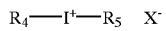

wherein $R_1$ to $R_5$ each independently represents an aliphatic or aromatic hydrocarbon group which may have a substituent group, with the proviso that two of $R_1$ to $R_3$ may combine with each other to form a ring, and that $R_4$ and $R_5$ may combine with each other to form a ring; and $X^-$ represents any one of the following anions:

$X^-$;

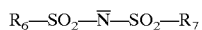

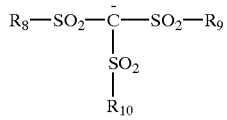

wherein $R_6$ to $R_{10}$ each independently represents an aliphatic hydrocarbon group which may have a substituent group, with the proviso that $R_6$ and $R_7$ may combine with each other to form a ring, and that two of $R_8$ to $R_{10}$ may combine with each other to form a ring.

7. The positive-working resist composition as in claim 6, which further contains (C) a fluorine and/or silicone surfactant.

8. The positive-working resist composition as in claim 6, which further contains (D) an organic basic compound.

* * * * *